US008235506B2

(12) United States Patent
Nishio et al.

(10) Patent No.: US 8,235,506 B2
(45) Date of Patent: Aug. 7, 2012

(54) ELECTROSTATIC SUCTION TYPE FLUID DISCHARGE METHOD AND DEVICE FOR THE SAME

(75) Inventors: Shigeru Nishio, Yamatokoriyama (JP); Hironobu Iwashita, Chiyoda-ku (JP); Kazunori Yamamoto, Chiyoda-ku (JP); Kazuhiro Murata, Chiyoda-ku (JP)

(73) Assignees: Sharp Kabushiki Kaisha, Osaka (JP); Konica Minolta Holdings, Inc., Tokyo (JP); National Institute of Advanced Industrial Science and Technology, Tokyo (JP)

( * ) Notice: Subject to any disclaimer, the term of this patent is extended or adjusted under 35 U.S.C. 154(b) by 1293 days.

(21) Appl. No.: 10/567,657

(22) PCT Filed: Aug. 6, 2004

(86) PCT No.: PCT/JP2004/011376
§ 371 (c)(1),
(2), (4) Date: Oct. 26, 2006

(87) PCT Pub. No.: WO2005/014180
PCT Pub. Date: Feb. 17, 2005

(65) Prior Publication Data
US 2007/0101934 A1    May 10, 2007

(30) Foreign Application Priority Data

Aug. 8, 2003  (JP) ................. 2003-206941
Aug. 8, 2003  (JP) ................. 2003-206944
Aug. 8, 2003  (JP) ................. 2003-206946

(51) Int. Cl.
*B41J 2/06* (2006.01)
(52) U.S. Cl. ............... 347/55; 347/73; 347/74; 347/75
(58) Field of Classification Search ............ 347/55, 347/73–83; 118/621, 624; 239/690, 706
See application file for complete search history.

(56) References Cited

U.S. PATENT DOCUMENTS 4,196,437 A * 4/1980 Hertz .................. 347/98
5,477,249 A * 12/1995 Hotomi .................. 347/48
6,158,844 A * 12/2000 Murakami et al. ............. 347/55
(Continued)

FOREIGN PATENT DOCUMENTS

JP    36-013768    8/1961
(Continued)

OTHER PUBLICATIONS

Koichi Saito; "*Theory of the Electrostatic Suction Type Slit Jet*"; Electronic Imaging & Devices research Laboratory; vol. 17; pp. 185-193; 1988.

*Primary Examiner* — Matthew Luu
*Assistant Examiner* — Henok Legesse
(74) *Attorney, Agent, or Firm* — Edwards Wildman Palmer LLP; David G. Conlin; David A. Tucker

(57) ABSTRACT

An electrostatic suction type fluid discharge method and device include a voltage applying means that applies a pulse voltage between a nozzle and a substrate, the nozzle having a diameter ranging from 0.01 μm to 25 μm, an upper limit voltage of the pulse voltage being equal to or greater than a discharge-inducing minimum voltage. A lower limit first voltage can be provided immediately before a rise of the pulse voltage, an absolute value of the lower limit first voltage being set smaller than the discharge-inducing minimum voltage. A lower limit second voltage can be provided immediately after a rise of the pulse voltage, an absolute value of the lower limit second voltage being set smaller than the discharge-inducing minimum voltage. With this structure, it is possible to simultaneously achieve miniaturization of nozzle, discharge of micro fluid droplet, high accuracy for discharge position, and decrease in drive voltage.

2 Claims, 23 Drawing Sheets

U.S. PATENT DOCUMENTS

| | | | |
|---|---|---|---|
| 6,264,298 B1 * | 7/2001 | Mantell | 347/15 |
| 6,328,426 B1 | 12/2001 | Chahn et al. | |
| 2002/0005876 A1 * | 1/2002 | Grimes et al. | 347/53 |
| 2003/0025744 A1 * | 2/2003 | Nou | 347/10 |
| 2003/0085940 A1 * | 5/2003 | Yamada | 347/19 |
| 2006/0017782 A1 * | 1/2006 | Nishi et al. | 347/55 |

FOREIGN PATENT DOCUMENTS

| | | | |
|---|---|---|---|
| JP | 63-007946 | | 1/1988 |
| JP | 07-223317 | | 8/1995 |
| JP | 08-238774 | | 9/1996 |
| JP | 10-052917 | | 2/1998 |
| JP | 2000-127410 | | 5/2000 |
| JP | 2001-088306 | | 4/2001 |
| JP | 2002-172786 | * | 6/2002 |
| JP | 2002172786 A | * | 6/2002 |
| JP | 2004-129699 | * | 4/2004 |

* cited by examiner

FIG. 12 (a)
FIG. 12 (b)
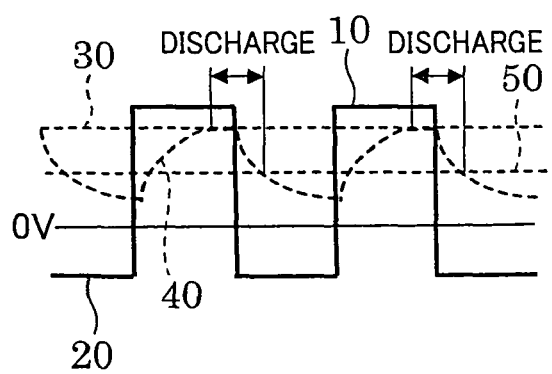
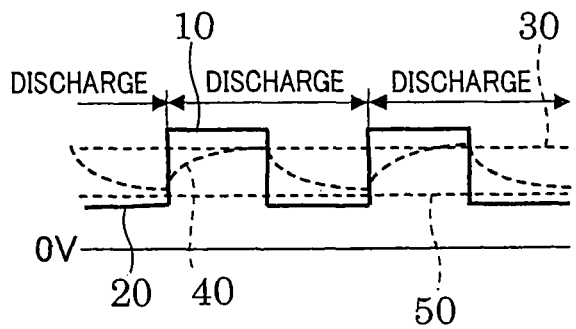
FIG. 13
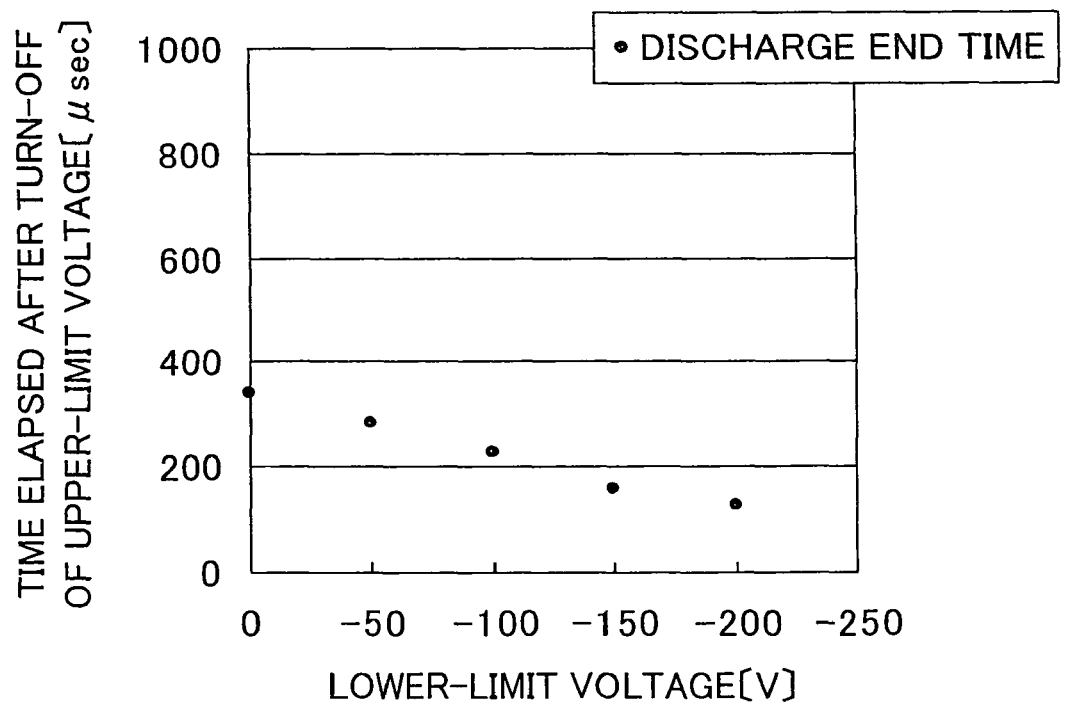

RELATIVE DISPLACEMENT DIRECTION

RELATIVE DISPLACEMENT DIRECTION

PATTERN      v

SMALL

↓

LARGE

FIG. 22 (a)
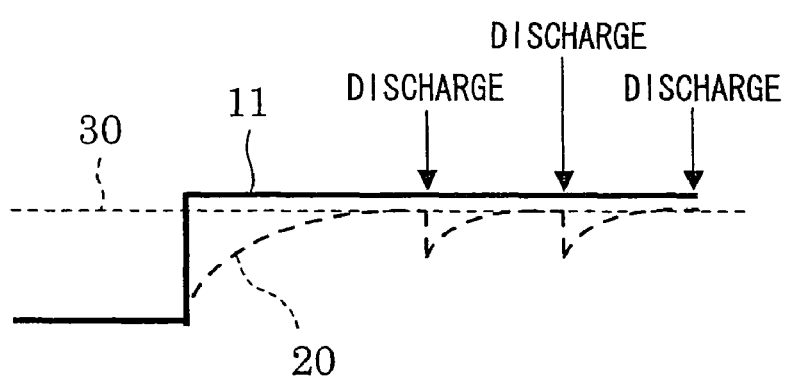
FIG. 22 (b)
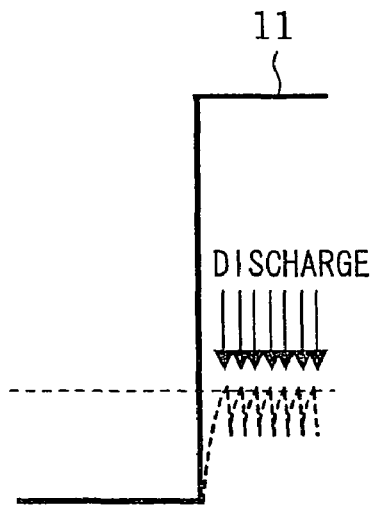
FIG. 23
| APPLIED SIGNAL VOLTAGE [V] | DISCHARGE FREQUENCY [kHz] |
|---|---|
| 140 | 5 |
| 180 | 10 |
| 300 | 15 |
| 400 | 31 |

$Q(t)=CV_0[1-\exp(-t/RC)]$
$V(t)=V_0[1-\exp(-t/RC)]$

ELECTROSTATIC SUCTION TYPE FLUID DISCHARGE METHOD AND DEVICE FOR THE SAME

TECHNICAL FIELD

The present invention relates to an electrostatic suction type fluid discharge method that electrically charges a fluid such as ink, and discharge the fluid due to suction by an electrostatic force onto an object such as a substrate. The present invention also relates to a device for carrying out the method.

BACKGROUND ART

Typical examples of fluid jet methods for discharging a fluid such as ink onto an object (recording medium) are a piezo type and a thermal type that are commercially utilized in ink jet printers. In addition to them, there is an electrostatic suction type method which applies an electric field to the fluid to be discharged, causing the fluid to be discharged through a hole (ink discharge hole, discharge hole) of nozzle.

Such an electrostatic suction type fluid discharge device is disclosed in, for example, Japanese Examined Patent Publication Tokkosho 36-13768 (published on Aug. 18, 1961) and Japanese Laid-Open Patent Application No. 2001-88306 (published on Apr. 3, 2001).

Also, Japanese Laid-Open Patent Application No. 2000-127410 (published on May 9, 2000) discloses a device arranged such that a nozzle hole is slit-shaped and a protruding needle electrode is formed on the nozzle hole, and an ink including fine particles is discharged using the needle electrode.

Japanese Laid-Open Patent Application No. 8-238774 (published on Sep. 17, 1996) discloses a device in which an electrode for applying a voltage is provided in an ink container from which an ink is supplied to a nozzle hole.

The following describes a fluid discharge model in a conventional electrostatic suction type fluid discharge device.

Design factors of electrostatic suction type fluid discharge devices, especially of on-demand electrostatic suction type fluid discharge devices, are conductivity of ink fluid (e.g. specific resistance of $10^6$ to $10^{11}$ Ωcm), surface tension (e.g. 0.020 to 0.040N/m), viscosity (e.g. 0.011 to 0.015 Pa·s), and applied voltage (electric field). As to the applied voltage, it has been considered that the voltage applied to the nozzle and the distance between the nozzle and a counter electrode are particularly important.

The electrostatic suction type fluid discharge devices utilize electrofluid instability, as shown in FIG. 32. Placing a conductive fluid in a uniform electric field, an electrostatic force exerted on the surface of the conductive fluid causes the surface to be instable, thereby precipitating the development of a thread (electro static spinning phenomenon). The electric field on this occasion is defined as $E_0$ which is generated when a voltage V is applied between a nozzle and a counter electrode. The distance between a nozzle hole at the tip of the nozzle and the counter electrode is defined as h. A development wavelength $\lambda_C$ in the aforesaid case can be physically figured out (see, e.g. The Institute of Image Electronics Engineers of Japan, Vol. 17, No. 4, 1988, pp. 185-193), and the developing wavelength $\lambda_C$ is represented by the following equation.

$$\lambda_c = \frac{2\pi\gamma}{\varepsilon_0}E_0^{-2} \tag{1}$$

In the equation, γ expresses surface tension (N/m), $\varepsilon_0$ expresses dielectric constant (F/m) in a vacuum, and $E_0$ expresses electric field intensity (V/m). If the nozzle diameter d(m) is shorter than the development does not occur. That is, the condition of the discharging is defined as follows.

$$d > \frac{\lambda_c}{2} = \frac{\pi\gamma}{\varepsilon_0 E_0^2} \tag{2}$$

Provided that $E_0$ is an electric field intensity on the assumption that a parallel flat plate is adopted, h(m) is the distance between the nozzle and counter electrode, and $V_0$ is a voltage applied to the nozzle, the following equation is given:

$$E_0 = \frac{V_0}{h} \tag{3}$$

According to this, d is found as follows.

$$d > \frac{\pi\gamma h^2}{\varepsilon_0 V_0^2} \tag{4}$$

The fluid discharge devices have typically been required to reduce the diameter of the nozzle through which ink is discharged, in order to form finer dots and lines.

However, in the currently-used piezo or thermal type fluid discharge devices, it is difficult to reduce the nozzle diameter and discharge, for example, a very small amount of fluid less than 1 pl. This is because, the smaller the nozzle for discharging a fluid is, the more the pressure required for the discharge increases.

In addition to the above, in the aforesaid fluid discharge devices, the miniaturization of droplets contradicts the improvement of precision, and hence it has been difficult to realize both of these improvements at the same time. The reason of this will be described below.

Kinetic energy imparted to the droplet discharged from the nozzle is in proportion to the cube of the diameter of the droplet. Therefore, the miniature droplets discharged in a case where the nozzle is miniaturized cannot attain the kinetic energy sufficient to resist the air resistance at the time of the discharge, and the droplets are disturbed by accumulated air or the like. For this reason, it is not possible to expect precise landing of the droplets. Moreover, since the effect of the surface tension increases as the size of the droplets decreases, the vapor pressure of the droplets increases and an amount of evaporation increases. Because of this, the miniature droplet causes great loss of mass in the process of flying, and it hardly remains the form of droplet at the time of landing.

In addition to the above, according to the aforesaid fluid discharge model of the conventional electrostatic suction type fluid discharge devices, the reduction of the nozzle diameter demands the increase in the electric field intensity required for the discharge, as the above-described equation (2) shows. The electric field intensity is, as shown in the equation (3), determined by the voltage (drive voltage) $V_0$ applied to the nozzle and the distance h between the nozzle and counter electrode. Therefore, the reduction of the nozzle diameter results in the increase in the drive voltage.

The drive voltage in the conventional electrostatic suction type fluid discharge devices is very high (not less than 1000V). It is therefore difficult to achieve the reduction in size and the density growth, in consideration of leaks and interferences between the nozzles. The problem becomes serious as the nozzle diameter is further reduced. A power semiconductor with a high voltage of not less than 1000V is typically expensive and does not excel in frequency responsiveness.

In the Japanese Examined Patent Publication 36-13768, the nozzle diameter is 0.127 mm. The range of the nozzle diameter in Japanese Laid-Open Patent Application No. 2001-88306 is specified as 50 to 2000 μm, more preferably 100 to 1000 μm.

As to the nozzle diameter, the development wavelength $\lambda_c$ is worked out as follows, if typical operating conditions of the conventional electrostatic suction type fluid discharge are applied: the development wavelength $\lambda_c$ is about 140 μm where the surface tension is 0.020 N/m and the electric field intensity is $10^7$V/m in the aforesaid equation (1). Consequently, the limit nozzle diameter is 70 μm. It has therefore been considered that, in a case where the nozzle diameter is not more than about 70 μm in the aforesaid conditions, the ink development does not occur even if the field intensity is high ($10^7$V/m), unless a countermeasure such as forcible formation of meniscus by the application of a back pressure is carried out. In short, it has been considered that the miniaturization of the nozzle is not compatible with the reduction in the drive voltage.

As described above, in the conventional fluid discharge devices, the miniaturization of the nozzle contradicts with the improvement of precision, and it has been difficult to achieve both of these improvements. In particular, regarding the electrostatic suction type fluid discharge devices, it has been considered that the miniaturization of the nozzle contradicts with the reduction in the drive voltage.

The present invention is made in view of the foregoing problems, and an object is to provide an electrostatic suction type fluid discharge method by which miniaturization of nozzle, discharge of a small amount of fluid with higher precision of landing position, and decrease in drive voltage are all achieved. The present invention also provides a device for carrying out the method.

DISCLOSURE OF INVENTION

In order to attain the foregoing object, an electrostatic suction type fluid discharge device according to the present invention discharges by electrostatic suction a fluid, which is electrically charged by voltage application, from a fluid discharge hole of a nozzle onto a substrate opposite to the nozzle, wherein: the fluid discharge hole, provided in the nozzle, has a diameter ranging from 0.01 μm to 25 μm, the electrostatic suction type fluid discharge device comprises voltage applying means for applying a pulse voltage between the nozzle and the substrate, an upper limit voltage of the pulse voltage being equal to or greater than a minimum voltage to induce discharge, that is a voltage required to start discharge of the fluid, and a pre-charge voltage is provided immediately before a rise of the pulse voltage, the pre-charge voltage having a same polarity as that of the upper limit voltage, an absolute value of the pre-charge voltage being set smaller than the minimum voltage to induce discharge.

In order to attain the foregoing object, an electrostatic suction type fluid discharge method according to the present invention discharges by electrostatic suction a fluid, which is electrically charged by voltage application, from a fluid discharge hole of a nozzle onto a substrate opposite to the nozzle, the fluid discharge hole, provided in the nozzle, having a diameter ranging from 0.01 μm to 25 μm, the method comprising the step of applying a voltage between the nozzle and the substrate, the voltage being equal to or greater than a minimum voltage to induce discharge, that is a voltage required to start discharge of the fluid, wherein a pre-charge voltage is provided immediately before a rise of the voltage, the pre-charge voltage having a same polarity as that of the voltage, an absolute value of the voltage being set smaller than the minimum voltage to induce discharge.

With the above structure, the fluid discharge hole provided in the nozzle has a diameter ranging from 0.01 μm to 25 μm, a local electric field is generated. Consequently, this miniaturization of nozzle allows reduction in drive voltage for discharge. Such reduction of the drive voltage is greatly beneficial to realize miniaturization of the device while ensuring high density. It may be obvious but reduction of the drive voltage allows the use of a low-voltage driver that offers advantageous cost performance. Note that, there is more detailed description below for this discharge model carrying out discharge of fluid by generating a local electric field with a micro nozzle.

Moreover, in the discharge model using the local electric field, the electric field strength required for discharge depends upon the converged local electric field strength, and therefore the counter electrode can be omitted. In other words, it becomes possible to carry out printing on an insulating substrate without using a counter electrode, allowing more flexible device arrangement. Further, it also becomes possible to print on a thick insulator.

However, the miniaturization of the nozzle described above has such a problem that, when the discharge amount becomes significantly small, the discharge response suddenly slows down exponentially. This makes the high-frequency drive difficult. By increasing the upper-limit voltage of the pulse voltage applied between the nozzle and the substrate, the discharge response increases to a certain degree, allowing the driving to be carried out at relatively high-frequencies. However, this structure requires a high-voltage driver for applying a high-voltage to the driving electrode. Because of this, the cost reduction due to the use of low-voltage driver, which was the main advantage of the miniaturization of the nozzle, cannot be attained.

When looking at the discharge response more specifically, it can be divided into the discharge-start response at the rise of the pulse voltage and the discharge-end response at the fall thereof. Therefore, low discharge response implies incapability of control of discharge amount with high accuracy, precisely dependent upon the application time of the upper limit voltage.

On the other hand, in the above structure in which the voltage applying means applies a pulse voltage between the nozzle and the substrate, and an upper limit voltage of the pulse voltage is set equal to or greater than a minimum discharge-inducing voltage, that is a voltage required to start discharge of the fluid; a pre-charge voltage is applied immediately before a rise of the pulse voltage, the pre-charge voltage having a same polarity as that of the upper limit voltage, an absolute value of the pre-charge voltage being set smaller than the minimum discharge-inducing voltage. Therefore, the meniscus surface potential is precharged to a certain degree in advance before the rise of pulse voltage.

Therefore, after the rise of the pulse voltage, the meniscus surface potential soon becomes reaches the minimum discharge-inducing voltage, that is a voltage required to induce discharge, thereby starting discharge. Therefore, discharge-start response can be improved. Consequently, the discharge limit frequency can be improved, making the high-frequency driving possible.

In order to achieve the above object, an electrostatic suction type fluid discharge device according to the present invention, which device discharges by electrostatic suction a fluid, which is electrically charged by voltage application, from a fluid discharge hole of a nozzle onto a substrate opposite to the nozzle, is characterized in that the fluid discharge hole, provided in the nozzle, has a diameter ranging from 0.01 μm to 25 μm, the electrostatic suction type fluid discharge device comprises voltage applying means for applying a pulse voltage between the nozzle and the substrate, an upper limit voltage of the pulse voltage being equal to or greater than a minimum discharge-inducing voltage, that is a voltage required to start discharge of the fluid, and an attenuation facilitating voltage is provided immediately after a fall of the pulse voltage, the attenuation facilitating voltage having an opposite polarity to that of the upper limit voltage.

In order to attain the foregoing object, an electrostatic suction type fluid discharge method according to the present invention discharges by electrostatic suction a fluid, which is electrically charged by voltage application, from a fluid discharge hole of a nozzle onto a substrate opposite to the nozzle, the fluid discharge hole, provided in the nozzle, having a diameter ranging from 0.01 μm to 25 μm, the method comprising the step of applying a voltage between the nozzle and the substrate, the voltage being equal to or greater than a minimum voltage to induce discharge, that is a voltage required to start discharge of the fluid, wherein an attenuation facilitating voltage is provided immediately after a fall of the voltage, the attenuation facilitating voltage having an opposite polarity to that of the voltage.

In the above structure, the fluid discharge hole provided in the nozzle has a micro diameter ranging from 0.01 μm to 25 μm, so that the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

Further, in the above structure in which the voltage applying means applies a pulse voltage between the nozzle and the substrate, and an upper limit voltage of the pulse voltage is set equal to or greater than a minimum discharge-inducing voltage, that is a voltage required to start discharge of the fluid, and an attenuation facilitating voltage is provided immediately after a fall of the pulse voltage, the attenuation facilitating voltage having an opposite polarity to that of the upper limit voltage. Therefore, the meniscus surface potential is rapidly attenuated after the fall of the pulse voltage.

Therefore, after the fall of the pulse voltage, the meniscus surface potential soon becomes lower than the minimum discharge-maintaining voltage, that is a voltage required to maintain discharge, and the discharge stops. Therefore, discharge-end response can be improved. Consequently, the discharge limit frequency can be improved, making the high-frequency driving possible.

In order to attain the foregoing object, an electrostatic suction type fluid discharge device according to the present invention discharges by electrostatic suction a fluid, which is electrically charged by voltage application, from a fluid discharge hole of a nozzle of a discharge head onto a substrate opposite to the nozzle, wherein: the fluid discharge hole, provided in the nozzle, has a diameter ranging from 0.01 μm to 25 μm, the electrostatic suction type fluid discharge device comprises line-drawing means for applying a voltage between the nozzle and the substrate while relatively moving the nozzle and the substrate so as to carry out line-drawing, the voltage being equal to or greater than a minimum voltage to induce discharge, that is a voltage required to start discharge of the fluid, the line-drawing means controlling a speed of the relative movement so that adjacent ones of discharge pattern are partly overlaid with each other, in accordance with a period of intermittent discharge which is performed at a frequency depending on the voltage and an electric conductivity of the fluid.

In order to attain the foregoing object, an electrostatic suction type fluid discharge method according to the present invention discharges by electrostatic suction a fluid, which is electrically charged by voltage application, from a fluid discharge hole of a nozzle of a discharge head onto a substrate opposite to the nozzle, the fluid discharge hole, provided in the nozzle, having a diameter ranging from 0.01 μm to 25 μm, the electrostatic suction type fluid discharge method comprising the step of applying a voltage between the nozzle and the substrate while relatively moving the nozzle and the substrate so as to carry out line-drawing, the voltage being equal to or greater than a minimum voltage to induce discharge, that is a voltage required to start discharge of the fluid, wherein the electrostatic suction type fluid discharge device controls a speed of the relative movement so that adjacent ones of discharge pattern are partly overlaid with each other, in accordance with a period of intermittent discharge which is performed at a frequency depending on the voltage and an electric conductivity of the fluid.

With the above structure in which the fluid discharge hole provided in the nozzle has a diameter ranging from 0.01 μm to 25 μm, a local electric field is generated in accordance with the discharge model using a local electric field. On this account, miniaturization of nozzle achieves a decrease in drive voltage for discharging. Such reduction of the drive voltage is greatly beneficial to miniaturization of the device and an increase in density. It may be obvious but, this reduction of the drive voltage allows the use of a low-voltage driver that offers advantageous cost performance.

Moreover, in the discharge model using the local electric field, the electric field strength required for discharge depends upon the converged local electric field strength, and therefore the counter electrode can be omitted. In other words, it becomes possible to carry out printing on an insulating substrate without using a counter electrode, allowing more flexible device arrangement. Further, it also becomes possible to print on a thick insulator.

However, in the above structure, the discharge response basically depends upon the electric resistance of fluid (discharge material) between the electrode in the nozzle and the tip of nozzle, and therefore, the discharge response may be extremely changed by a change in electric conductivity of the fluid. In this case, stable line-drawing may not be performed depending upon the relative speed between the nozzle and the substrate or the voltage applied between the nozzle and the substrate. This problem occurs as a consequence of miniaturization of the diameter of the tip of the nozzle, which makes the diameter/width of the dot/line formed on the substrate to be super miniaturized. In addition to this, an increase in electric resistance as a result of miniaturization of nozzle which results in deterioration in discharge response also contributes to the problem. This is a new problem that would not have been an issue in the conventional discharge amount.

On the other hand, in the above structure, the line-drawing means applies a voltage between the nozzle and the substrate while relatively moving the nozzle and the substrate so as to carry out line-drawing, which voltage is equal to or greater than the minimum discharge-inducing voltage, that is a voltage required to start discharge of the fluid. Further, the line-drawing means controls a speed of the relative movement so that adjacent ones of discharge pattern are partly overlaid with each other, in accordance with a period of intermittent discharge which is performed at a frequency depending on the voltage and an electric conductivity of the fluid. Therefore, a continuous and stable line-drawing can be performed at a high speed without causing errors such as an inappropriately widened line width, while setting the voltage in the vicinity of the minimum discharge-inducing voltage that is a voltage required for drawing super micro line.

In order to attain the foregoing object, an electrostatic suction type fluid discharge device according to the present invention discharges by electrostatic suction a fluid, which is electrically charged by voltage application, from a fluid discharge hole of a nozzle of a discharge head onto a substrate opposite to the nozzle, wherein: the fluid discharge hole, provided in the nozzle, has a diameter ranging from 0.01 μm to 25 μm, the electrostatic suction type fluid discharge device comprises line-drawing means for applying a voltage between the nozzle and the substrate while relatively moving the nozzle and the substrate so as to carry out line-drawing, the voltage being equal to or greater than a minimum voltage to induce discharge, that is a voltage required to start discharge of the fluid, the line-drawing means controlling the voltage so that adjacent ones of discharge pattern are partly overlaid with each other, the discharge pattern being discharged intermittently, and being determined depending on a speed of the relative movement.

As described above, another electrostatic suction type fluid discharge device according to the present invention discharges by electrostatic suction a fluid, which electrostatic suction type fluid discharge device is electrically charged by voltage application, from a fluid discharge hole of a nozzle of a discharge head onto a substrate opposite to the nozzle, wherein the fluid discharge hole, provided in the nozzle, has a diameter ranging from 0.01 μm to 25 μm; and the electrostatic suction type fluid discharge device comprises line-drawing means for applying a voltage between the nozzle and the substrate while relatively moving the nozzle and the substrate so as to carry out line-drawing, the voltage being equal to or greater than a minimum discharge-inducing voltage, that is a voltage required to start discharge of the fluid, the line-drawing means controlling the voltage so that adjacent ones of discharge pattern are partly overlaid with each other, the discharge pattern being discharged intermittently, and being determined depending on a speed of the relative movement.

In the above structure, the fluid discharge hole provided in the nozzle has a micro diameter ranging from 0.01 μm to 25 μm, so that the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

Further, in the above structure, the line-drawing means applies a voltage between the nozzle and the substrate while relatively moving the nozzle and the substrate so as to carry out line-drawing, which voltage is equal to or greater than minimum discharge-inducing voltage, that is a voltage required to start discharge of the fluid. Here, the voltage applied between the nozzle and the substrate is so controlled that adjacent ones of discharge pattern are partly overlaid with each other, which discharge pattern are discharged intermittently and determined depending on a speed of the relative movement. Therefore, the frequency of intermittent discharge can be increased to accommodate high speed movement, and a continuous and stable line-drawing can be performed at a desired high speed.

In order to attain the foregoing object, an electrostatic suction type fluid discharge device according to the present invention applies a drive voltage by drive voltage apply means between a nozzle and a discharge target so as to apply an electric charge to a fluid supplied into the nozzle, and thereby discharges the fluid from a hole of the nozzle to the discharge target, wherein: the hole of the nozzle falls within a range between φ1 μm and φ5 μm in diameter, the device outputting the drive voltage under a condition: a voltage value=$V_0$, and an application time=t, which are specified as: $130V<V_0[1-\exp(-t/RC)]$ where R expresses electric resistance of the fluid, and C expresses electric capacitance between the fluid in a tip of the nozzle and the discharge target.

In the conventional fluid discharge devices, the miniaturization of the nozzle requires more intense electric field to cause the fluid to be discharged, and therefore the miniaturization of nozzle contradicts with decrease in drive voltage. In contrast, the present invention has achieved both the miniaturization of nozzle and the decrease in drive voltage with the use of nozzle whose diameter is specified within the foregoing range. This structure was made based on such a new finding that a micro nozzle of φ0.01 μm to φ25 μm in diameter causes a local electric field, which allows the fluid to be discharged by a lower drive voltage.

Further, the present invention has a structure with a specified nozzle diameter, ranging from φ0.01 μm and φ5 μm. With this structure, the present invention ensures the effect of decrease in drive voltage by the use of a micro diameter nozzle.

Further, since the voltage for driving nozzle is outputted under a condition: a voltage value=$V_0$, and an application time=t, which are specified as: $130V<V_0[1-\exp(-t/RC)]$, the meniscus surface potential of the tip of nozzle is securely set to the value to induce discharge or greater. This increases reliability in drawing micro dot patterns.

Yet another electrostatic suction type fluid discharge device according to the present invention applies a drive voltage between a nozzle and a discharge target by drive voltage supply means so as to apply an electric charge to a fluid supplied into the nozzle, and thereby discharges the fluid from a hole of the nozzle to the discharge target, the hole of the nozzle falling within a range between φ1 μm and φ5 μm in diameter, the electrostatic suction type fluid discharge device is arranged to satisfy:

$$VH=-0.001X^2+0.44X+125$$

$$VL=-0.0013X^2+0.69X+160$$

where X expresses a distance between the nozzle and the discharge target, and VH and VL express maximum and minimum values of discharge start voltage at which discharge of the fluid from the nozzle is started, respectively.

As with the aforementioned electrostatic suction type fluid discharge device, this device also achieves both the miniaturization of nozzle and the decrease in drive voltage. Further, this structure in which the nozzle diameter is specified in a range from φ1 μm to φ5 μm securely ensures the effect of decrease in drive voltage by the use of a micro diameter nozzle.

Further, since the voltage at which the fluid is discharged from the nozzle is set between the maximum value (VH) and the minimum value (VL), which are specified as: VH=−0.001X$^2$+0.44X+125 and VL=−0.0013X$^2$+0.69X+160, it is possible to perform stable and reliable discharge of fluid from the nozzle in forming a micro pattern.

Additional objects, features, and strengths of the present invention will be made clear by the description below. Further, the advantages of the present invention will be evident from the following explanation in reference to the drawings.

BRIEF DESCRIPTION OF DRAWINGS

FIG. 12(a) is a waveform diagram showing a waveform of pulse voltage applied between a nozzle and a substrate, and transition in meniscus surface potential.

FIG. 12(b) is a waveform diagram showing a waveform of pulse voltage applied between a nozzle and a substrate, and transition in meniscus surface potential.

FIG. 13 is a graph showing a result of test for discharge-start response depending on the voltage value applied immediately before a fall of pulse voltage applied between a nozzle and a substrate.

FIG. 22(a) is an explanatory view showing a relationship between (i) a waveform of direct signal voltage applied between a nozzle and a substrate and (ii) a period of intermittent discharge.

FIG. 22(b) is an explanatory view showing a relationship between (i) a waveform of direct signal voltage applied between a nozzle and a substrate and (ii) a frequency of intermittent discharge.

FIG. 23 is an explanatory view showing a relationship between (i) a value of direct signal voltage applied between a nozzle and a substrate and (ii) a frequency of intermittent discharge.

FIG. 25(a) is a schematic structure view of an electrostatic suction type fluid discharge device according to another embodiment of the present invention.

FIG. 27 (b) is a graph where the application voltage and the application time are set to 680V and 1200 μsec, respectively.

FIG. 27 (c) is a graph where the application voltage and the application time are set to 1600V and 400 μsec, respectively.

BEST MODE FOR CARRYING OUT THE INVENTION

The following describes a concrete example and a comparative example so as to more specifically explain the present invention. The examples below are however not to limit the present invention.

An electrostatic suction type fluid discharge device according to the present embodiment has a nozzle with a diameter of 0.01 μm to 25 μm, and can control the discharge of fluid to be discharged with a drive voltage not more than 1000V.

In a conventional fluid discharge model, since a smaller nozzle diameter requires a higher drive voltage, when the nozzle diameter is not more than 50 μm, ink is assumed not to be discharged by a drive voltage not more than 1000V unless the device is specially designed, for example, to apply back pressure. However, the inventor of the present invention have devoted themselves to reviewing, and found that a nozzle having a specific diameter or less causes a discharge phenomenon in a discharge model which differs from the conventional fluid discharge model. The present invention is made based on this new fluid discharge model using a local electric field.

First, the fluid discharge model using a local electric field is explained below with reference to FIGS. 2 through 7.

Figure 2:
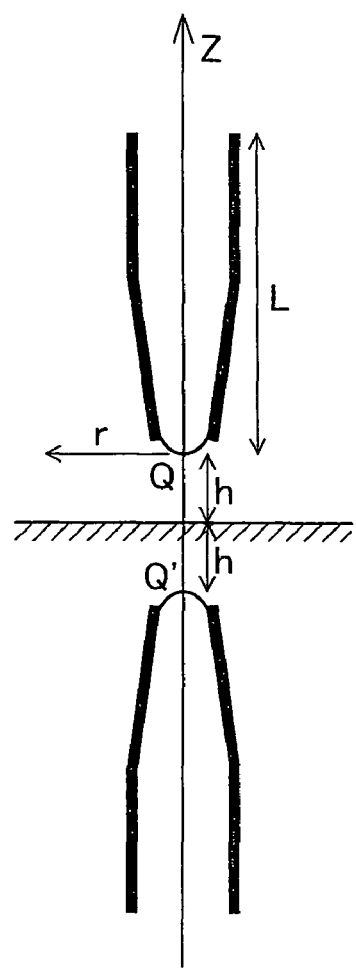
FIG. 2 is used for illustrating the calculation of the electric field intensity in a discharge model that is a basic concept of the present invention.

Assuming that a conductive fluid is injected into a nozzle having a diameter of d (this hereinafter indicates an internal diameter of nozzle unless otherwise specified), and the nozzle is positioned at a point of height h, vertically to an infinite flat plate conductor. FIG. 2 shows this state.

$$Q = 2\pi \epsilon_0 \alpha V_0 d \quad (5)$$

Here, the electric charge Q induced in the tip of nozzle (nozzle hole), which is assumed to be gathered to a hemispherical section formed by the fluid in the tip of nozzle, is expressed as follows.

In the Formula (5), Q (C) expresses a charge induced in the tip of nozzle, $\epsilon_0$ expresses a dielectric constant (F/m) of a vacuum, d expresses a nozzle diameter, $V_0$ expresses a gross voltage applied to the nozzle. Further, α expresses a proportionality constant which relies on the shape of nozzle and some other factors, α generally being about 1-1.5, and becomes substantially 1 under condition: d<<h (h: distance (m) between nozzle (nozzle hole, to be more specific) and substrate.

Further, when the substrate is a conducting substrate, it would appear that a mirror image charge Q' having a polarity opposite to that of the charge Q is induced in a symmetrical and opposed position to the nozzle on the substrate. Similarly, when the substrate is an insulator, the image charge Q having a polarity opposite to that of a video Q' is induced in a symmetric position which is determined depending on the dielectric constant of the substrate.

The intensity of gathered electric field $E_{loc}$ is figured out by the following Formula (6), where R expresses a curvature radius of the tip section of nozzle.

$$E_{loc} = \frac{V_0}{kR} \quad (6)$$

In the formula, k expresses a proportionality constant which relies on the shape of nozzle and some other factors, k generally being about 1.5-8.5, often being about 5 (P. J. Birdseye and D. A. Smith, Surface Science, 23(1970), p. 198-210). Further, here, the condition R=d/2 is set so as to make the structure of fluid discharge model simple. This condition denotes a state that the fluid in the tip of nozzle is extruded in a hemispherical shape, whose curvature radius is equal to that of the nozzle diameter d, by the surface tension.

Here, to look at the balance of pressure applied to the fluid in the tip of nozzle, the electrostatic pressure $P_e$ is first found as follows, where S expresses the area of liquid in the tip of nozzle.

$$P_e = \frac{Q}{S} E_{loc} = \frac{2Q}{\pi d^2} E_{loc} \quad (7)$$

Then, assuming a condition: α=1 according to the Formulas (5) through (7), the pressure $P_e$ is further expressed as follows.

$$P_e = \frac{4\epsilon_0 V_0}{d} \cdot \frac{2V_0}{kd} = \frac{8\epsilon_0 V_0^2}{kd^2} \quad (8)$$

Meanwhile, the pressure $P_s$, which is caused by the surface tension of the fluid in the tip of nozzle, is found as follows where γ expresses the surface tension.

$$P_s = \frac{4\gamma}{d} \quad (9)$$

To cause a fluid to be discharged, the electrostatic force needs to be greater than the surface tension, and therefore the relationship between the electrostatic pressure $P_e$ and the pressure $P_s$ by the surface tension is found as follows.

$$P_e > P_s \quad (10)$$

Figure 3:
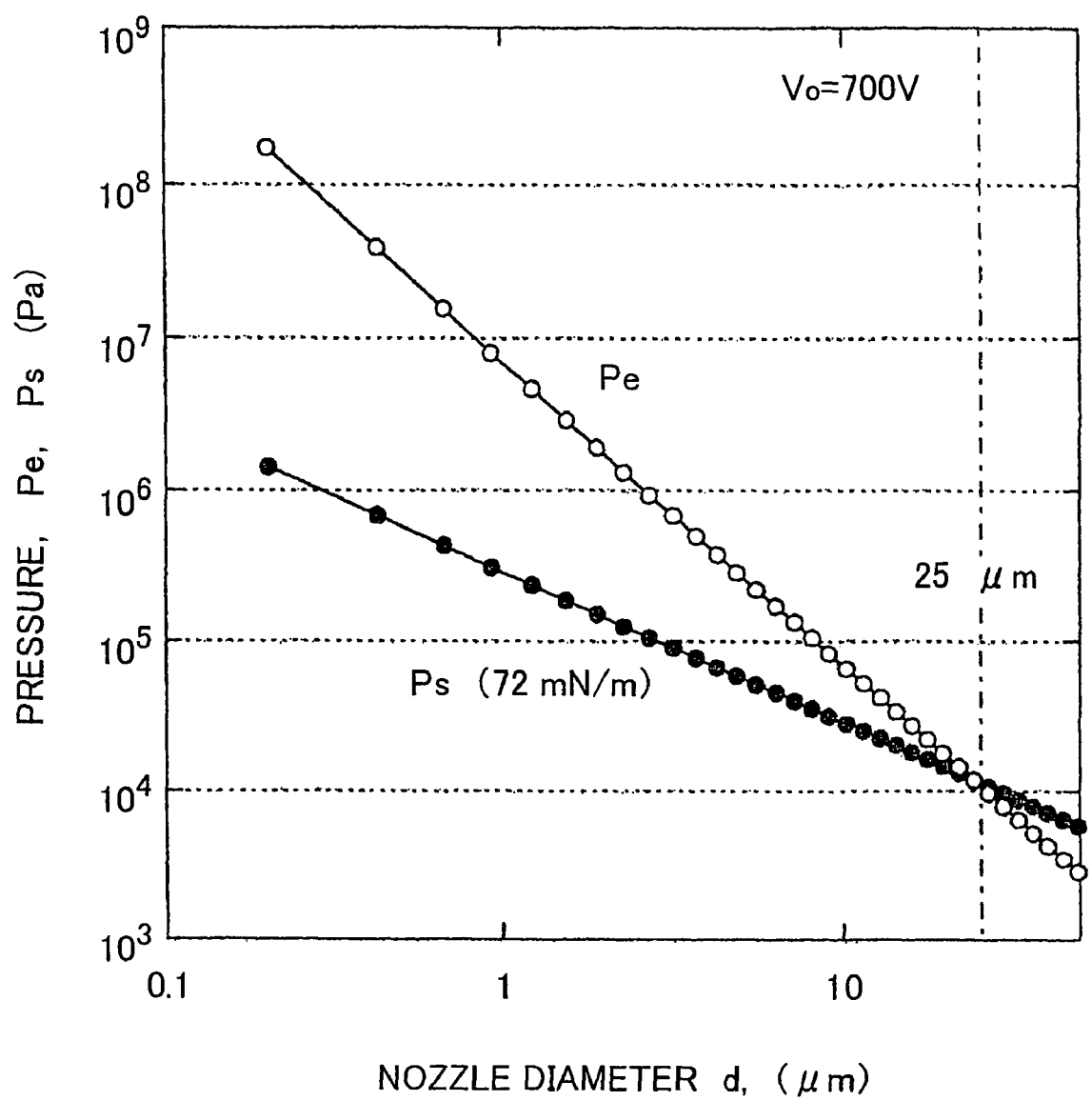
FIG. 3 is a graph showing a result of model calculation of nozzle-diameter dependency of a surface tension pressure and electrostatic pressure.

FIG. 3 shows a relationship between the electrostatic pressure $P_e$ and the pressure $P_s$ by the surface tension for a nozzle having a diameter=d. The surface tension is found by assuming that the fluid is water (γ=72 mN/m). On the stipulation that the voltage applied to the nozzle is 700V, the electrostatic pressure $P_e$ appears to be greater than the pressure $P_s$ by the surface tension when the nozzle diameter d is 25 μm. According to this, the following Formula (11) denotes the relationship between $V_0$ and d at the minimum voltage to cause the fluid to be discharged.

$$V_0 > \sqrt{\frac{\gamma k d}{2\varepsilon_0}} \quad (11)$$

Further, the discharge pressure ΔP is given by the Formula (12), and is finally given by the Formula (13).

$$\Delta P = P_e - P_s \quad (12)$$

$$\Delta P = \frac{8\varepsilon_0 V_0^2}{k d^2} - \frac{4\gamma}{d} \quad (13)$$

Figure 4:
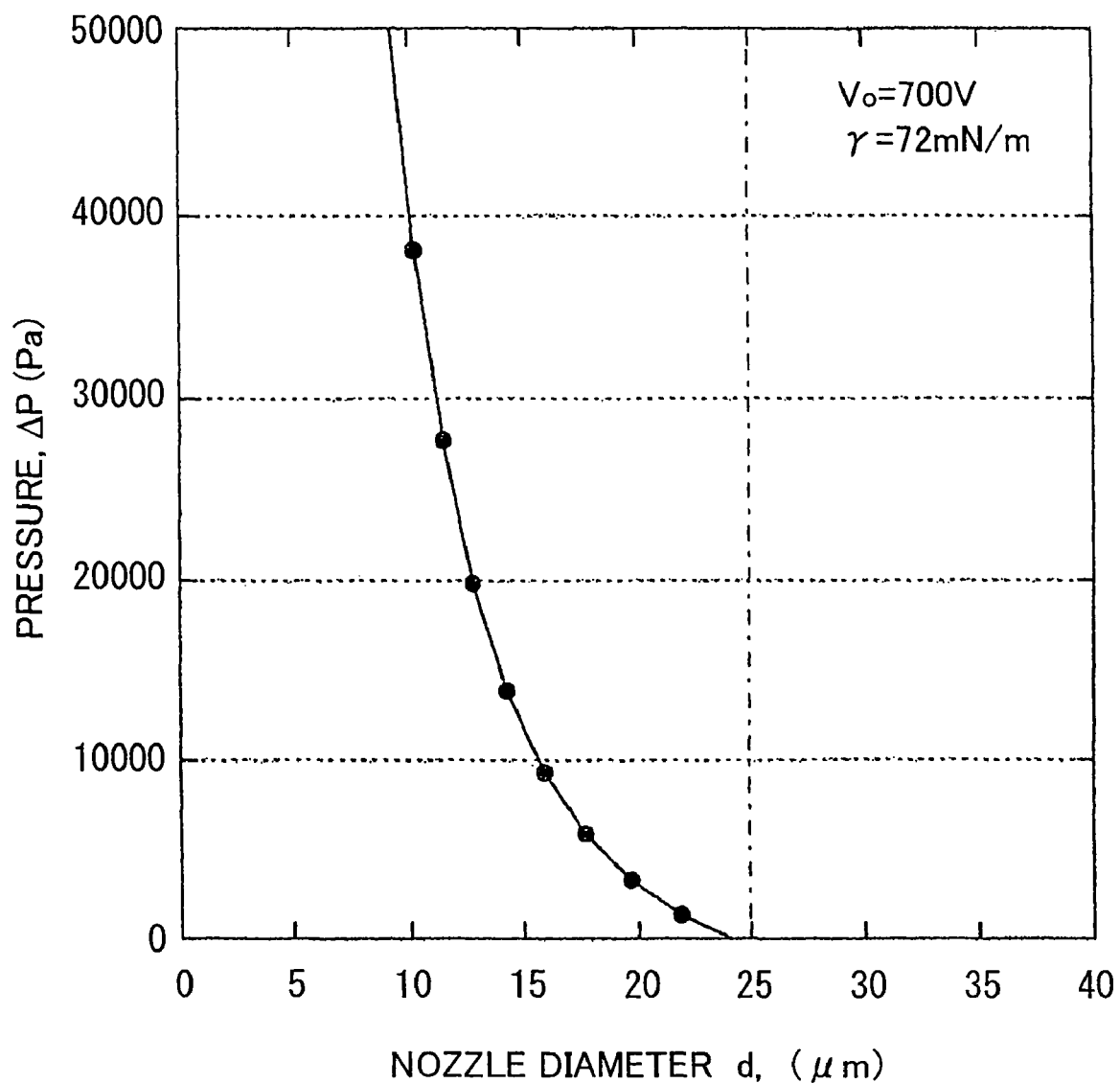
FIG. 4 is a graph showing a result of model calculation of nozzle diameter dependency of a discharge pressure.
Figure 5:
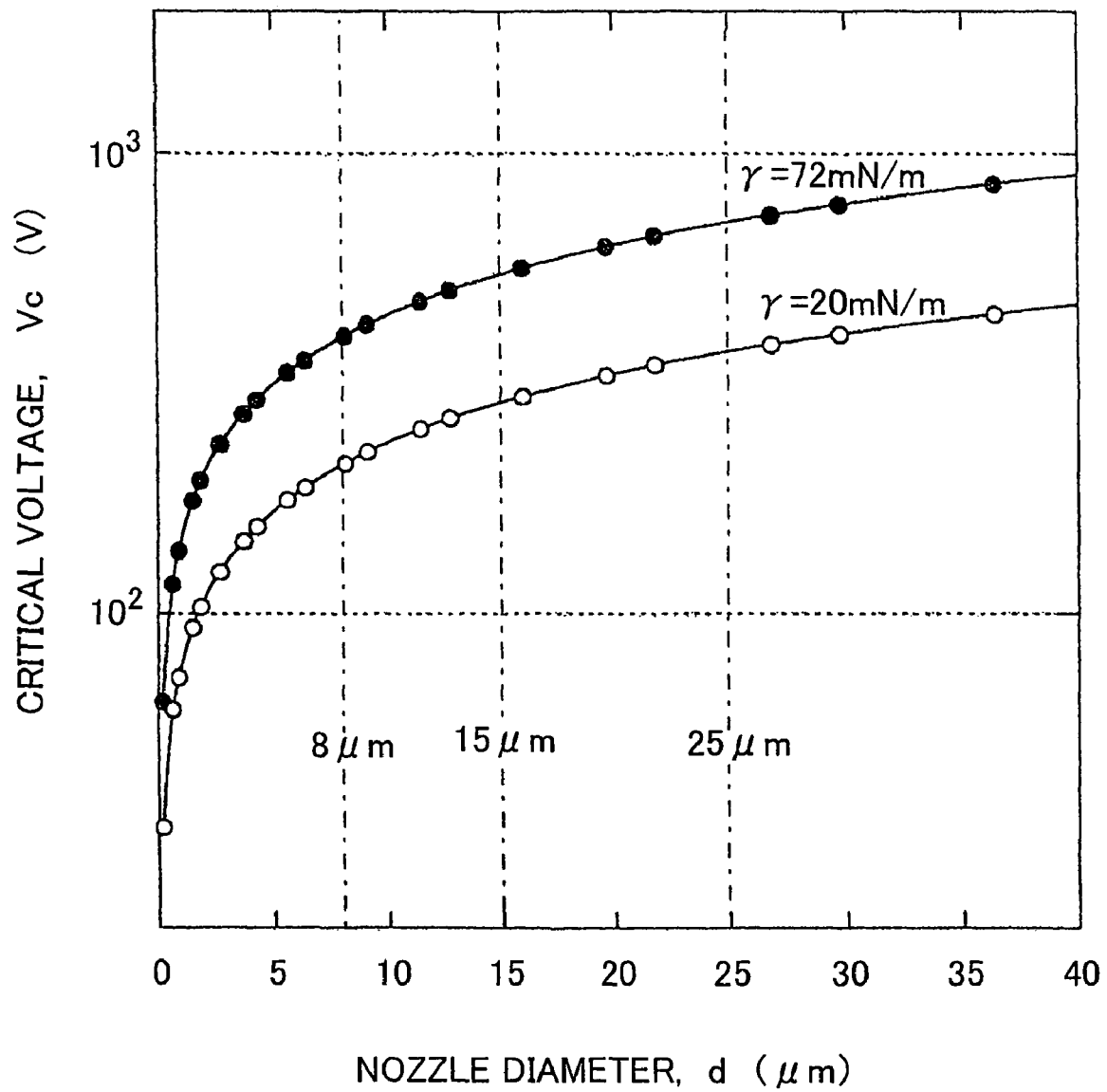
FIG. 5 is a graph showing a result of model calculation of nozzle diameter dependency of a discharge limit voltage.

FIG. 4 shows a dependency of the discharge pressure ΔP when the condition to cause discharge in a nozzle having a diameter=d is met by a local electric field strength. FIG. 5 shows a dependency of critical discharge voltage (minimum voltage to cause discharge) Vc.

As can be seen in FIG. 4, if the condition to cause discharge in a nozzle having a diameter=d is met by a local electric field strength (when the condition: $V_0$=700V, γ=72 mN/m is assumed), the upper limit of the nozzle diameter is 25 μm.

In the calculation in FIG. 5, the condition: K=5 was satisfied by assuming that the fluid is water (γ=72 mN/m) and an organic solvent (γ=20 mN/m). In consideration of the effect that the micro nozzle causes an electric field to be converged, this figure clearly shows that the critical discharge voltage decreases as the nozzle diameter decreases, and therefore the critical voltage to discharge water is figured out as about 700V for a 25 μm nozzle.

In only the idea of electric field for the conventional discharge model, that is an electric field defined by the voltage $V_0$ applied to the nozzle and the distance h between the nozzle and the counter electrode, is taken into account; the drive voltage to cause discharge increases as the diameter of nozzle becomes smaller.

However, in the discharge model using a local electric field for which the local electric field strength is also taken into account, the drive voltage for discharge can be reduced by a microscopic size nozzle. Such reduction in drive voltage offers a great advantage to miniaturize the device and to realize high-density nozzle. Besides, decreasing the drive voltage also enables use of a low voltage driver which appreciably helps cost reduction.

Moreover, in the discharge model using the local electric field, the electric field strength required for discharge depends on the converged local electric field strength, and therefore the counter electrode can be omitted. More specifically, in a conventional discharge model, an electric field is applied between the nozzle and the substrate, and therefore it was necessary to either provide a counter electrode on the other side of nozzle when using an insulating substrate, or use a conducting substrate. Further, in forming the counter electrode, that is, when the substrate is an insulator, the thickness of the substrate was limited.

On the other hand, the discharge model using the local electric field is capable of printing on an insulating substrate without using a counter electrode, allowing more flexible device arrangement. Further, it is capable of printing on a thick insulator.

Figure 6:
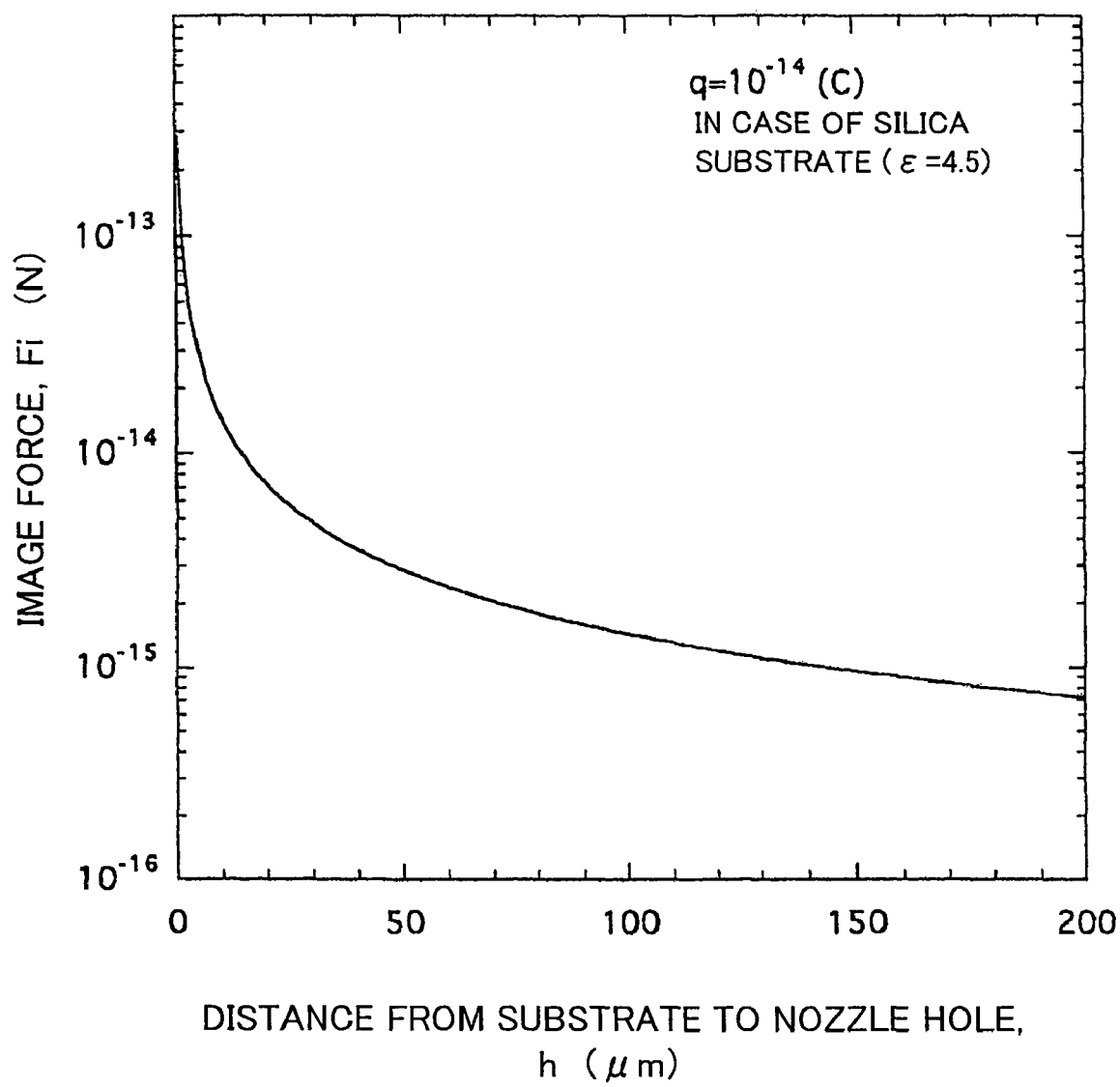
FIG. 6 shows a correlation between (i) an image force exerted between an electrically charged droplet and a substrate and (ii) the distance between a nozzle and the substrate.

Further, since the fluid discharged from the nozzle is electrically charged, an image force is generated between the fluid and the substrate. FIG. 6 shows a correlation between the magnitude of the image force and the distance h of nozzle from the substrate. As shown therein, the image force becomes more significant as the distance between the substrate and the nozzle decreases, particularly when h becomes smaller than 20 μm.

Next, the following assumption is made to find a way of precisely controlling the discharge flow rate. For a viscid fluid, the flow rate Q in a cylinder path is denoted by the following Hagen Poiseuille Formula. When a cylinder nozzle is used, the flow rate Q in the nozzle is expressed as follows.

$$Q = \frac{\pi \Delta P}{\eta L} d^4 \quad (14)$$

In the formula, η expresses a viscosity coefficient (Pa·s), L expresses a length (m) of flow path (nozzle), d expresses a diameter (m) of flow path (nozzle hole), and ΔP expresses a pressure difference (Pa). The foregoing formula indicates that the flow rate Q is proportional to the fourth power of the radius of flow path, meaning that the flow rate can be effectively controlled by using a micro nozzle. The value found by Formula (13) is used in the Formula (14), and the following Formula (15) is obtained.

$$Q = \frac{4\pi d^3}{\eta L}\left(\frac{2\varepsilon_0 V_0^2}{k d} - \gamma\right) \quad (15)$$

Figure 7:
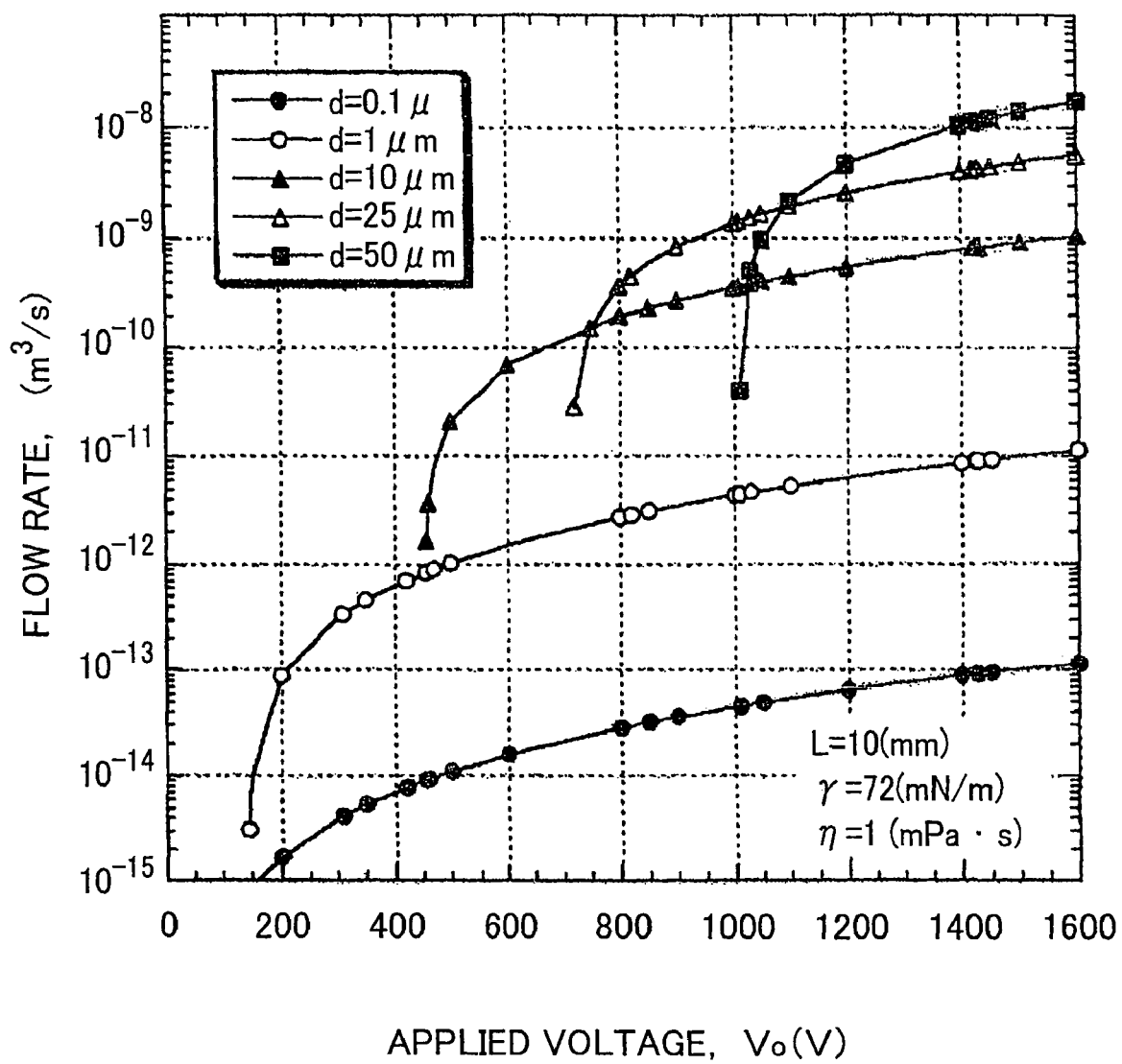
FIG. 7 shows a result of model calculation of a correlation between an applied voltage and the rate of fluid discharged from the nozzle.

The Formula (15) is to find an amount of fluid flowing out of a nozzle having a length=L and a diameter=d, when a voltage V is applied to the nozzle. FIG. 7 shows this state. The amount is calculated on condition that: L=10 mm, η=1 (mPa·s), γ=72 (mN/m). In this case, the diameter of nozzle is assumed to be 50 μm, the minimum diameter among the conventional nozzles. The voltage V is gradually applied, and the fluid is started to be discharged at 1000V, which corresponds to the discharge-start voltage mentioned in FIG. 5. The Y axis denotes the flow rate of fluid from the nozzle. The flow rate jumps right after the discharge-start voltage Vc.

According to this model calculation, a micro flow rate appears to be obtained by precisely setting the voltage to a value slightly above Vc. However, as can be seen in the semilog diagram, it is not possible in actual operation, particularly for a tiny amount below $10^{-10}$ m³/s. Moreover, as explained above with Formula (11), a minimum drive voltage for a nozzle having a certain diameter is automatically determined. Therefore, discharging of fluid less than $10^{-10}$ m³/s, or application of voltage less than 1000V is not practically realistic as long as the nozzle diameter is at least 50 μm.

As can be seen in the diagram, a nozzle having a diameter=25 μm can easily discharge a minute amount of fluid with a drive voltage of 700V or even less than that, and if the diameter is only 10 μm, discharge of that can be controlled by a voltage less than 500V. Further, a nozzle of 1 μm can be driven by a voltage less than 300V.

The foregoing theory was presented with an assumption that the fluid is discharged as a continuous flow. The following explains a switching operation to discharge a one-shot flow.

The discharge by electrostatic absorption is based on charging of fluid in the tip of nozzle. The charging speed is estimated at around the time constant, which depends on the dielectric relaxation.

$$\tau = \frac{\varepsilon}{\sigma} \quad (16)$$

In the formula, $\varepsilon$ expresses relative dielectric constant, and $\sigma$ expresses conductivity of fluid (S·m). Assuming that the relative dielectric constant is 10, and the conductivity is $10^{-6}$ S/m, a condition: $\tau=1.854\times10^{-5}$ sec is found. Further, if the critical frequency is denoted by fc, the Formula (17) is given.

$$f_c = \frac{\sigma}{\varepsilon} \quad (17)$$

Accordingly, it is not possible to follow a change in electric field at a frequency higher than fc, that is, the discharge does not occur. On this stipulation, a frequency for the case above is estimated at about 10 kHz.

Next, the following takes up a decrease of surface tension in the nozzle wall. Assuming a droplet of fluid discharged on an insulator placed on an electrode, the contact area of the fluid and the insulator can be increased by applying a voltage between the fluid and the electrode, in other words, the voltage application improves wettability. This phenomenon is known as Electrowetting. This effect also works for a cylindrical capillary, in which case it is often called Electrocapillary. The relation among (i) pressure due to Electrowetting, (ii) applied voltage, (iii) shape of capillary, and (iv) physicality value of solvent is denoted by the Formula (18) below.

$$P_{ec} = \frac{2\varepsilon_0 \varepsilon_r}{t} \frac{V_0^2}{d} \quad (18)$$

In the formula, $\varepsilon_0$ expresses dielectric constant in a vacuum, $\varepsilon_r$ expresses dielectric constant of insulator, t expresses thickness of insulator, and d expresses internal diameter of capillary. Adopting this formula with an assumption that the fluid is water, the case described in "Example" of the foregoing Japanese Examined Patent application Tokkosho 36-13768 (published on Aug. 18, 1961) was examined, with a result of 30000 Pa (0.3 atm), which is not so significant. On the other hand, the same examination was carried out for the present invention with the result of about 30 atm when an electrode is provided outside the nozzle. With this effect, the fluid is quickly supplied to the tip of nozzle even in the case of micro nozzle.

This effect becomes more significant as the dielectric constant of insulator increases, and as the thickness decreases. Strictly, the electrode needs to be placed on an insulator to obtain Electrocapillary; however, the effect can still be obtained as long as sufficient electric field is applied to a sufficient insulator.

However, it should be noted in presenting this approximate theory that the strength of electric field in this case denotes not the conventional sense of electric field which depends on the voltage $V_0$ applied to the nozzle and the distance h between the nozzle and the counter electrode, but a strength of converged local electric field in the tip of nozzle. Further, an important feature of the present invention is the use of converged local electric field, and a fluid-supplying path having a significantly small conductance. Also, in the present invention, the fluid is sufficiently charged even in a unit of micro area.

On this account, when a dielectric substance, such as a substrate, or an electric conductor approaches, the small amount of fluid is ejected at right angles with respect to the substrate due to the image force. Considering this structure, a grass capillary is used in the Embodiment below because of its simple fabrication; however, the present invention is not limited to this.

[First Embodiment]

As described above, the nozzle diameter and the drive voltage are both reduced in an electrostatic suction type fluid discharge manner using a local electric field. However, when discharging a one-shot flow of fluid, this method also carries out application of pulse voltage between the nozzle filled with the fluid and the substrate placed oppositely to the nozzle tip, attracting the liquid in the nozzle end toward the substrate, so that a droplet is formed on the substrate.

In this method, the amount of fluid discharged from the nozzle increases as the upper-limit voltage (maximum value) of pulse voltage, which is applied between the nozzle and the substrate, increases; that is the amount decreases as the upper-limit voltage of pulse voltage decreases. More specifically, the discharge amount can be controlled by controlling the maximum value of pulse voltage.

However, in this model, the discharge response is basically determined by (i) an electric resistance R of the fluid residing between the electrode inside the nozzle and the nozzle tip and (ii) a time constant RC, that is a product of electrostatic capacitance C between the meniscus in the nozzle tip and the substrate. Further, the parameters for determining the electric resistance R and the electrostatic capacitance C include the nozzle diameter d. That is, the discharge response depends on the nozzle diameter d.

Figure 8:
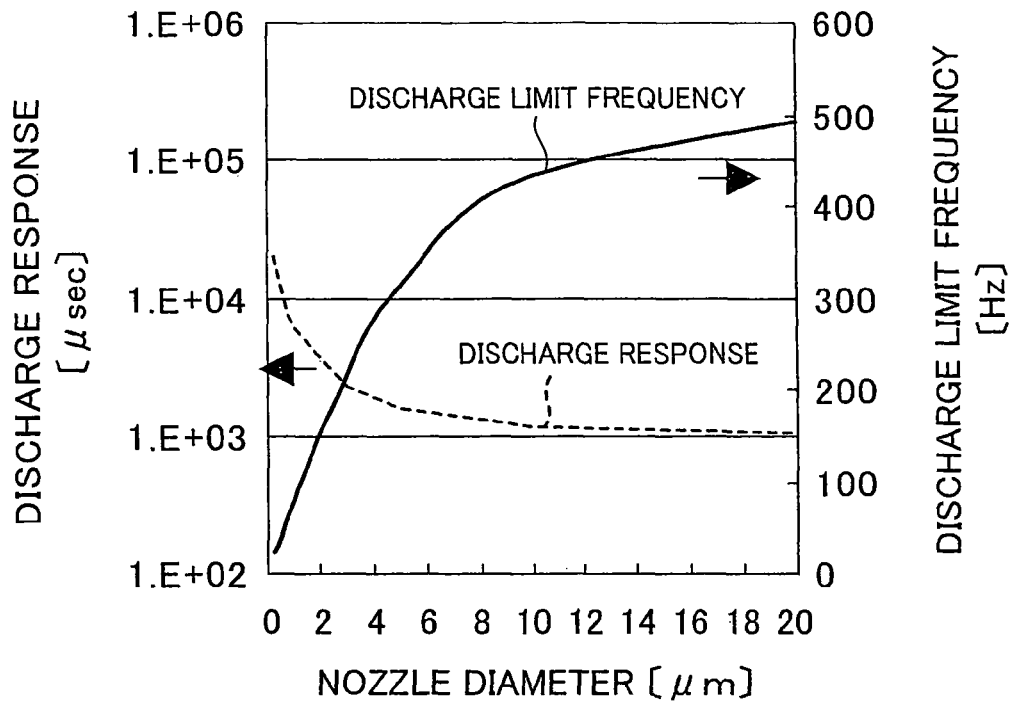
FIG. 8 is a graph showing the relationship among nozzle diameter, discharge response, and discharge limit frequency.

FIG. 8 is a graph showing a discharge response of silver nano paste. As can be seen in the figure, the time constant RC extremely increases as the nozzle diameter decreases. This makes the discharge response decrease, and also decreases the frequency limit to cause discharge.

More specifically, in an electrostatic suction type fluid discharge method by the fluid discharge model using a local electric field, the discharge response extremely decreases as discharge amount becomes very low, which gives another problem, a difficulty in performing high-frequency driving. By increasing the upper-limit voltage of the pulse voltage applied between the nozzle and the substrate, the discharge response certainly increases, enabling the driving to be carried out at relatively high-frequencies. However, this structure requires a high-voltage driver for applying a high-voltage to the driving electrode. Because of this, the cost reduction due to the use of low-voltage driver, which was the main advantage of an electrostatic suction type fluid discharge method by a fluid discharge model using a local electric field, cannot be attained.

To be more specific, the discharge response is broken into a discharge-start response at a rise of pulse voltage, and a discharge-end response at a fall of pulse voltage. In view of this, a low discharge response automatically means incapability of control of discharge amount accurately in response to the application time of the upper-limit voltage.

Besides, such a problem of response at a rise/fall of voltage affects not only application of the pulse voltage but also application of DC voltage when actually drawing a line on the substrate. That is, the decrease in discharge-start response at the beginning of DC voltage application also decreases accuracy of control for the start-position of discharge, which is supposed to depend on the start-position of application of DC voltage. Similarly, the decrease in discharge-end response at the end of DC voltage application also decreases accuracy of control for the end-position of discharge, which is supposed to depend on the end-position of application of DC voltage.

Because the electrostatic suction type fluid discharge method by a fluid discharge model using a local electric field allows discharge of much less amount of fluid than the that discharged in the conventional device, the dot diameter, the dot pitch, the width, pitch, or length of line (in the case of line drawing) all have become finer. This is why the foregoing new problems have arisen.

The electrostatic suction type fluid discharge device according to the present invention has a specific arrangement of the waveform of voltage applied between the nozzle and the substrate. With this arrangement, the device is driven at high-frequencies by a cost favorable low-voltage driver, while ensuring accuracies in control of discharge amount which depends on the application time of the upper-limit voltage and in control for the start/end-position of discharge which depends on the start/end-timing of application of DC voltage. The following more specifically explains the structure of this electrostatic suction type fluid discharge device.

Figure 9:
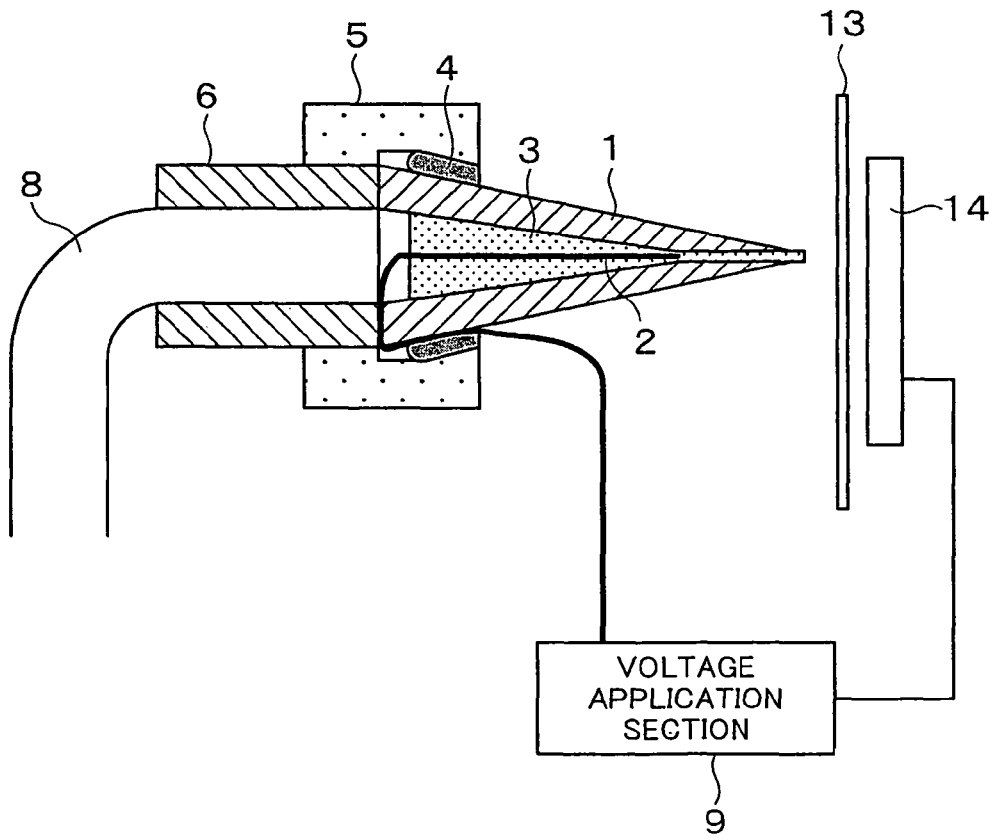
FIG. 9 is an explanatory view including a cross section of lateral side of major part of an electrostatic suction type fluid discharge device according to one embodiment of the present invention.

FIG. 9 is a cross section of lateral side of an electrostatic suction type fluid discharge device according to one embodiment of the present invention. The reference numeral 1 in the figure indicates a nozzle having a super-micro diameter. At the tip of the nozzle is formed a nozzle hole (discharge hole) having a super-micro diameter. In order to realize discharge of very few amount of fluid, it is necessary to either dispose a low-conductance flow path in the neighborhood of the nozzle 1 or adopt a low-conductance nozzle 1. For this reason, a glass capillary is suitable, but conductive material coated by insulating material is also applicable.

The followings are typical advantages of a glass nozzle. Firstly, it is easy to form a nozzle hole of several µm on a glass nozzle. Secondly, in the case of blockage of nozzle, it is easy to reproduce another nozzle end by breaking the old nozzle end. Thirdly, its taper angle makes unnecessary solvent move upward (an opposite side to the nozzle hole side in a case where the nozzle 1 is so disposed that the nozzle hole is positioned at the lower end) by surface tension, so that the unnecessary solvent would not be accumulated in the nozzle end, and therefore does not cause blockage of nozzle. Finally, the glass nozzle 1 is moderately flexible, and therefore may serve as a movable nozzle.

More specifically, the nozzle 1 can be formed from a glass capillary with filament (product name: GD-1 manufactured by Narishige Co. Ltd.) by using a capillary puller. The followings are advantages of using the glass capillary with filament.

(1) It is easy to fill the nozzle with ink because the glass on the filament side is easily soaked by the ink; (2) because the glass on the filament side is hydrophilic whereas that on the external side is hydrophobic, the ink stays in a limited space, that substantially corresponds to the inner diameter of the glass on the filament side at the tip of the nozzle, by which the intensive electric field becomes further significant; (3) it becomes possible to miniaturize the nozzle; and (4) sufficient mechanical intensity can be obtained.

It is preferable that the lower limit value of the diameter of the nozzle hole (hereinafter, the diameter will be referred to as a nozzle diameter) be 0.01 µm, in consideration of production convenience. Further, it is preferable that the upper limit value of the nozzle diameter be 25 µm, or more preferably 15 µm, because (i) the upper limit of the nozzle diameter in the case where the electrostatic force exceeds the surface tension, as shown in FIG. 3, is 25 µm, and (ii) the upper limit of the nozzle diameter in the case where the discharge condition is satisfied on an account of local electric field intensity, as shown in FIG. 4, is 25 µm. Especially, in order to more effectively utilize the local electric field intensity, it is preferable that the nozzle diameter be in a range of 0.01 µm to 8 µm.

Further, the nozzle 1 is not limited to the capillary tube, and it may be a two-dimensional pattern nozzle formed by minute processing. In a case where the nozzle 1 is made of glass that is easy to be formed, the nozzle 1 cannot function as an electrode. Therefore, an electrode 2 (described later) of metal wire (for example, a tungsten wire) is inserted into the nozzle 1. The electrode 2 may be formed inside the nozzle 1 by plating. In a case where the nozzle 1 is made of conductive material, insulating material is applied thereon.

A discharge material 3 is supplied into the nozzle 1 from a fluid supply source (not illustrated) until it fills up the nozzle 1. The discharge material 3 is an object to be discharged from the nozzle 1 via a supply path 8. Further, the electrode 2 is so disposed in the nozzle 1 as to be soaked in the discharge material 3. The nozzle 1 is mounted to the holder 6 by a shield rubber 4 and a nozzle clamp 5.

With the effect of converged electric field at the tip of the nozzle, and the effect of the image force exerted on the counter substrate, the present invention allows omission of counter substrate, which is supposed to be provided at a rear side of the substrate, or a conductive substrate, which were required in the conventional discharge device. Therefore, an insulating glass substrate, a plastic substrate such as polyimide, a ceramics substrate, a semiconductor substrate or other types of substrate can be used as the substrate.

However, in order to ensure stable landing of the discharge material 3 from the nozzle hole of the nozzle 1 onto the surface of the substrate 13, the present embodiment uses a counter electrode 14, which is provided to be opposed to the nozzle hole of the nozzle 1 with a certain distance therefrom. The substrate 13 is disposed between the counter electrode 14 and the nozzle 1.

The electrode 2 and the counter electrode 14 are connected to the voltage applying section 9. The voltage applying section 9 controls at least one of the voltages applied to the electrode 2 or that applied to the counter electrode 14, so as to apply the pulse voltage for a one-shot flow discharge, or a direct current bias voltage for a continuous discharge of fluids, between the tip of the nozzle 1 and the substrate 13. A positive or negative voltage may be arbitrarily used for this voltage applied between the tip of the nozzle 1 and the substrate 13.

Before explaining application of voltage by the voltage applying section 9, the following shows the result of discharge response test, in which various voltages are applied between the nozzle 1 and the substrate 13, and the discharge response is checked for each case.

Figure 10A:
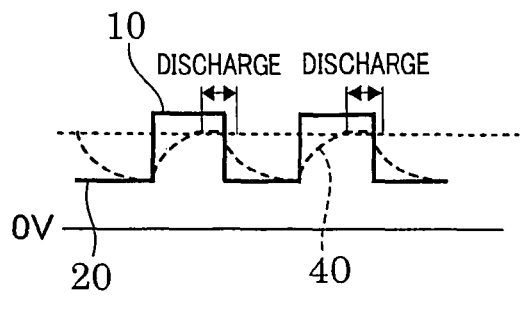
FIG. 10(a) is a waveform diagram showing a waveform of pulse voltage applied between a nozzle and a substrate, and transition in meniscus surface potential.
Figure 10:
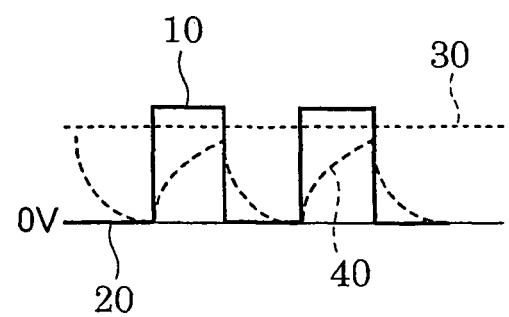
FIG. 10(b) is a waveform diagram showing a waveform of pulse voltage applied between a nozzle and a substrate, and transition in meniscus surface potential.

First of all, the pulse voltages shown in FIGS. 10(a) and 10(b) are applied between the nozzle 1 and the substrate 13.

For the pulse voltages shown in FIGS. 10(a) and 10(b), their upper limit voltages 10 are set to the same voltage that is equal to or greater than the minimum discharge-inducing voltage 30. The period and the cycle of applying the upper voltages 10 are the same, but their lower limit voltages 20 are different. The lower limit voltage 20 of FIG. 10(b) is set to 0V, whereas the lower limit voltage 20 of FIG. 10(a) is set greater than 0V and lower than the minimum discharge-inducing voltage 30.

The minimum discharge-inducing voltage 30 designates the required voltage condition to cause discharge in the case where the fluid is discharged by application of direct current bias. Discharge starts when the meniscus surface potential formed of the fluid at the tip of the nozzle 1 (nozzle hole) reaches the minimum discharge-inducing voltage 30. For example, when the tip diameter of the nozzle is 2 μm, the minimum discharge-inducing voltage 30 is approximately 150V.

The present embodiment describes an exemplary case where the upper limit voltage 10 has a positive polarity. However, as described above, the upper limit voltage 10 may have a negative polarity. Therefore, the level of the voltage used in the description corresponds to the amount of the absolute value, which is measured from a reference value=0V.

When the pulse voltages having such waveforms are applied, a relationship between the discharge condition and the change of the meniscus surface potential at the tip of the nozzle 1 can be described as follows. In the pulse voltage shown in FIG. 10(b), the lower limit voltage 20 is set to 0V, and therefore, discharge material 3 becomes conducted immediately after the pulse voltage is applied. Then, electric charge is accumulated in the meniscus at the tip of the nozzle 1, and the meniscus surface potential (indicated by a broken line in the figures) 40 increases. The increase of the meniscus surface potential 40 normally draw a saturation curve although it may differ depending upon the electric conductivity of the upper limit voltage 10 or the discharge material 3, and the resistance of the fluid path in the nozzle 1. Discharge starts when the meniscus surface potential 40 reaches the minimum discharge-inducing voltage (indicated by a dot line in the figures) 30. However, in the case of FIG. 10(b), the meniscus surface potential 40 does not reach the minimum discharge-inducing voltage 30 within the application time of the upper limit voltage 10. Therefore, no discharge occurs. After the fall of the upper limit voltage 10, the accumulated electric charge in the meniscus starts to be electrically discharged correspondingly to the potential difference to the lower limit voltage 20, and the meniscus surface potential 40 is attenuated. Therefore, in the comparative example, increase and attenuation of the meniscus surface potential 40 alternately happen according to the pulse voltage period, and the discharge of fluid does not occur.

On the other hand, in the pulse voltage in FIG. 10(a), the lower limit voltage 20 is set greater than 0V. Therefore, electric charge is previously accumulated on the meniscus before the upper limit voltage 10 is applied, and the meniscus surface potential 40 is approximately the same as the lower limit voltage 20. As the upper limit voltage 10 is applied (risen), the meniscus surface potential 40 starts increasing, starting from the same value as the lower limit voltage 20. The meniscus surface potential 40 reaches the minimum discharge-inducing voltage 30 within the application time of the upper limit voltage 10. When the meniscus surface potential 40 reaches the minimum discharge-inducing voltage 30, discharge of the fluid starts. After the fall of the upper limit voltage 10, the discharge ends concurrently with the attenuation of the meniscus surface potential 40.

As described above, by previously applying a bias having the same polarity as that of the upper limit voltage 10 as the lower limit voltage 20, the meniscus surface potential 40 reaches the minimum discharge-inducing voltage 30 by the upper limit voltage 10 within the application time with which the discharge of fluid does not occurs when the lower limit voltage 20 was 0V, thereby causing the fluid to be discharged. Therefore, the fluid can be discharged according to the pulse voltage period (period of the upper limit voltage).

As the time taken to start discharge since the upper limit voltage 10 rises is shortened, more immediate discharge-start response is obtained. Therefore, if only the discharge-start response is taken into consideration, the lower limit voltage 20 is preferably set to the same polarity as that of the upper limit voltage 10, however to a lower value than that of the minimum discharge-inducing voltage 30. Within this range, the lower limit voltage 20 is preferably set as high as possible, that is, as close to the minimum discharge-inducing voltage 30 as possible.

Figure 11:
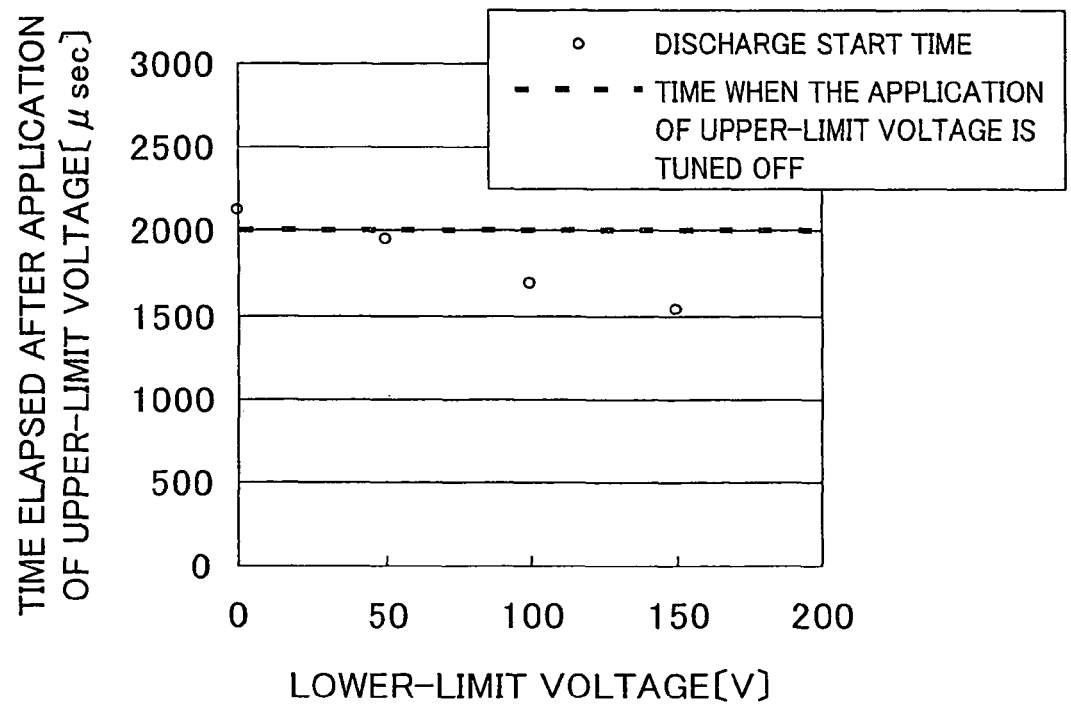
FIG. 11 is a graph showing a result of test for discharge-start response depending on the voltage value applied immediately before a rise of pulse voltage applied between a nozzle and a substrate.

FIG. 11 shows a result of test for discharge-start response, using the silver nano paste manufactured by HARIMA CHEMICALS, INC (with the nozzle diameter of 12 μm). In order to confirm the discharge characteristics in conformity with the electric conductivity of the silver nano paste, the upper limit voltage 10 of the pulse voltage was set to +450V, and the application time of the upper limit voltage 10 was set to 2000 μsec. In this experiment, the minimum discharge-inducing voltage 30 was +200V.

As shown in FIG. 11, as the lower limit voltage 20 of the pulse voltage was increased from 0V to +150V, the time taken to start discharge since the upper limit voltage 10 was applied gradually decreases. This proved the effect on the improvement in the discharge response by the use of the lower limit voltage 20.

This indicates that the discharge-start response can be improved by the lower limit voltage 20 having the same polarity as that of the upper limit voltage 10 and lower than the minimum discharge-inducing voltage 30. As a result, the drive frequency increases.

Subsequently, the pulse voltages shown in FIGS. 12(a) and 12(b) are applied between the nozzle 1 and the substrate 13.

For the pulse voltages shown in FIGS. 12(a) and 12(b), their upper limit voltages 10 are set to the same voltage that is equal to or greater than the minimum discharge-inducing voltage 30. Their application times and periods of the upper voltages 10 are also the same, but the lower limit voltages 20 have different values. The lower limit voltage 20 of FIG. 12(b) has the same polarity as that of the upper limit voltage 10, whereas the lower limit voltage 20 in FIG. 12(a) has the opposite polarity to that of the upper limit voltage 10.

When the pulse voltages having such waveforms are applied, the relationship between discharge and change in the meniscus surface potential 40 at the tip of the nozzle 1 becomes as follows. In the comparative example shown in FIG. 12(b), the lower limit voltage 20 and the upper limit voltage 10 have the same polarity. Therefore, the potential difference between the lower limit voltage 20 and the meniscus surface potential 40 after the fall of the upper limit voltage 10 is small, and an attenuation speed of the meniscus surface potential 40 after the fall of the upper limit voltage 10 is slow. Consequently, it takes a while for the meniscus surface potential 40 to reach the minimum discharge-maintaining voltage (indicated by a dot line in the figures) 50 after the fall of the upper limit voltage 10, and therefore the discharge continues for a while. FIG. 12(b) shows the most extreme case thereof. Because the lower limit voltage 20 is extremely high, the meniscus surface potential 40 does not fall below the minimum discharge-maintaining voltage 50 within the application period of the lower limit voltage 20. Therefore, intermittent discharge continuously happens in the entire pulse signal period (application period of the upper limit voltage).

On the other hand, in the pulse voltage according to the present embodiment that is shown in FIG. 12(a), the lower limit voltage 20 and the upper limit voltage 10 have opposite polarities. Therefore, the potential difference between the lower limit voltage 20 and the meniscus surface potential 40 after the fall of the upper limit voltage is large, and the attenuation speed of the meniscus surface potential 40 is fast. This expedites the timing where the meniscus surface potential 40 becomes lower than the minimum discharge-maintaining voltage 50 due to attenuation, thereby improving separation of fluids. As a result the discharge-end response improves.

As described above, by setting the lower limit voltage 20 to the opposite polarity to that of the upper limit voltage 10 and applying an opposite polarity bias after the fall of the upper limit voltage 10, termination of discharge after the fall of the upper limit voltage 10 is facilitated, thus improving the discharge-end response. By improving the discharge-end response, discharge limit frequency is also improved.

As the time taken to end discharge since the upper limit voltage 10 falls is shortened, more immediate discharge-end response is obtained Therefore, if only the discharge-end response is taken into consideration, the lower limit voltage 20 should be set to a maximally great value in the opposite polarity to that of the upper limit voltage 10. However, if the absolute value exceeds the absolute value of the minimum discharge-inducing voltage 30, the meniscus surface potential 40 may turn into the opposite polarity, although it depends upon the proportion of the application time of the upper limit voltage 10 to that of the lower limit voltage 20 (duty ratio). Therefore, it is preferable that the absolute value be set equal to or lower than the minimum discharge-inducing voltage 30.

FIG. 13 shows a result of test for discharge-start response, using the silver nano paste manufactured by HARIMA CHEMICALS, INC (with the nozzle diameter of 12 μm). In order to confirm the discharge characteristics in conformity with the electric conductivity of the silver nano paste, the upper limit voltage 10 of the pulse voltage was set to +450V, and the application time of the upper limit voltage 10 was set to 3000 μsec. In this experiment, the minimum discharge-inducing voltage 30 was +200V.

As shown in FIG. 13, as the lower limit voltage 20 of the pulse voltage was increased from 0V to −200V, the time taken to start discharge since the upper limit voltage 10 was applied gradually decreases. This proves that the discharge response is improved by setting the polarity of the lower limit voltage 20 to the opposite polarity to that of the upper limit voltage 10.

The foregoing experiment shows that the discharge-end response can be improved by setting the lower limit voltage 20 to the opposite polarity to that of the upper limit voltage 10, thereby improving drive frequency.

In view of the foregoing effect of improvement in the discharge-start response and the discharge-end response by the specific setting of lower limit voltage 20 of the pulse voltage, the voltage applied between the nozzle 1 and the substrate 13 by the voltage applying section 9 of the electrostatic suction type fluid discharge device is set as follows.

Figure 1:
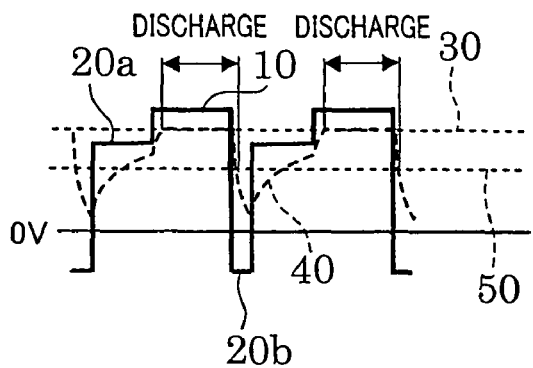
FIG. 1(a) is a waveform diagram showing a waveform of pulse voltage applied between a nozzle and a substrate, and transition in meniscus surface potential, in an electrostatic suction type fluid discharge device according to one embodiment of the present invention.
FIG. 1(b) is a waveform diagram showing a waveform of pulse voltage applied between a nozzle and a substrate, and transition in meniscus surface potential, in a comparative example.
Figure 1:
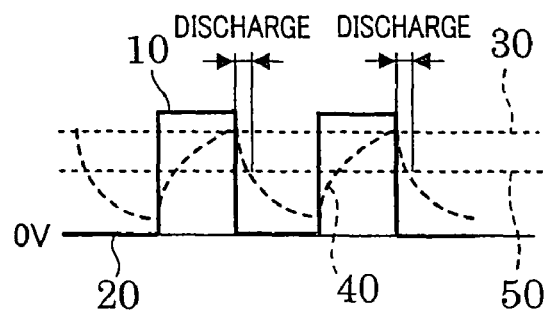

FIG. 1(a) shows a waveform of pulse voltage applied between the nozzle 1 and the substrate 13 by the voltage applying section 9, in the case of droplets discharge. FIG. 1(b) shows a waveform in a comparative example.

In the pulse voltage of the present embodiment and that of the comparative example, the upper limit voltages 10 are set to the same value that is equal to or greater than the minimum discharge-inducing voltage 30. The application time and period of the respective upper limit voltages 10 are also the same, but there is a difference in the lower limit voltage 20. In the comparative example, the lower limit voltage 20 is set to 0V. On the other hand, in the present embodiment, the lower limit voltage 20 is so set as to have two specific stages. To ensure the desired discharge-start response, a first lower limit voltage (pre-charge voltage) 20a is set immediately before the rise of the upper limit voltage 10. The first lower limit voltage 20a has the same polarity as that of the upper limit voltage 10, and is lower than the minimum discharge-inducing voltage 30. To ensure the desired discharge-end response, a second lower limit voltage (attenuation facilitating voltage) 20b is set immediately after the fall of the upper limit voltage 10. The second lower limit voltage has the opposite polarity to that of the upper limit voltage 10.

When the pulse voltages having such waveform are applied, the relationship between discharge and change of the meniscus surface potential 40 at the tip of the nozzle 1 becomes as follows. In the comparative example shown in FIG. 1(b), the lower limit voltage 20 is 0V. Therefore, the discharge material 3 becomes conducted immediately after application of pulse voltage. Then, the meniscus at the tip of the nozzle 1 starts to be electrically charged, and the meniscus surface potential 40 increases. Eventually discharge starts when the meniscus surface potential 40 reaches the minimum discharge-inducing voltage 30. After the upper limit voltage 10 falls, and the meniscus surface potential 40 is attenuated, the meniscus surface potential 40 starts decreasing and finally falls below the minimum discharge-maintaining voltage 50, and the discharge ends.

On the other hand, in the pulse voltage of the present embodiment shown in FIG. 1(a), the first lower limit voltage 20a is set lower than the minimum discharge-inducing voltage 30 immediately before the rise of the upper limit voltage 10. Therefore, electric charge is accumulated on the meniscus surface according to the first lower limit voltage 20a. As a result, the meniscus surface potential 40 becomes approximately the same potential as the first lower limit voltage 20a. Further, when the upper limit voltage 10 that is equal to or greater than the minimum discharge-inducing voltage 30 is applied, the meniscus surface potential 40 immediately reaches the minimum discharge-inducing voltage 30, and discharge starts. On the other hand, the second lower limit voltage 20b is set immediately after the fall of the upper limit voltage 10, which second lower limit voltage 20b has the opposite polarity to that of the upper limit voltage 10. Therefore, the meniscus surface potential 40 is attenuated rapidly after the fall of the upper limit voltage 10. Consequently, the meniscus surface potential 40 immediately falls below the minimum discharge-maintaining voltage 50, and the discharge ends.

With the above structure, the discharge response can be improved both at the rise and the fall of the upper limit voltage 10, improving the discharge limit frequency. Further, by improving the discharge response both at the rise and the fall of the upper limit voltage 10, the discharge can be controlled according to the application time of the upper limit voltage, allowing the amount of discharge to be controlled according to time.

Figure 14:
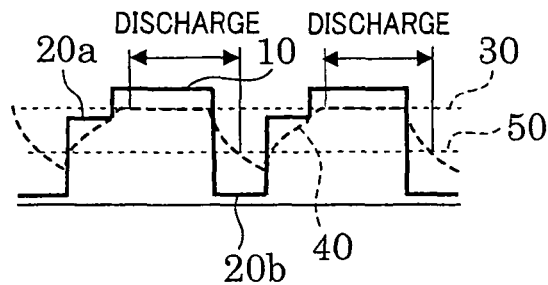
FIG. 14 is a waveform diagram showing a waveform of pulse voltage applied between a nozzle and a substrate, and transition in meniscus surface potential.

FIG. 14 shows a waveform of pulse voltage of a modified example that is applied between the nozzle 1 and the substrate 13 by the voltage applying section 9, in the case of the one-shot flow discharge. The difference between the pulse voltage shown in FIG. 14 and that in FIG. 1(a) is the second lower limit voltage 20b which is set immediately after the fall of the upper limit voltage 10. Here, the second lower limit voltage 20b is lower than the first lower limit voltage 20a, and has the same polarity as that of the upper limit voltage 10. If the second lower limit voltage 20b has the same polarity, the closer to 0V the second lower limit voltage 20b is, the better the discharge-end response is. Further, the second lower limit voltage 20b may be a pulse voltage of 0V. This, in comparison with the second lower limit voltage 20b having the opposite polarity, is less effective for improving the discharge-end response, but enables the one-shot flow discharge with minimum no-discharge period, and therefore is effective for formation of contiguous dots. Further, it becomes possible to adopt a low-voltage driver because the potential difference between the upper limit voltage and the lower limit voltage of the pulse voltage becomes small.

Figure 15:
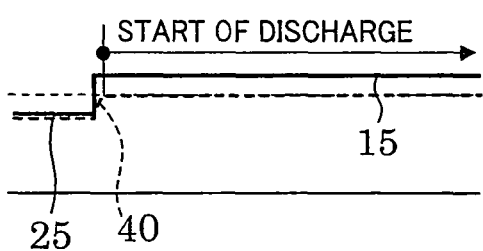
FIG. 15(a) is a waveform diagram showing a (i) waveform at a start of DC voltage application between a nozzle and a substrate, and (ii) transition in meniscus surface potential, for an electrostatic suction type fluid discharge device of FIG. 1.
FIG. 15(b) is a waveform diagram showing a (i) waveform at a start of DC voltage application, and (ii) transition in meniscus surface potential, for a comparative example.
Figure 15:
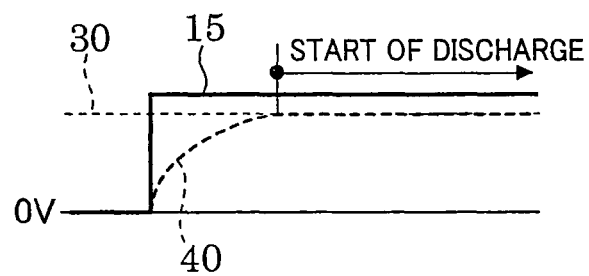

FIG. 15(a) shows a waveform of rising DC voltage applied between the nozzle 1 and the substrate 13 by the voltage applying section 9, in discharge of the continuous fluids. FIG. 15(b) shows a waveform of rising DC voltage of the comparative example.

In FIG. 15(a), the bias voltage (pre-charge voltage) 25 is applied immediately before the rise of the DC voltage 15. The bias voltage 25 has the same polarity as that of the DC voltage 15 and is lower than the minimum discharge-inducing voltage 30. On the other hand, in FIG. 15(b) of the comparative example, no bias voltage 25 is applied, and therefore the DC voltage 15 rises from 0V.

In FIG. 15(b), the meniscus surface potential 40 starts increasing from 0V after the rise of the DC voltage 15 because no bias voltage 25 is applied before the rise of the DC voltage. Therefore, it takes a while for the meniscus surface potential 40 to reach the minimum discharge-inducing voltage 30 by which the discharge is induced, and thus it is not possible to start the discharge directly in response to application of the DC voltage 15.

On the other hand, in FIG. 15(a), the bias voltage 25 is applied immediately before the rise of the DC voltage 15. Therefore, the meniscus surface potential 40 is previously increased to approximately the same potential as that of the bias voltage 25. Accordingly, the meniscus surface potential 40 reaches the minimum discharge-inducing voltage 30 shortly after the DC voltage 15, and thus the discharge is started approximately at the same time as that the DC voltage 15 is applied. With regard to the discharge-start response, the greater the bias voltage 25 immediately before the rise is within the range lower than the minimum discharge-inducing voltage 30 is, the better the discharge-start response is. In other words, the closer the bias voltage 25 is to the minimum discharge-inducing voltage 30, the better the discharge-start response is.

Figure 16:
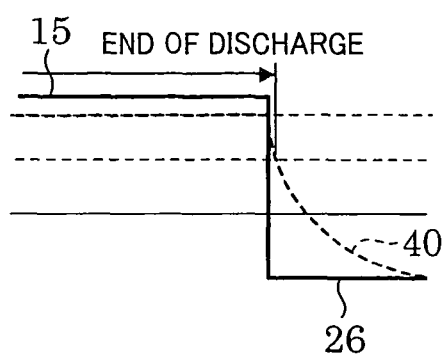
FIG. 16(a) is a waveform diagram showing a (i) waveform at an end of DC voltage application between a nozzle and a substrate, and (ii) transition in meniscus surface potential, for an electrostatic suction type fluid discharge device of FIG. 1.
FIG. 16(b) is a waveform diagram showing a (i) waveform at an end of DC voltage application, and (ii) transition in meniscus surface potential, for a comparative example.
Figure 16:
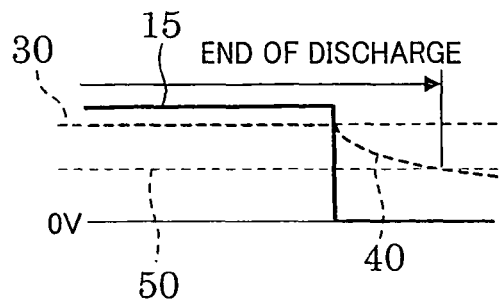

FIG. 16(a) shows a waveform of fall of the DC voltage applied between the nozzle 1 and the substrate 13 by the voltage applying section 9, in discharge of continuous fluids. FIG. 16(b) shows a waveform of fall of the DC voltage of the comparative example.

In FIG. 16(a), the bias voltage (attenuation facilitating voltage) 26 is applied immediately after the fall of the DC voltage 15. The bias voltage has the opposite polarity to that of the DC voltage 15. On the other hand, in FIG. 16(b) of the comparative example, no bias voltage 26 is applied, and the DC voltage 15 falls to 0V.

In FIG. 16(b), no bias voltage 26 is applied after the fall of the DC voltage, and the DC voltage 15 falls to 0V. Therefore, the meniscus surface potential 40 forms a gradual attenuation curve. Thus, it takes a while for the meniscus surface potential 40 to become lower than the minimum discharge-maintaining voltage 50 by which the discharge ends. Therefore, the end of discharge does not directly correspond to the end of application of the DC voltage.

On the other hand, in FIG. 16(a), the bias voltage 26 having the opposite polarity is applied immediately after the fall of the DC voltage 15. Therefore, compared to the case of FIG. 16(b), there is a greater potential difference between the direct current 15 and the meniscus surface potential 40 after the fall of the DC voltage 15, and the meniscus surface potential 40 forms a sharp attenuation curve after the fall of the DC voltage 15. Thus, the meniscus surface potential 40 soon becomes lower than the minimum discharge-maintaining voltage 50, and the discharge ends accordingly. This makes it possible to end the discharge approximately in response to end of application of the direct current bias. The discharge-end response improves when the bias voltage 26 immediately after the fall has the opposite polarity to that of the DC voltage 15, and the improvement becomes more significant as the absolute value of the bias voltage 26 becomes greater. However, if the absolute value exceeds that of the minimum discharge-inducing voltage 30, the meniscus surface potential 40 may become greater on the opposite polarity side than the minimum discharge-inducing voltage 30, depending upon the application time of the bias voltage 26. This may induce discharge of fluid, as the fluid is charged to the opposite polarity. Therefore, it is preferable that the absolute value be set smaller than that of the minimum discharge-inducing voltage 30.

The above structure achieves improvement of the discharge response, that is, improvement for both of the discharge-start response and the discharge-end response at the rise and the fall of the DC voltage 15. Further, the precision of the discharge-start position and the discharge-end position can be improved when line-drawing is induced by the DC voltage 15.

Although the counter electrode 14 is used in the present embodiment, as described above the counter electrode 14 is not an indispensable component in the electrostatic suction type fluid discharge structure according to the present invention. Therefore, the pulse voltage shown in FIG. 1(a) may be generated only by the voltage applied to the electrode 2 in the nozzle 1. As well as this, the counter electrode 14 may be grounded, and the voltage applying section 9 may control only the voltage applied to the electrode 2 in the nozzle 1 in generating the pulse voltage shown in FIG. 1(a).

Further, in the present embodiment, the rectangular pulses shown in FIGS. 1, 10, 12, and 14-16 are presented as exemplary waveforms of the pulse voltage applied between the tip of the nozzle 1 and the substrate 13. However, these rectangular waves may instead be a waveform with a low slew rate, such as a sine wave.

The present embodiment has been described as a most preferred structure for achieving improvement for both of the discharge-start response and the discharge-end response. However, as it is apparent from the description with reference to FIGS. 10 to 13, the discharge-start response and the discharge-end response are independent from each other.

As described above, an electrostatic suction type fluid discharge device according to the present invention, which device discharges by electrostatic suction a fluid, which is electrically charged by voltage application, from a fluid discharge hole of a nozzle onto a substrate opposite to the nozzle, is characterized in that the fluid discharge hole, provided in the nozzle, has a diameter ranging from 0.01 μm to 25 μm, the electrostatic suction type fluid discharge device comprises voltage applying means for applying a pulse voltage between the nozzle and the substrate, an upper limit voltage of the pulse voltage being equal to or greater than a minimum discharge-inducing voltage, that is a voltage required to start discharge of the fluid, and a pre-charge voltage is provided immediately before a rise of the pulse voltage, the pre-charge voltage having a same polarity as that of the upper limit voltage, an absolute value of the pre-charge voltage being set smaller than the minimum discharge-inducing voltage.

With the above structure, the fluid discharge hole provided in the nozzle has a diameter ranging from 0.01 μm to 25 μm, so that, in accordance with the discharge model using a local electric field, a local electric field is generated. Consequently, this miniaturization of nozzle allows reduction in drive voltage for discharge. Such reduction of the drive voltage is greatly beneficial to realize miniaturization of the device while ensuring high density. It may be obvious but reduction of the drive voltage allows the use of a low-voltage driver that offers advantageous cost performance.

Moreover, in the discharge model using the local electric field, the electric field strength required for discharge depends upon the converged local electric field strength, and therefore the counter electrode can be omitted. In other words, it becomes possible to carry out printing on an insulating substrate without using a counter electrode, allowing more flexible device arrangement. Further, it also becomes possible to print on a thick insulator.

However, the miniaturization of the nozzle described above has such a problem that, when the discharge amount becomes significantly small, the discharge response suddenly slows down exponentially. This makes the high-frequency drive difficult. By increasing the upper-limit voltage of the pulse voltage applied between the nozzle and the substrate, the discharge response increases to a certain degree, allowing the driving to be carried out at relatively high-frequencies. However, this structure requires a high-voltage driver for applying a high-voltage to the driving electrode. Because of this, the cost reduction due to the use of low-voltage driver, which was the main advantage of the miniaturization of the nozzle, cannot be attained.

When looking at the discharge response more specifically, it can be divided into the discharge-start response at the rise of the pulse voltage and the discharge-end response at the fall thereof. Therefore, low discharge response implies incapability of control of discharge amount with high accuracy, precisely dependent upon the application time of the upper limit voltage.

On the other hand, in the above structure in which the voltage applying means applies a pulse voltage between the nozzle and the substrate, and an upper limit voltage of the pulse voltage is set equal to or greater than a minimum discharge-inducing voltage, that is a voltage required to start discharge of the fluid; a pre-charge voltage is applied immediately before a rise of the pulse voltage, the pre-charge voltage having a same polarity as that of the upper limit voltage, an absolute value of the pre-charge voltage being set smaller than the minimum discharge-inducing voltage. Therefore, the meniscus surface potential is precharged to a certain degree in advance before the rise of pulse voltage.

Therefore, after the rise of the pulse voltage, the meniscus surface potential soon reaches the minimum discharge-inducing voltage, that is a voltage required to induce discharge, and the discharge starts. Therefore, discharge-start response can be improved. Consequently, the discharge limit frequency can be improved, making the high-frequency driving possible.

In order to achieve the above object, an electrostatic suction type fluid discharge device according to the present invention, which device discharges by electrostatic suction a fluid, which is electrically charged by voltage application, from a fluid discharge hole of a nozzle onto a substrate opposite to the nozzle, is characterized in that the fluid discharge hole, provided in the nozzle, has a diameter ranging from 0.01 µm to 25 µm, the electrostatic suction type fluid discharge device comprises voltage applying means for applying a pulse voltage between the nozzle and the substrate, an upper limit voltage of the pulse voltage being equal to or greater than a minimum discharge-inducing voltage, that is a voltage required to start discharge of the fluid, and an attenuation facilitating voltage is provided immediately after a fall of the pulse voltage, the attenuation facilitating voltage having an opposite polarity to that of the upper limit voltage.

In the above structure, the fluid discharge hole provided in the nozzle has a micro diameter ranging from 0.01 µm to 25 µm, so that the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

Further, in the above structure in which the voltage applying means applies a pulse voltage between the nozzle and the substrate, and an upper limit voltage of the pulse voltage is set equal to or greater than a minimum discharge-inducing voltage, that is a voltage required to start discharge of the fluid, and an attenuation facilitating voltage is provided immediately after a fall of the pulse voltage, the attenuation facilitating voltage having an opposite polarity to that of the upper limit voltage. Therefore, the meniscus surface potential is rapidly attenuated after the fall of the pulse voltage.

Therefore, after the fall of the pulse voltage, the meniscus surface potential soon becomes lower than the minimum discharge-maintaining voltage, that is a voltage required to maintain discharge, and the discharge stops. Therefore, discharge-end response can be improved. Consequently, the discharge limit frequency can be improved, making the high-frequency driving possible.

As described above, another electrostatic suction type fluid discharge device according to the present invention discharges by electrostatic suction a fluid, which is electrically charged by voltage application, from a fluid discharge hole of a nozzle onto a substrate opposite to the nozzle, wherein the fluid discharge hole, provided in the nozzle, has a diameter ranging from 0.01 µm to 25 µm, the electrostatic suction type fluid discharge device comprises voltage applying means for applying a pulse voltage between the nozzle and the substrate, an upper limit voltage of the pulse voltage being equal to or greater than a minimum discharge-inducing voltage, that is a voltage required to start discharge of the fluid, a pre-charge voltage is provided immediately before a rise of the pulse voltage, the pre-charge voltage having a same polarity as that of the upper limit voltage, an absolute value of the pre-charge voltage being set smaller than the minimum discharge-inducing voltage, and an attenuation facilitating voltage is provided immediately after a fall of the pulse voltage, the pre-charge voltage having an opposite polarity to that of the upper limit voltage.

In the above structure, the fluid discharge hole provided in the nozzle has a micro diameter ranging from 0.01 µm to 25 µm, and therefore the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

Further, in the above structure in which the voltage applying means applies a pulse voltage between the nozzle and the substrate, and an upper limit voltage of the pulse voltage is set equal to or greater than a minimum discharge-inducing voltage, that is a voltage required to start discharge of the fluid; a pre-charge voltage is provided immediately before a rise of the pulse voltage, the pre-charge voltage having a same polarity as that of the upper limit voltage, an absolute value of the pre-charge voltage being set smaller than the minimum discharge-inducing voltage, and an attenuation facilitating voltage is provided immediately after the fall of the pulse voltage, the pre-charge voltage having an opposite polarity to that of the upper limit voltage.

Therefore, as described above, the discharge-start response and the discharge-end response can be simultaneously improved. Consequently, the discharge limit frequency is more effectively improved, making further high-frequency driving possible. Moreover, because the discharge can be controlled in such a way as to be dependent on the application time of the upper limit voltage, it also becomes possible to so control the amount of discharge as to be dependent on the time.

As described above, another electrostatic suction type fluid discharge device according to the present invention discharges by electrostatic suction a fluid, which is electrically charged by voltage application, from a fluid discharge hole of a nozzle onto a substrate opposite to the nozzle, wherein the fluid discharge hole, provided in the nozzle, has a diameter ranging from 0.01 μm to 25 μm, the electrostatic suction type fluid discharge device comprises voltage applying means for applying a pulse voltage between the nozzle and the substrate; an upper limit voltage of the pulse voltage being equal to or greater than a minimum discharge-inducing voltage, that is a voltage required to start discharge of the fluid; a pre-charge voltage is provided immediately before a rise of the pulse voltage, the pre-charge voltage having a same polarity as that of the upper limit voltage, an absolute value of the pre-charge voltage being set smaller than the minimum discharge-inducing voltage; and an attenuation facilitating voltage is provided immediately after a fall of the pulse voltage, the attenuation facilitating voltage having a same polarity as that of the upper limit voltage, an absolute value of the pre-charge voltage being set smaller than the pre-charge voltage.

Because the attenuation facilitating voltage in this case is a voltage having the same polarity and a smaller absolute value than that of the minimum discharge-maintaining voltage, this case, in comparison with the case where the attenuation facilitating voltage has the opposite polarity, is less effective for improving the discharge-end response, but enables the droplets discharge with minimum no-discharge period, and therefore is effective for formation of contiguous dots. Further, it becomes possible to adopt a low-voltage driver because the potential difference between the upper limit voltage and the lower limit voltage of the pulse voltage becomes small.

As described above, another electrostatic suction type fluid discharge device according to the present invention discharges by electrostatic suction a fluid, which is electrically charged by voltage application, from a fluid discharge hole of a nozzle onto a substrate opposite to the nozzle, wherein the fluid discharge hole, provided in the nozzle, has a diameter ranging from 0.01 μm to 25 μm; the electrostatic suction type fluid discharge device comprises voltage applying means for applying a DC voltage between the nozzle and the substrate, the DC voltage being equal to or greater than a minimum discharge-inducing voltage, that is a voltage required to start discharge of the fluid; and a pre-charge voltage is provided immediately before starting application of the DC voltage, the pre-charge voltage having a same polarity as that of the DC voltage, an absolute value of the DC voltage being set smaller than the minimum discharge-inducing voltage.

In the above structure, the fluid discharge hole provided in the nozzle has a miniaturized diameter ranging from 0.01 μm to 25 μm, and therefore the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

Further, in the above structure in which the voltage applying means applies a DC voltage between the nozzle and the substrate, and the DC voltage is set equal to or greater than a minimum discharge-inducing voltage, that is a voltage required to start discharge of the fluid; a pre-charge voltage is provided immediately before starting application of the DC voltage, the pre-charge voltage having a same polarity as that of the DC voltage, an absolute value of the DC voltage being set smaller than the minimum discharge-inducing voltage. Therefore, the discharge-start response at the beginning of voltage application allows the start-position of discharge to be so controlled precisely as to be dependent on the end-position of application of DC voltage.

In other words, the above-described problem regarding the response at the rise and the fall of the voltage occurs not only in the pulse voltage but also in the application of the DC voltage, which is applied when the line-drawing is performed on the substrate. This has been disabling precise adjustment of the start-position due to the discharge response at the beginning of discharge after the application of DC voltage, and therefore the stat-position has not directly correspond to application of the DC voltage. However, the above structure achieves precise adjustment of discharge-start position and makes it directly depend on application of the DC voltage.

As described above, another electrostatic suction type fluid discharge device according to the present invention discharges by electrostatic suction a fluid, which is electrically charged by voltage application, from a fluid discharge hole of a nozzle onto a substrate opposite to the nozzle, wherein the fluid discharge hole, provided in the nozzle, has a diameter ranging from 0.01 μm to 25 μm; the electrostatic suction type fluid discharge device comprises voltage applying means for applying a DC voltage between the nozzle and the substrate, the DC voltage being equal to or greater than a minimum discharge-inducing voltage, that is a voltage required to start discharge of the fluid; and an attenuation facilitating voltage is provided immediately after an end of application of the DC voltage, the attenuation facilitating voltage having an opposite polarity to that of the DC voltage.

In the above structure, the fluid discharge hole provided in the nozzle has a miniaturized diameter ranging from 0.01 μm to 25 μm, and therefore the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

Further, in the above structure in which the voltage applying means applies a DC voltage between the nozzle and the substrate, and the DC voltage is set equal to or greater than a minimum discharge-inducing voltage, that is a voltage required to start discharge of the fluid; a pre-charge voltage is provided immediately before starting application of the DC voltage, the pre-charge voltage having a same polarity as that of the DC voltage, an absolute value of the DC voltage being set smaller than the minimum discharge-inducing voltage. Therefore, the discharge-start response at the beginning of voltage application allows the start-position of discharge to be so controlled precisely as to be dependent on the end-position of application of DC voltage.

As in the control for the application-start-position, when the line-drawing is performed on the substrate, the problem of discharge-end response at the end of the voltage application has been disabling precise adjustment of the end-position, and therefore the end-position has not directly correspond to end of application of the DC voltage. However, the above structure achieves precise adjustment of discharge-end-position and makes it directly depend on the end of application of the DC voltage.

Further, it is preferable in the electrostatic suction type fluid discharge device according to the present invention that an absolute value of the attenuation facilitating voltage is set smaller than the minimum discharge-inducing voltage.

This is due to the following reason. If the attenuation facilitating voltage is greater than the absolute value of the minimum discharge-inducing voltage, the meniscus surface potential becomes greater on the opposite polarity side than the minimum discharge-inducing voltage, although it depends upon the application time of the attenuation facilitating voltage such as the period of the pulse voltage. This may induce discharge of fluid, as the fluid is charged to the opposite polarity. Therefore, it is preferable that the absolute value be set smaller than that of the minimum discharge-inducing voltage so as to prevent the meniscus surface potential from turning into the opposite polarity. As described above, an electrostatic suction type fluid discharge method according to the present invention discharges by electrostatic suction a fluid, which is electrically charged by voltage application, from a fluid discharge hole of a nozzle onto a substrate opposite to the nozzle, wherein the fluid discharge hole, provided in the nozzle, has a diameter ranging from 1 μm to 5 μm. The method comprises the step of applying a voltage between the nozzle and the substrate, the voltage being equal to or greater than a minimum discharge-inducing voltage, that is a voltage required to start discharge of the fluid, wherein a pre-charge voltage is provided immediately before a rise of the voltage, the pre-charge voltage having a same polarity as that of the voltage, an absolute value of the voltage being set smaller than the minimum discharge-inducing voltage. As described above, the fluid discharge hole provided in the nozzle has a micro diameter ranging from 0.01 μm to 25 μm, and therefore the drive voltage can be reduced. This is greatly beneficial to miniaturization of the device while ensuring high density. It allows the use of a low-voltage driver that offers advantageous cost performance, and also realizes a structure not using a counter electrode In addition, a pre-charge voltage is applied immediately before the rise of the voltage, which pre-charge voltage has the opposite polarity to the applied voltage with a smaller absolute value than that of the minimum discharge-inducing voltage, and therefore the meniscus surface potential can be previously charged, obtaining more desirable discharge-start response.

Further, as described above, another electrostatic suction type fluid discharge method according to the present invention discharges by electrostatic suction a fluid, which is electrically charged by voltage application, from a fluid discharge hole of a nozzle onto a substrate opposite to the nozzle, wherein the fluid discharge hole, provided in the nozzle, has a diameter ranging from 0.01 μm to 25 μm. The method comprises the step of applying a voltage between the nozzle and the substrate, the voltage being equal to or greater than a minimum discharge-inducing voltage, that is a voltage required to start discharge of the fluid, wherein an attenuation facilitating voltage is provided immediately after a fall of the voltage, the attenuation facilitating voltage having an opposite polarity to that of the voltage.

As described above, the fluid discharge hole provided in the nozzle has a micro diameter ranging from 0.01 μm to 25 μm, and therefore the drive voltage can be reduced. This is greatly beneficial to miniaturization of the device while ensuring high density. It allows the use of a low-voltage driver that offers advantageous cost performance, and also realizes a structure not using a counter electrode Further, since an attenuation facilitating voltage having the opposite polarity to that of the applied voltage is applied immediately after the fall of the voltage, the attenuation of the meniscus surface potential is facilitated and the separation of the fluids is ensured. Therefore, more desirable discharge-end response is obtained.

[Second Embodiment]

As described above, in an electrostatic suction type fluid discharge method by the fluid discharge model using a local electric field, it is possible to simultaneously reduce a diameter of nozzle and a drive voltage.

However, in the electrostatic suction type fluid discharge method by the fluid discharge model using a local electric field, the discharge response is determined basically by an electric resistance R and a time constant RC. The electric resistance R is an electric resistance of the fluid between the electrode in the nozzle and the tip of the nozzle, and the time constant RC is a product of an electrostatic capacitance C between the substrate and the meniscus on the tip of nozzle. A parameter of the electric resistance R and the electrostatic capacitance C includes a nozzle diameter d. The discharge response is changed according to the nozzle diameter d. As described above, the time constant RC extremely increases as the nozzle diameter decreases. This decreases discharge response, and also decreases the frequency limit to cause discharge.

More specifically, in an electrostatic suction type fluid discharge by the fluid discharge model using a local electric field, the discharge response is basically changed by the electric resistance of the fluid (discharge material) between the electrode in the nozzle and the tip of nozzle. Therefore, the discharge response can be greatly varied depending upon the electric conductivity of the fluid. Because of this, if the relative speed between the nozzle and the substrate is not adequate, or if the voltage applied between the nozzle and the substrate is not adequate, the line drawing may become unstable.

Figure 17:
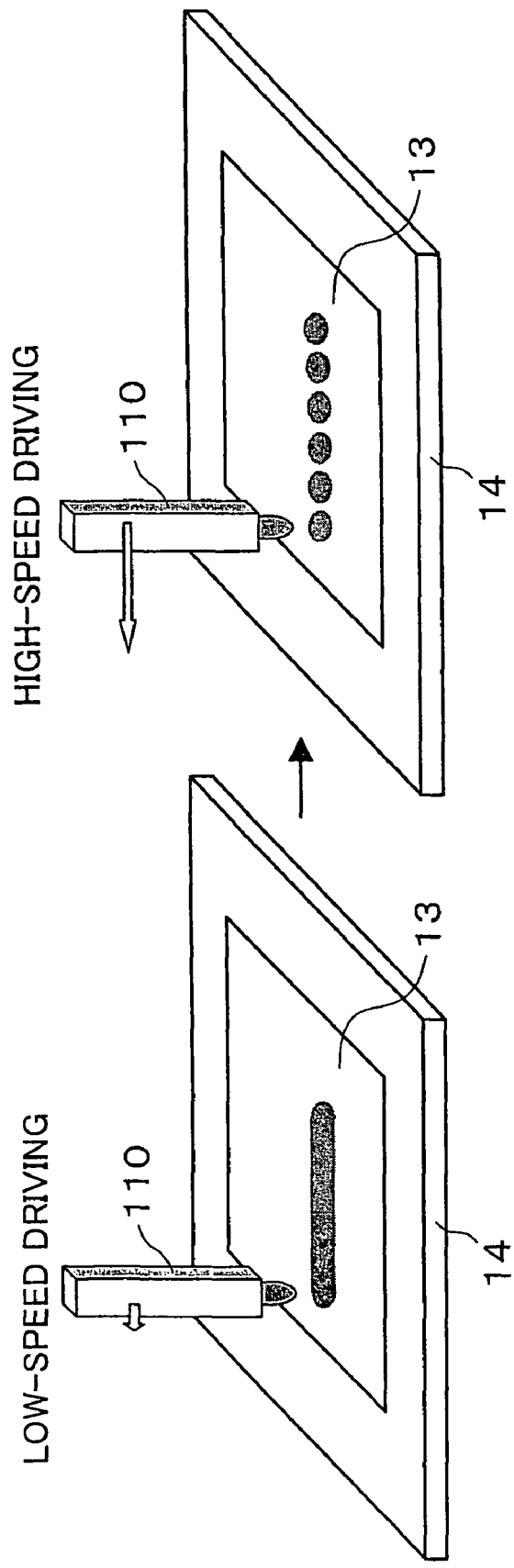
FIG. 17 is an explanatory view showing a difference in drawing pattern between low-speed driving and high-speed driving.

For example, a fluid with a low conductivity has poor discharge response, and therefore, as illustrated in FIG. 17, if the relative movement of the discharge head 110 and the substrate stage 16 on which the substrate 13 is placed is performed at a high speed, the resulting picture will be an intermittent line even with application of bias voltage, in contrast to the low-speed driving by which the line becomes smooth and continuous.

Such problem results from the micro diameter of the tip of nozzle in the electrostatic suction type fluid discharge by the fluid discharge model using a local electric field. The problem is caused by (i) deterioration in the discharge response due to increase of the electric resistance of the fluid (discharge material) between the electrode in the nozzle and the tip of the nozzle, and (ii) super-miniaturization of the diameter/width of the dot/line that is formed on the substrate. This is a new problem to be solved that was not an issue in the conventional discharge amount.

An electrostatic suction type fluid discharge device according to the present embodiment controls the scanning speed or the applied voltage between the nozzle and the substrate, so as to ensure stable drawing of continuous line. The following concretely describes two exemplary structures of such electrostatic suction type fluid discharge device. For the purpose of convenience, the same reference numerals are given to the members having the same functions as that of the members used in the First Embodiment, and description thereof is omitted.

(Second Embodiment 1)

Figure 18:
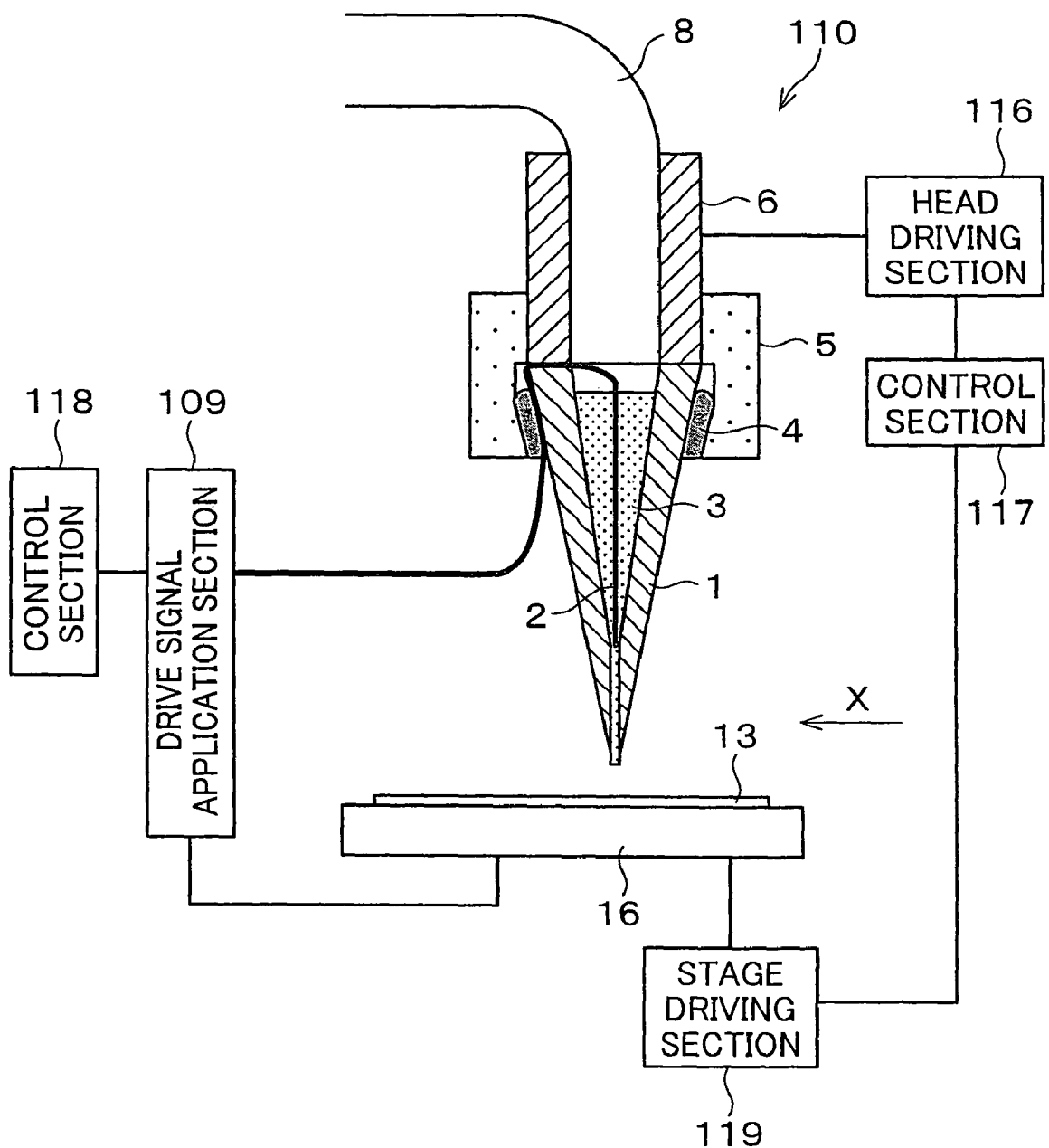
FIG. 18 is an explanatory view including a cross section of lateral side of major part of an electrostatic suction type fluid discharge device according to another embodiment of the present invention.

FIG. 18 is a view illustrating a cross section of lateral side of major part of an electrostatic suction type fluid discharge device according to the present embodiment.

In the electrostatic suction type fluid discharge device, the substrate stage 16 is disposed to be opposite to the nozzle hole of the nozzle 1, with a certain interval therebetween. This layout allows the discharge material discharged from the nozzle hole of the nozzle 1 to be stably landed on the surface of the substrate 13. The substrate stage 16 also functions as the counter electrode 14. The substrate 13 is placed on the substrate stage 16.

In the present embodiment, the substrate stage 16 is given a function as the counter substrate. However, as described above, in the present invention, due to the conversion effect of the electric field at the tip of the nozzle, and the action of the image force exerted on the counter substrate, it is not necessary to dispose a counter electrode at a rear side of the substrate. Moreover, unlike the conventional structure, the present invention does not require a conductive substrate. Therefore, an insulating glass substrate, a plastic substrate such as polyimide, a ceramics substrate, a semiconductor substrate or other types of substrate can be used.

In place of the voltage applying section 9 (see FIG. 9), a drive signal applying section 109 is connected to the electrode 2 and the substrate stage 16. The drive signal applying section 109, under the control by the controller 118, controls at least one of the signal voltage applied to the electrode 2 and that applied to the substrate stage 16. The drive signal applying section 109 applies a pulse voltage or a DC bias voltage between the tip of the nozzle 1 and the substrate 13. The drive signal applying section 109 applies the pulse voltage for one-shot flow discharge, or a DC bias voltage for a continuous discharge of fluids. A positive or negative voltage may be arbitrarily used for this voltage applied between the tip of the nozzle 1 and the substrate 13. Further, the substrate stage 16 may be grounded.

Figure 19:
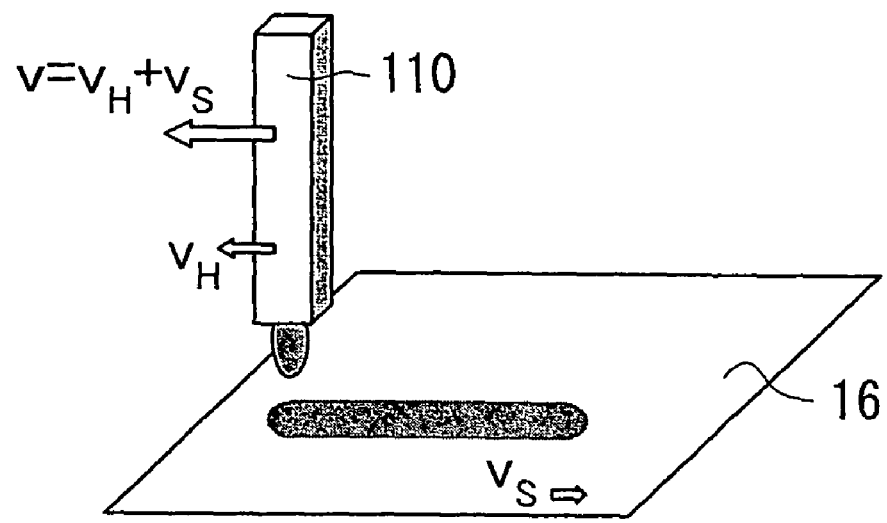
FIG. 19 is an explanatory view showing a relative speed between a discharge head and a substrate stage.

The electrostatic suction type fluid discharge device according to the present embodiment further includes a head drive section 116, a controller 117, and a stage drive section 119. The head drive section 116 at least drives the discharge head 110 in the X-direction. The stage drive 119 at least drives the substrate stage 16 in the opposite direction to the X-direction. It may be arranged so that only one of the substrate stage 16 and the discharge head 110 is driven. The head drive section 116 and the stage drive section 119 are controlled by the controller 117. As shown in FIG. 19, the scanning speed v designates a relative speed, that is a sum of (i) a speed $v_H$ of the discharge head 110 in the X-direction and (ii) a speed $v_S$ of the substrate stage 16 in the opposite direction to the X-direction.

In this structure, the nozzle 1 and the substrate 13 are relatively moved by the controllers 117 and 118, the stage drive section 119, the substrate stage 16, the discharge head 110, the head drive section 116, and the drive signal applying section 109, while a voltage is applied between the nozzle 1 and the substrate 13. In this way, these components function as line-drawing means for drawing a line.

Figure 20:
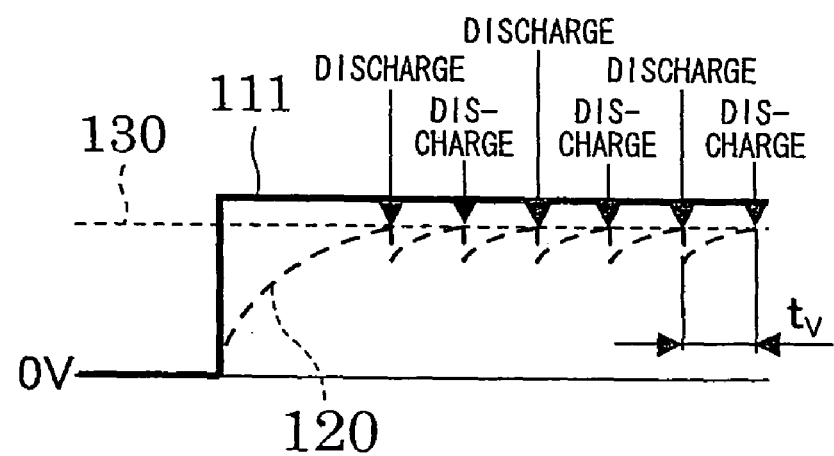
FIG. 20 is an explanatory view showing a relationship between (i) a waveform of direct signal voltage applied between a nozzle and a substrate and (ii) a period of intermittent discharge.

FIG. 20 shows a waveform of a drive signal applied between a nozzle 1 and a substrate 13. The following describes discharge characteristics of the electrostatic suction type fluid discharge, with reference to FIG. 20. Basically, when the drive signal application section 109 applies a drive signal to the electrode 2 in the nozzle 1 of the discharge head 110 and to the substrate stage 16, a signal voltage 111, which is determined by a potential difference therebetween, is applied between the nozzle 1 and the substrate 13.

The signal voltage 111 is equal to or greater than the minimum discharge-inducing voltage (indicated by dot lines in the figures). Because the diameter/width of the dot/line formed by fluid landed on the substrate can be minimized by performing the discharge at the minimum discharge-inducing voltage 130, the signal voltage 111 is set around the minimum discharge-inducing voltage for each nozzle. With this arrangement, stable drawing of super-micro dot or a super-micro line is ensured.

The minimum discharge-inducing voltage 130 designates a minimum voltage condition to cause discharge in a case where fluid is discharged by a direct current bias. The minimum discharge-inducing voltage 130 depends upon the nozzle diameter. When the surface potential of meniscus formed by fluid of the tip of the nozzle 1 (nozzle hole) reaches the minimum discharge-inducing voltage 130, discharge starts.

When the signal voltage 111 is applied, electric charge starts flowing from the electrode 2, and the electric charge starts to be accumulated on the meniscus formed by the fluid of the tip of the nozzle 1 (nozzle hole). A meniscus surface potential 120 (indicated by a broken line in the figures) that is a potential curve of the meniscus surface draws a saturated curve, and its saturation speed depends upon (i) an applied signal voltage 111, (ii) an electric conductivity of fluid that is the discharge material 3, and (iii) a shape of the fluid path in the nozzle 1.

When the meniscus surface potential 120 reaches the minimum discharge-inducing voltage 130, a very few amount of fluid is discharged in response to the generated electric field force. After the fluid is discharged, the meniscus surface potential 120 once becomes lower than the minimum discharge-inducing voltage 130, and therefore, the discharged fluid becomes a thread-like form, before the thread of fluid is finally cut at the tip of the nozzle 1. Then, as an electric charge is again supplied to the meniscus surface potential 120 from the electrode 2, the meniscus surface potential starts increasing again. When the meniscus surface potential 120 reaches the minimum discharge-inducing voltage 130 again, the discharge of fluid is re-started. This cycle is repeatedly carried out. In other words, after the discharge is started, decrease in potential due to fluid discharge and increase in potential due to accumulation of electric charge from the electrode alternately occur. As a result, the meniscus surface potential 120 exhibits pectination-like transition in the vicinity of the minimum discharge-maintaining voltage. With such a period, the discharge is repeated intermittently.

This period of intermittent discharge $t_v$ differs depending upon the signal voltage 111 and the electric conductivity of the fluid. For example in a case where the discharge is performed with the applied voltage of 300V using a discharge material made of silver nano paste whose electric conductivity is approximately $10^{-8}$ S/cm and a discharge head with the nozzle diameter of approximately 2 μm, the period of intermittent discharge $t_v$ is approximately 66 μsec.

Figure 21:
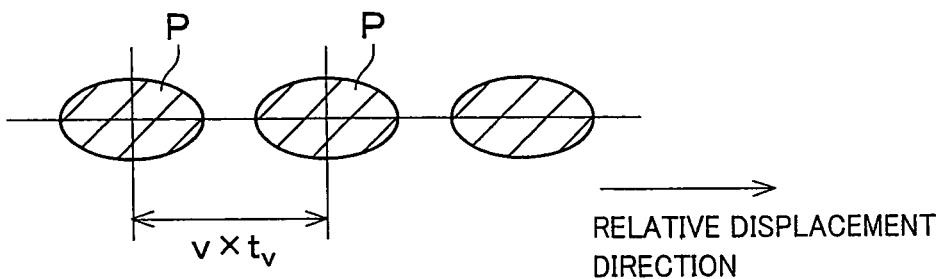
FIG. 21(a) is an explanatory view showing condition for drawing a line with a single discharge pattern.
FIG. 21(b) is an explanatory view showing condition for drawing a line with a single discharge pattern.
FIG. 21(c) is an explanatory view showing condition for drawing a line with a single discharge pattern.
Figure 21:
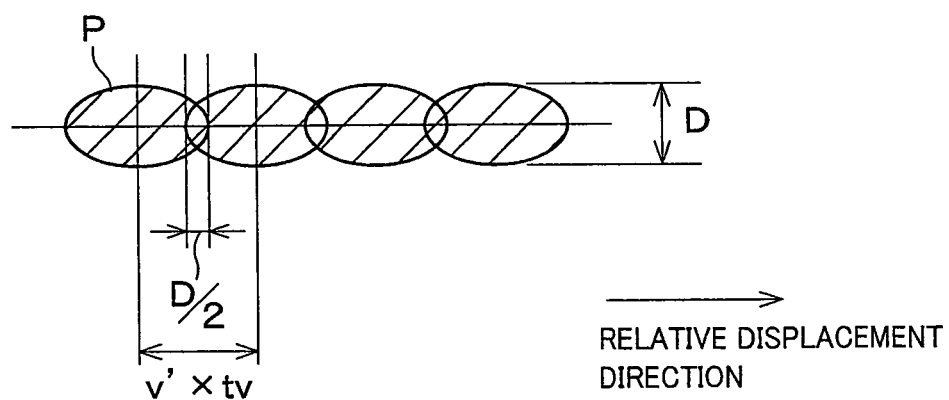
Figure 21:
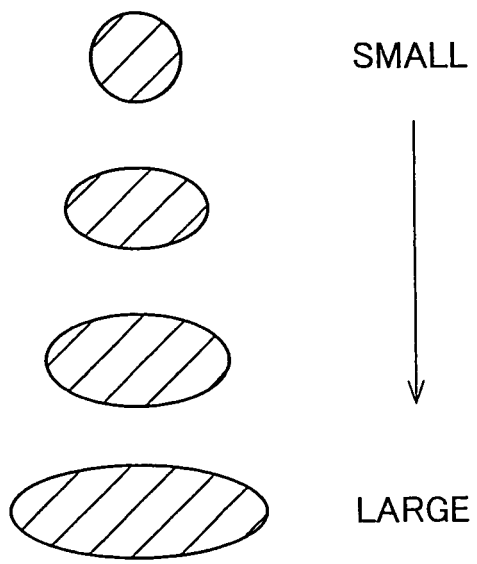

With regard to the line-drawing condition, as shown in FIG. 21(a), the discharge interval on the substrate is determined by a product $vxt_v$ of the scanning speed v and the period of intermittent discharge $t_v$ that depends on every discharge condition. If the discharge interval $vxt_v$ is equal to the pattern width of the discharge pattern of droplet (dot) P in the scanning direction, the single discharge patterns are formed on one direct line without overlaying each other. In order to ensure stable line-drawing, it is preferable that the single discharge patterns adjacent in the scanning direction are slightly overlaid. Therefore, as illustrated in FIG. 21(b), the scanning speed v is determined such that the adjacent droplet discharge patterns P-P are overlaid by a width that is equal to or wider than a half of the pattern width D in the sub-scanning direction. In this way, the patterns P-P are securely connected and therefore will not be separated, and stable line-drawing is ensured at all times.

Here, the following explains the reason why the overlaid width is set equal to or wider than a half of the pattern width D in the sub-scanning direction. As shown in FIG. 21(c), the single discharge pattern P depends upon the scanning speed v. The faster the scanning speed v is, the longer the signal discharge pattern P in the scanning direction is. However, the pattern width D in the sub-scanning direction does not depend upon the scanning speed v and therefore does not change as greatly as the pattern in the scanning direction, although it may change slightly.

Further, the scanning speed v becomes slow when the adjacent single discharge patterns P-P are unnecessarily overlaid. Therefore, the scanning speed v is controlled such that the adjacent single discharge patterns P-P are overlaid by the width at or less than 1.5 times the pattern width D in the sub-scanning direction. This prevents the unnecessary overlay and therefore the excessive decrease in scanning speed does not occur.

Assumed that the pattern width in the scanning direction is L and the pattern width in the sub-scanning direction, that is orthogonal to the scanning direction, is D, the following formula gives condition to ensure continuous and stable line-drawing at a high speed while maintaining a super-micro line width.

$$V < (L - 1.5D)/t_v \quad (19)$$

In the electrostatic suction type fluid discharge device according to the present embodiment, under the control by the controller 117, the head drive section 116 and the stage drive section 119 set the scanning speed v, which is the speed for driving the discharge head 110 and the substrate stage 16, so that the intermittently discharged adjacent discharge patterns P are partially overlaid. To ensure this operation, the scanning speed v is determined based upon the period of intermittent discharge $t_v$ which corresponds to the electric conductivity of the fluid and the signal voltage 111, and also in accordance with the period of the intermittent discharge. Specifically, the scanning speed v is set according to the above Formula (19).

Accordingly, within the range of condition of the set signal voltage 111, continuous and stable line-drawing can be performed at a high speed, thereby realizing high speed line drawing.

(Second Embodiment 2)

The following describes an electrostatic suction type fluid discharge device according to the present embodiment. However, the electrostatic suction type fluid discharge device according to the present invention basically has the same structure as that of the electrostatic suction type fluid discharge device according to the Second Embodiment (1) described above. Therefore, FIG. 18 is used again as a diagram illustrating the structure of the device. Further, only different part will be described below, and the same part as the Second Embodiment (1) is omitted.

In the electrostatic suction type fluid discharge device according to the Second Embodiment (1), the signal voltage 111 is set in the vicinity of the minimum discharge-inducing voltage 130 while satisfying the condition where the signal voltage 111 is equal to or greater than the minimum discharge-inducing voltage 130. With this arrangement, the Second Embodiment (1) achieves stable line-drawing by changing the scanning speed v. On the other hand, the electrostatic suction type fluid discharge device according to the Second Embodiment (2) achieves stable line-drawing by varying the signal voltage 111.

FIGS. 22(a) and 22(b) show a relationship between a waveform of signal voltage and a period of intermittent discharge. The following describes discharge characteristics of the electrostatic suction type fluid discharge, with reference to these figures. As described in the Second Embodiment (1), discharge starts when the meniscus surface potential 120, that starts increasing after the signal voltage 111 is applied, reaches the minimum discharge-inducing voltage 130. Once fluid is discharged, a state of intermittent discharge is maintained by repeating a decrease due to electric discharge caused by the discharge of fluid and an increase due to electric charges supplied from the electrode 2.

The speed of increase in meniscus surface potential after the discharge greatly differs depending upon the signal voltage 111. For example, as illustrated in FIG. 22(a), in a case where the applied signal voltage 111 is a low voltage that is substantially equal to the minimum discharge-inducing voltage 130, the meniscus surface potential repeats increasing and decreasing in a nearly saturated state. Therefore, the increasing speed of the meniscus surface potential 120 is extremely slow. Consequently, the discharge that starts when the meniscus surface potential 120 reaches the minimum discharge-inducing voltage 130 is performed at long intervals.

On the other hand, as illustrated in FIG. 22(b), in a case where the signal voltage 111 is sufficiently greater than the minimum discharge-inducing voltage 130, the meniscus surface potential 120 repeats increasing and decreasing in distantly saturated state. Consequently, the discharge that starts when the meniscus surface potential 120 reaches the minimum discharge-inducing voltage 130 is performed at short intervals.

Accordingly, even if the same discharge material 3 and the discharge head 110 having the same nozzle diameter are used, the intermittent discharge frequency can be changed by changing the signal voltage 111.

FIG. 23 shows a relationship between the signal voltage 111 and the intermittent discharge frequency in a case where the discharge is performed using (i) a silver nano paste manufactured by the HARIMA CHEMICALS, INC as the discharge material 3, and (ii) the discharge head 110 having the nozzle diameter of approximately 1 μm. FIG. 23 shows that the greater the signal voltage 111 is, the greater the intermittent discharge frequency is. Moreover, the greater the signal voltage 111 is, the shorter the time interval of discharge. This indicates that a greater signal voltage 111 is more effective to the line-drawing.

Figure 24:
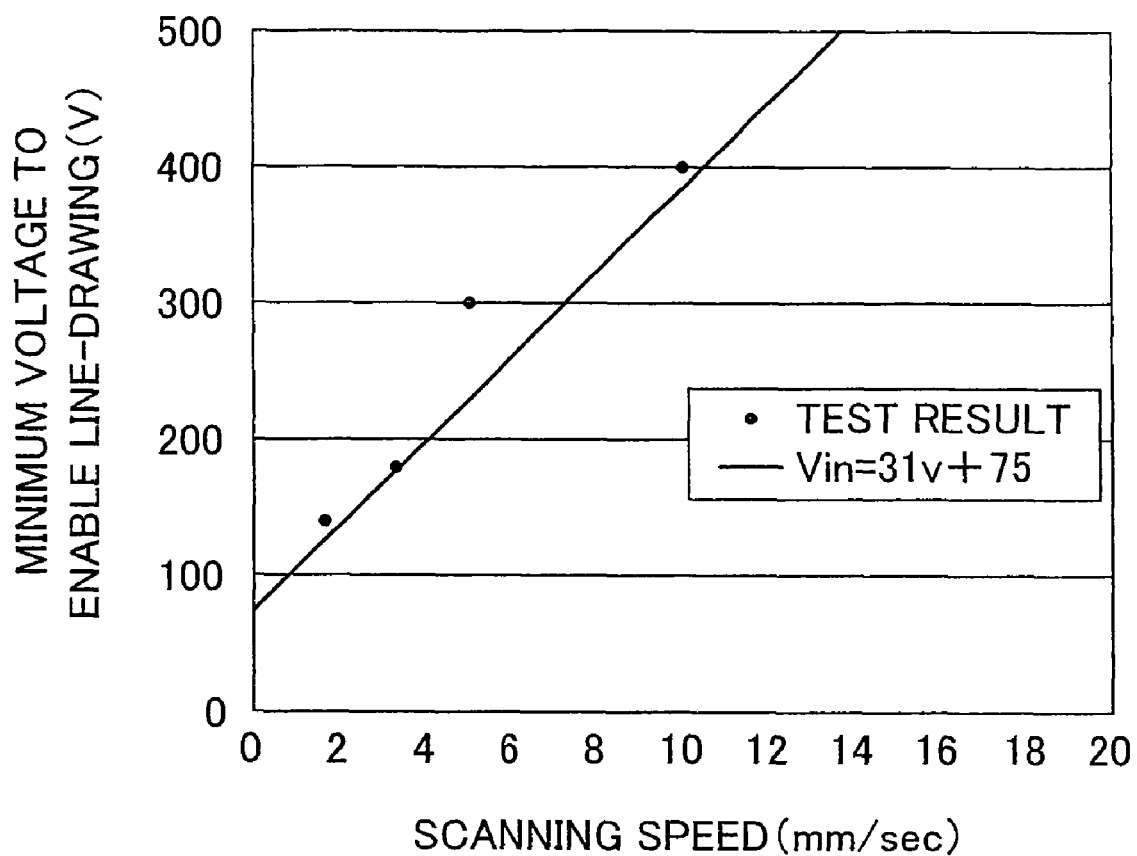
FIG. 24 is a graph showing a relationship between a scanning speed and a minimum voltage to enable line-drawing.

With the silver nano paste and the discharge head 110 with the nozzle diameter of approximately 1 μm, the relationship between the scanning speed v and the minimum voltage for causing line-drawing was examined. As shown in FIG. 24, it was showed that each of the scanning speed requires different minimum voltage for line-drawing, and it was also confirmed that the faster the scanning speed is, the greater the voltage is.

Thus, in the electrostatic suction type fluid discharge device according to the present embodiment, the drive signal applying section 109 sets, under the control by the controller 118, the signal voltage 111 in such a way that the signal voltage 111 is set equal to or greater than the minimum voltage for line-drawing, at which voltage the interval between single discharge pattern of the intermittent discharge becomes zero, according to the specified scanning speed v.

Specifically, as with the Second Embodiment (1), as shown in FIG. 21(b), the signal voltage 111 is set such that the width of overlaying single discharge patterns P-P, that are adjacent to each other in the scanning direction, is set within a range of not less than 0.5 times but not more than 1.5 times the pattern width D in the sub-scanning direction.

In this way, continuous and stable line-drawing is securely performed within the specified condition of scanning speed v, and therefore a high speed line-drawing can be performed.

Further, according to FIG. 24, the following formula for determining the scanning speed v (mm/sec) and the minimum signal voltage for causing line-drawing $V_{in}$ (V) is given to easily realize high speed line-drawing when using the discharge material 3 having the electric conductivity of $10^{-7}$-$10^{-9}$ S/cm, such as the silver nano paste.

$$\rightarrow V_{in} > 31_v + 75 \quad (20)$$

For example, in order to perform stable line-drawing during a high speed scanning at a speed equal to or faster than 5 mm/sec, it is necessary to apply a voltage of 300V or greater.

In view of the object of ensuring stable line-drawing, the present embodiment describes separate structures for optimizing the scanning speed v and the signal voltage 111, respectively. However, the line width of the line-drawing tends to be wider and wider as the signal voltage 111 is continuously increased from the minimum discharge-inducing voltage 130. In this view, a necessary line width and a necessary scanning speed v can be obtained by optimizing the scanning speed v and the signal voltage 111 at the same time.

As described above, an electrostatic suction type fluid discharge device according to the present invention discharges by electrostatic suction a fluid, which is electrically charged by voltage application, from a fluid discharge hole of a nozzle of a discharge head onto a substrate opposite to the nozzle, wherein the fluid discharge hole, provided in the nozzle, has a diameter ranging from 0.01 µm to 25 µm; and the electrostatic suction type fluid discharge device comprises line-drawing means for applying a voltage between the nozzle and the substrate while relatively moving the nozzle and the substrate so as to carry out line-drawing, the voltage being equal to or greater than a minimum discharge-inducing voltage, that is a voltage required to start discharge of the fluid, the line-drawing means controlling a speed of the relative movement so that adjacent ones of discharge pattern are partly overlaid with each other, in accordance with a period of intermittent discharge which is performed at a frequency depending on the voltage and an electric conductivity of the fluid.

With the above structure in which the fluid discharge hole provided in the nozzle has a diameter ranging from 0.01 µm to 25 µm, a local electric field is generated in accordance with the discharge model using a local electric field. On this account, miniaturization of nozzle achieves a decrease in drive voltage for discharging. Such reduction of the drive voltage is greatly beneficial to miniaturization of the device and an increase in density. It may be obvious but, this reduction of the drive voltage allows the use of a low-voltage driver that offers advantageous cost performance.

Moreover, in the discharge model using the local electric field, the electric field strength required for discharge depends upon the converged local electric field strength, and therefore the counter electrode can be omitted. In other words, it becomes possible to carry out printing on an insulating substrate without using a counter electrode, allowing more flexible device arrangement. Further, it also becomes possible to print on a thick insulator.

However, in the above structure, the discharge response basically depends upon the electric resistance of fluid (discharge material) between the electrode in the nozzle and the tip of nozzle, and therefore, the discharge response may be extremely changed by a change in electric conductivity of the fluid. In this case, stable line-drawing may not be performed depending upon the relative speed between the nozzle and the substrate or the voltage applied between the nozzle and the substrate. This problem occurs as a consequence of miniaturization of the diameter of the tip of the nozzle, which makes the diameter/width of the dot/line formed on the substrate to be super miniaturized. In addition to this, an increase in electric resistance as a result of miniaturization of nozzle which results in deterioration in discharge response also contributes to the problem. This is a new problem that would not have been an issue in the conventional discharge amount.

On the other hand, in the above structure, the line-drawing means applies a voltage between the nozzle and the substrate while relatively moving the nozzle and the substrate so as to carry out line-drawing, which voltage is equal to or greater than the minimum discharge-inducing voltage, that is a voltage required to start discharge of the fluid. Further, the line-drawing means controls a speed of the relative movement so that adjacent ones of discharge pattern are partly overlaid with each other, in accordance with a period of intermittent discharge which is performed at a frequency depending on the voltage and an electric conductivity of the fluid. Therefore, a continuous and stable line-drawing can be performed at a high speed without causing errors such as an inappropriately widened line width, while setting the voltage in the vicinity of the minimum discharge-inducing voltage that is a voltage required for drawing super micro line.

As described above, another electrostatic suction type fluid discharge device according to the present invention discharges by electrostatic suction a fluid, which electrostatic suction type fluid discharge device is electrically charged by voltage application, from a fluid discharge hole of a nozzle of a discharge head onto a substrate opposite to the nozzle, wherein the fluid discharge hole, provided in the nozzle, has a diameter ranging from 0.01 µm to 25 µm; and the electrostatic suction type fluid discharge device comprises line-drawing means for applying a voltage between the nozzle and the substrate while relatively moving the nozzle and the substrate so as to carry out line-drawing, the voltage being equal to or greater than a minimum discharge-inducing voltage, that is a voltage required to start discharge of the fluid, the line-drawing means controlling the voltage so that adjacent ones of discharge pattern are partly overlaid with each other, the discharge pattern being discharged intermittently, and being determined depending on a speed of the relative movement.

In the above structure, the fluid discharge hole provided in the nozzle has a micro diameter ranging from 0.01 µm to 25 µm, so that the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

Further, in the above structure, the line-drawing means applies a voltage between the nozzle and the substrate while relatively moving the nozzle and the substrate so as to carry out line-drawing, which voltage is equal to or greater than minimum discharge-inducing voltage, that is a voltage required to start discharge of the fluid. Here, the voltage applied between the nozzle and the substrate is so controlled that adjacent ones of discharge pattern are partly overlaid with each other, which discharge pattern are discharged intermittently and determined depending on a speed of the relative movement. Therefore, the frequency of intermittent discharge can be increased to accommodate high speed movement, and a continuous and stable line-drawing can be performed at a desired high speed.

It is preferable in the electrostatic suction type fluid discharge device described above that the line-drawing means control the voltage or the speed of the relative movement so that the adjacent ones of discharge pattern are overlaid with each other by 0.5 to 1.5 times of a vertical diameter of each pattern, the vertical diameter being a diameter orthogonal to a direction of the relative movement.

A pattern diameter of the discharge pattern in the relative movement direction is changed according to the relative movement speed. However, the pattern diameter in a vertical direction to the relative movement direction is less affected by the relative movement speed. In view of this, the voltage or the speed of the relative movement is controlled so that the adjacent ones of discharge pattern are overlaid with each other by 0.5 to 1.5 times a vertical diameter of each pattern, which vertical diameter is a diameter orthogonal to a direction of the relative movement. This assures stable performance of the line-drawing. Besides, the patterns will not be overlaid too much, and therefore the desired drive speed can be ensured. As well as this, excessive increase in voltage is also avoided.

As described above, another electrostatic suction type fluid discharge device according to the present invention discharges by electrostatic suction a fluid, which is electrically charged by voltage application, from a fluid discharge hole of a nozzle of a discharge head onto a substrate opposite to the nozzle, wherein the fluid discharge hole, provided in the nozzle, has a diameter ranging from 0.01 μm to 25 μm, the electrostatic suction type fluid discharge device comprises line-drawing means for applying a voltage between the nozzle and the substrate while relatively moving the nozzle and the substrate so as to carry out line-drawing, the voltage being equal to or greater than a minimum discharge-inducing voltage, that is a voltage required to start discharge of the fluid, the line-drawing means carrying out line drawing with a scanning speed and a voltage specified as: $V_{in} > 31\ v + 75$, where v (mm/sec) denotes the scanning speed, and $V_{in}$ denotes the voltage, provided that an electric conductivity of the fluid is in a range of $10^{-7}$-$10^{-9}$ S/cm.

In the above structure, the fluid discharge hole provided in the nozzle has a micro diameter ranging from 0.01 μm to 25 μm, so that the drive voltage can be reduced. This is greatly beneficial to miniaturization of the device while ensuring high density, and therefore the same above-described effects as that of the electrostatic suction type fluid discharge device according to the present invention is obtained. For example, it allows the use of a low-voltage driver that offers advantageous cost performance.

In the above structure, when applying a voltage between the nozzle and the substrate while relatively moving the nozzle and the substrate so as to carry out line-drawing, which voltage is equal to or greater than a minimum discharge-inducing voltage, that is a voltage required to start discharge of the fluid, the line-drawing means carries out line drawing with a scanning speed and a voltage specified as: $V_{in} > 31\ v + 75$, where v (mm/sec) denotes the scanning speed, and $V_{in}$ denotes the voltage, provided that an electric conductivity of the fluid is in a range of $10^{-7}$-$10^{-9}$ S/cm. Therefore, the discharged material is limited to material with an electric conductivity of $10^{-7}$-$10^{-9}$ S/cm, such as silver nano paste. However, stable and easy line-drawing can be performed at a high speed.

As described above, in an electrostatic suction type fluid discharge method according to the present invention discharges by electrostatic suction a fluid, which is electrically charged by voltage application, from a fluid discharge hole of a nozzle of a discharge head onto a substrate opposite to the nozzle, wherein the fluid discharge hole provided in the nozzle has a diameter ranging from 0.01 μm to 25 μm, the electrostatic suction type fluid discharge method includes the step of applying a voltage between the nozzle and the substrate while relatively moving the nozzle and the substrate so as to carry out line-drawing, the voltage being equal to or greater than a minimum discharge-inducing voltage, that is a voltage required to start discharge of the fluid. The electrostatic suction type fluid discharge device controls a speed of the relative movement so that adjacent ones of discharge pattern are partly overlaid with each other, in accordance with a period of intermittent discharge which is performed at a frequency depending on the voltage and an electric conductivity of the fluid.

As described above, the fluid discharge hole provided in the nozzle has a micro diameter ranging from 0.01 μm to 25 μm, and therefore the drive voltage can be reduced. This is greatly beneficial to miniaturization of the device while ensuring high density. It allows the use of a low-voltage driver that offers advantageous cost performance, and also realizes a structure not using a counter electrode.

In addition, the speed for relative movement is set so that adjacent ones of discharge pattern are partly overlaid with each other, in accordance with a period of intermittent discharge which is performed at a frequency depending on the voltage and an electric conductivity of the fluid. This allows stable and high-speed line-drawing while maintaining super micro line width.

As described above, another electrostatic suction type fluid discharge method according to the present invention discharges by electrostatic suction a fluid, which is electrically charged by voltage application, from a fluid discharge hole of a nozzle of a discharge head onto a substrate opposite to the nozzle, wherein the fluid discharge hole provided in the nozzle has a diameter ranging from 0.01 μm to 25 μm, the electrostatic suction type fluid discharge method comprising the step of applying a voltage between the nozzle and the substrate while relatively moving the nozzle and the substrate so as to carry out line-drawing, the voltage being equal to or greater than a minimum discharge-inducing voltage, that is a voltage required to start discharge of the fluid. The electrostatic suction type fluid discharge device controls the voltage so that adjacent ones of discharge pattern are partly overlaid with each other, the discharge pattern being discharged intermittently, and being determined depending on a speed of the relative movement.

As described above, the fluid discharge hole provided in the nozzle has a micro diameter ranging from 0.01 μm to 25 μm, and therefore the drive voltage can be reduced. This is greatly beneficial to miniaturization of the device while ensuring high density. It allows the use of a low-voltage driver that offers advantageous cost performance, and also realizes a structure not using a counter electrode.

Further, the voltage applied between the nozzle and the substrate is so controlled that adjacent ones of discharge pattern are partly overlaid with each other, which discharge pattern are discharged intermittently and determined depending on a speed of the relative movement. Therefore, the speed and the voltage are optimized, and a continuous and stable line-drawing can be performed at a desired high speed.

[Third Embodiment]

The present invention explains a result of test for examining required condition of drive voltage in discharging a micro droplet of liquid from a super micro nozzle from a super micro nozzle by electrostatic force. In the embodiment below, a counter electrode is disposed to generate an electric field between the nozzle and the counter electrode (i.e. discharge target grounded via the counter electrode), so as to ensure stable discharge of liquid (fluid) with respect to the discharge target.

This electrostatic suction type fluid discharge device employs a discharge method using an electrostatic suction effect, which is carried out with a fluid discharge model using a local electric field. As described above, this electrostatic suction type fluid discharge device achieves both miniaturization of nozzle diameter and reduction in drive voltage by using a nozzle whose diameter ranges from 0.01-25 μm.

However, when forming a particularly tiny dot or a particularly thin line by this electrostatic suction type fluid discharge device, the potential difference between the drive voltage for driving inside the nozzle and that of the substrate (the target provided in front of the counter substrate) becomes an important factor. More specifically, an excessively large potential difference results in an excessive amount of discharge fluid, but an excessively small potential difference results in discharge failure.

Further, another important factor is application time with respect to the voltage value. That is, if an excessively long application time is set to a certain voltage value, it results in an excessive amount of discharge fluid and therefore a micro pattern cannot be formed, but an excessively short application time results in discharge failure.

In view of this, the present embodiment ensures appropriate settings for the voltage (drive voltage) applied between the nozzle and the counter electrode, and for the application time thereof, so as to ensure stable formation of micro dot pattern. Note that, for ease of explanation, materials having the equivalent functions as those shown in the drawings pertaining to the foregoing First and Second Embodiments will be given the same reference symbols, and explanation thereof will be omitted here.

(Third Embodiment 1)

Figure 25:
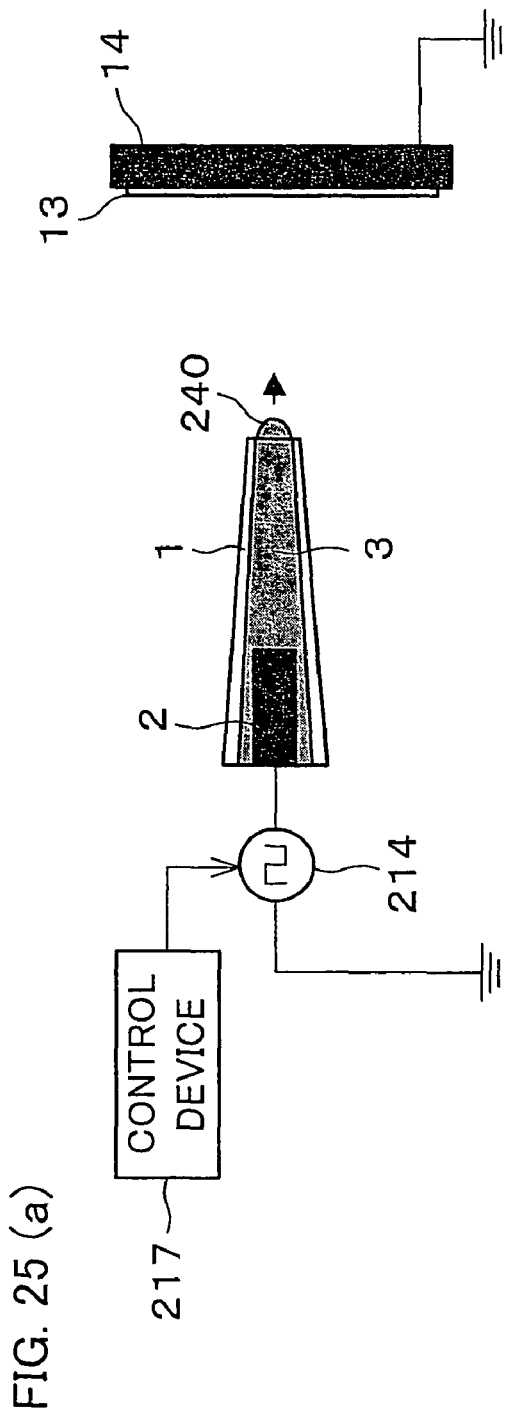
FIG. 25 (b) is an equivalent circuit of the electrostatic suction type fluid discharge device.
Figure 25:
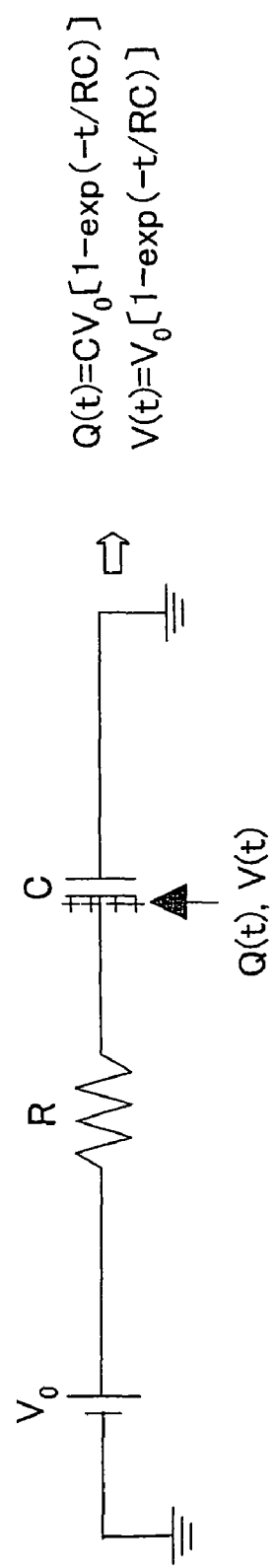
Figure 26:
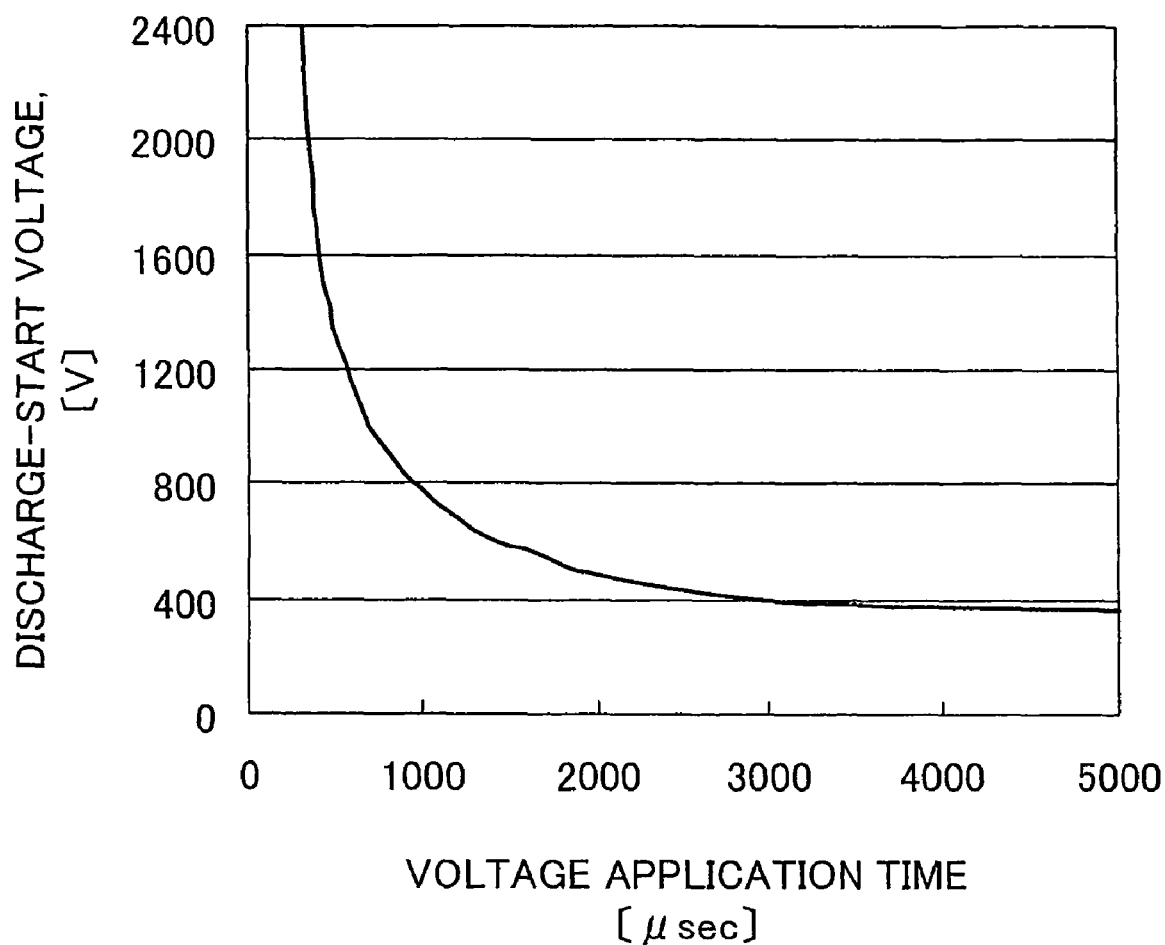
FIG. 26 is a graph showing a relationship between (i) an application time of drive voltage and (ii) a discharge-start voltage, for an electrostatic suction type fluid discharge device of FIG. 25(a).
Figure 27:
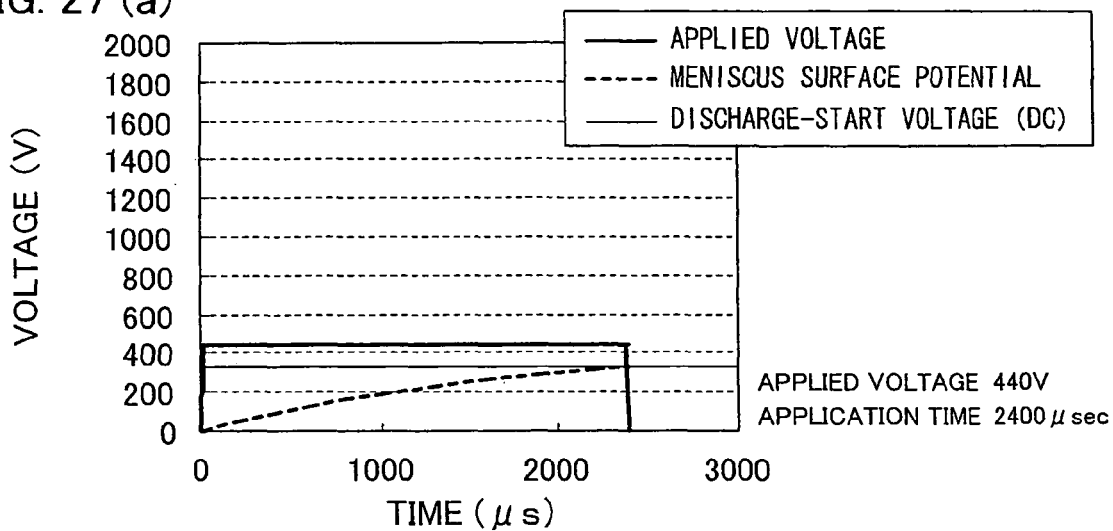
FIG. 27 (a) is a graph for showing change in meniscus surface potential until it reaches the potential at which discharge is started, for an electrostatic suction type fluid discharge device of FIG. 25(a). In the graph, the application voltage and the application time are set to 440V and 2400 μsec, respectively.
Figure 27:
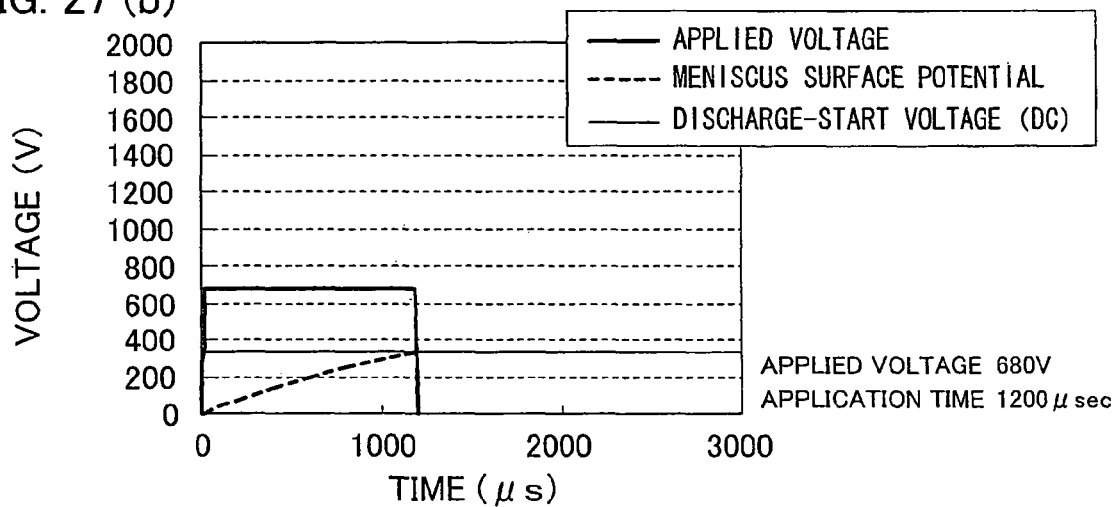
Figure 27:
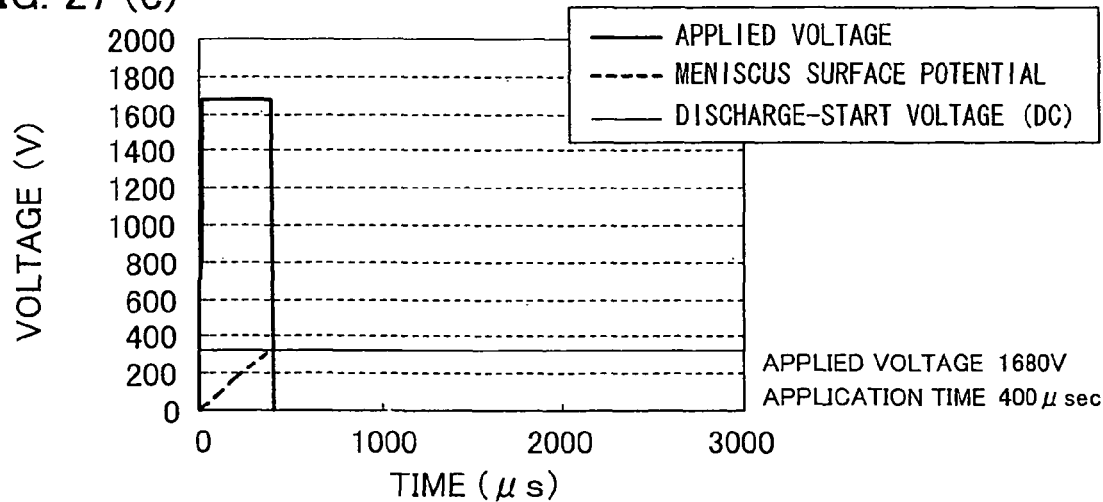

FIGS. 25(a), 25(b), FIG. 26, FIG. 27(a) through 27(c) show the fluid discharge method performed by the electrostatic suction type fluid discharge device according to the present embodiment. FIG. 25(a) illustrates a schematic diagram of an electrostatic suction type fluid discharge device, and FIG. 25(b) illustrates an equivalent circuit in the device. FIG. 26 is a graph showing a relationship between application time and magnitude of discharge-start voltage (minimum discharge-inducing voltage), for the voltage applied between the nozzle 1 and the counter electrode 14 (substrate 13). FIGS. 27(a) through 27(c) are graphs each showing a relationship between an increase in meniscus surface potential and condition for starting discharge.

As shown in FIG. 25(a), the electrostatic suction type fluid discharge device includes the nozzle 1 and the counter electrode 14 which are opposed to each other. The counter electrode 14 is grounded. The electrode (drive electrode) 2 is provided inside the nozzle 1, and a power source (drive voltage applying means) 214 is connected to the electrode 2. The nozzle 1 is filled with the discharge material (fluid) 3, which is constituted of a fluid. The substrate (discharge target member) 13, as the discharge target, is so provided on one side of the counter electrode 14 as to be opposed to the nozzle 1. The substrate 13 is grounded via the counter electrode 14. The discharge material is discharged from the nozzle 1 so as to form, for example, a micro wire pattern, on the substrate 13.

Figure 28:
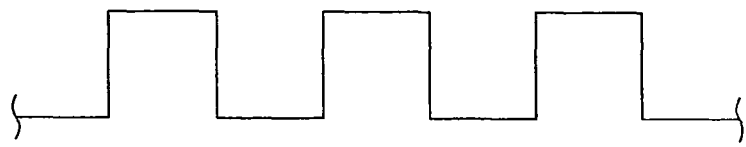
FIG. 28 is a waveform diagram showing an example of drive voltage outputted from a power source shown in FIG. 25(a).

The power source 214 is controlled by the control device (drive voltage applying means) 217 constituted of a computer or the like. More specifically, a discharge signal is supplied to the power source 214 from the control device 217, and a voltage having wave form is applied from the power source 214 according to the discharge signal so as to charge the discharge material 3 inside the nozzle 1. FIG. 28 shows an example of the drive voltage.

The substrate 13 is made of an insulative glass substrate, a plastic (polyimide etc.) substrate, a ceramic substrate or a semiconductor substrate.

The following explains a basic characteristic of micro droplet discharge method performed by the electrostatic suction type fluid discharge device, particularly regarding a surface potential results from electric charge accumulated in the meniscus 240 on the tip of nozzle 1.

In the electrostatic suction type fluid discharge device shown in FIG. 25(a), a drive voltage is applied from the power source 214 to the electrode 2 so that an electric charge is supplied from the electrode 2 to the discharge material 3. The electric charge is assumed to move to the meniscus 240 having electrostatic capacitance formed on the tip of nozzle 1 so that it faces to the substrate 13. Therefore, as shown in FIG. 25(b), the structure in FIG. 25(a) can be expressed as a series circuit constituted of $V_0$ as a drive voltage applied from the power source 214 to the electrode 2, R as an electric resistance of the discharge fluid 3 inside the nozzle 1, and C as an electrostatic capacitance between the meniscus 240 and the substrate 13.

For the series circuit constituted of $V_0$, R and C, the relationship between $V_0$, R and C may be denoted by the accumulated charge Q(t) on the meniscus 240.

$$RdQ(t)/dt + Q(t)/C = V_0 \quad (21)$$

According to the foregoing differential equation, the accumulated charge Q(t) on the meniscus surface and the surface potential V(t) are denoted by the following Formulas (22) and (23).

$$Q(t) = CV_0[1 - \exp(-t/RC)] \quad (22)$$

$$V(t) = V_0[1 - \exp(-t/RC)] \quad (23)$$

The following explains an examination result shown in FIG. 26. This is a result of test using the silver nano paste as the discharge material 3. This figure shows a relationship between the discharge-start voltage and application time. The discharge-start voltage (minimum discharge-causing voltage) designates a minimum value of voltage applied to the electrode 2 to cause the discharge material 3 to be discharged from the nozzle 1.

As shown in FIG. 26, the shorter the application time is, the greater the voltage required for discharge is. This shows that the condition for starting discharge is related to both the magnitude of applied voltage (drive voltage) and the application time.

FIGS. 27(a) through 27(c) show a change in surface potential of meniscus 240 until it reaches the discharge-start voltage. The figures show respective cases for three different values of voltage applied from the power source 214 to the electrode 2. These values of FIGS. 27(a) through 27(c) are obtained from calculation according to Formula (23) using the values shown in FIG. 26. The respective values of applied voltage and application time in 27(a) through 27(c) are taken from three different points in the graph of FIG. 26. The voltages and times are 440V and 2400 μsec for FIG. 27(a), 680V and 1200 μsec for FIG. 27(b), and 1600V and 400 μsec for FIG. 27(c).

In each case of FIGS. 27(a) through 27(c), application of voltage from the power source 214 to the electrode 2 causes electric charge to flow into the discharge material 3, and the charge is started to be accumulated in the surface of meniscus 240. At this point, as shown in FIGS. 27(a) through 27(c), the meniscus surface potential increases as a saturation curve at the speed depending on the voltage $V_0$ and the time constant RC in Formula (23).

The meniscus surface potential increasing according to the applied voltage reaches the discharge-start voltage, that is the minimum required condition for discharge, when the predetermined time elapsed. That is, when the voltage is applied for a certain time for which the meniscus surface potential reaches the discharge-start voltage, the discharge material 3 is started to be discharged. To be more specific, by setting the drive voltage $V_0$ and the application time t so that the meniscus surface potential V(t) becomes greater than the discharge-start voltage VDC, the discharge is ensured. This condition is denoted by the Formula (24) as follows.

$$VDC \leq V_0[1-\exp(-t/RC)] \tag{24}$$

Note that, the discharge-start voltage VDC here denotes a minimum value for applied voltage on condition that the application is carried out for a sufficient duration. The value here is for DC bias.

As described, the electrostatic suction type fluid discharge device is capable of securely setting the potential in the surface of meniscus produced in the tip of nozzle 1 to be not less than the discharge-start potential of discharge material 3. Therefore, stable micro dot formation is performed.

Figure 29:
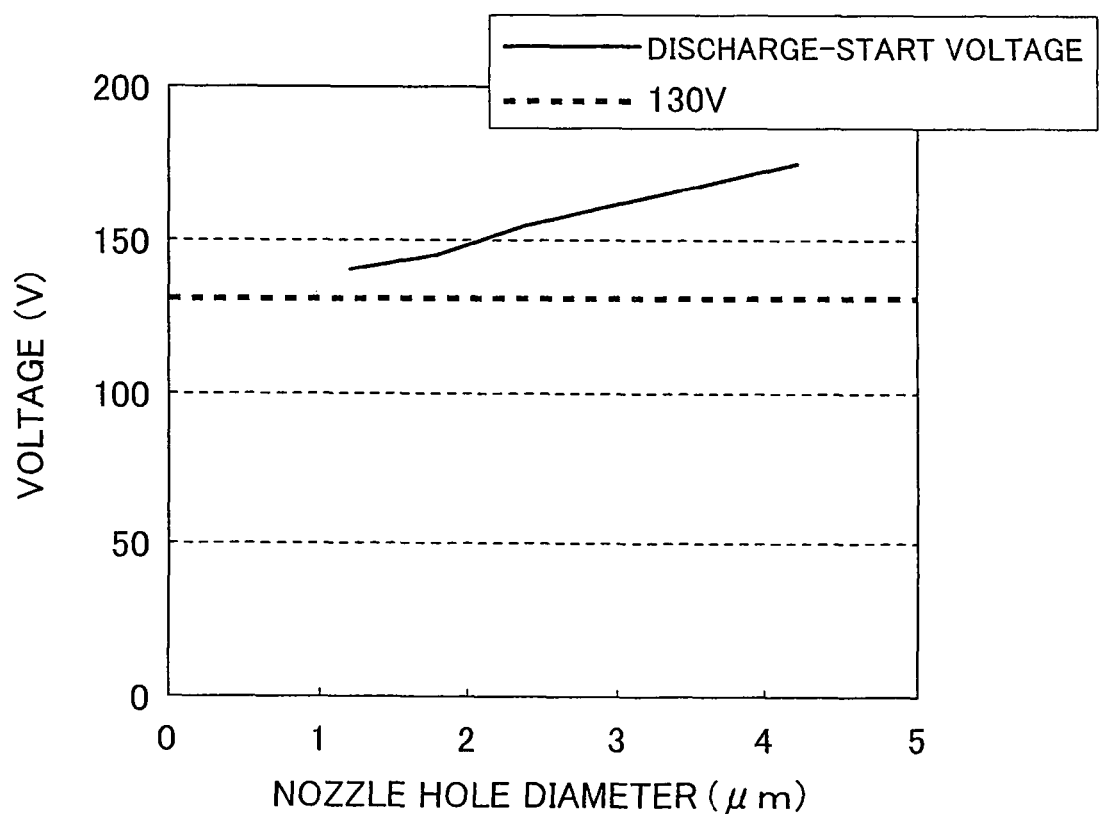
FIG. 29 is a graph showing a relationship between (i) a nozzle diameter and (ii) a discharge-start voltage of material from a nozzle, for an electrostatic suction type fluid discharge device of FIG. 25(*a*).

Further, FIG. 29 is a graph showing a relationship between nozzle diameter (diameter of nozzle hole of nozzle 1) and discharge-start voltage of the discharge material 3 to be discharged from the nozzle 1 in the electrostatic suction type fluid discharge device according to the present embodiment. In this figure, the relationship between the discharge-start voltage and nozzle diameter is examined when applying a DC bias to silver nano paste as the discharge material 3.

As shown in FIG. 29, the discharge-start voltage decreases as the nozzle diameter decreases, and the discharge-start voltage becomes approximately 140V when the nozzle diameter becomes 1 μm. That is, when the nozzle 1 is realized by a nozzle with a diameter=φ1 μm or greater, a DC bias of 130V or greater is required to be applied so as to ensure stable discharge.

More specifically, according to the fact that the discharge-start voltage VDC is 130V, as found by the Formula (24): $VDC \leq V_0[1-\exp(-t/RC)]$, for the nozzle with a diameter=φ1 μm to φ5 μm, the drive voltage $V_0$ and the application time t need to be determined according to the following Formula (25) with respect to all voltage waveforms. With this condition, stable discharge of micro liquid is ensured.

$$130V < V_0[1-\exp(-t/RC)] \tag{25}$$

As described, for the nozzle 1 with a diameter=φ1 μm to φ5 μm, the drive voltage $V_0$ and the application time t are determined according to the foregoing Formula (25). With this arrangement, the electrostatic suction type fluid discharge device of the present embodiment ensures stable discharge of micro liquid.

Note that, the foregoing range of nozzle diameter from φ1 μm to φ5 μm derives from the fact that the technical lower limit in formation of nozzle diameter is φ1 μm. Further, the upper limit of φ5 μm is a nozzle diameter enabling drawing of 10 μm line, which is a micro line on general demand, when the line is drawn on the substrate 13 by the electrostatic suction type fluid discharge device.

Further, since the voltage required to drive the nozzle 1 is a potential difference between the signal applied to the electrode 2 inside the nozzle 1 and the signal applied to the counter electrode 14, the form of signals applied to the respective electrodes may have arbitrary forms. Further, a plus voltage or a minus voltage may be arbitrary used as the drive voltage.

(Third Embodiment 2)

Figure 30:
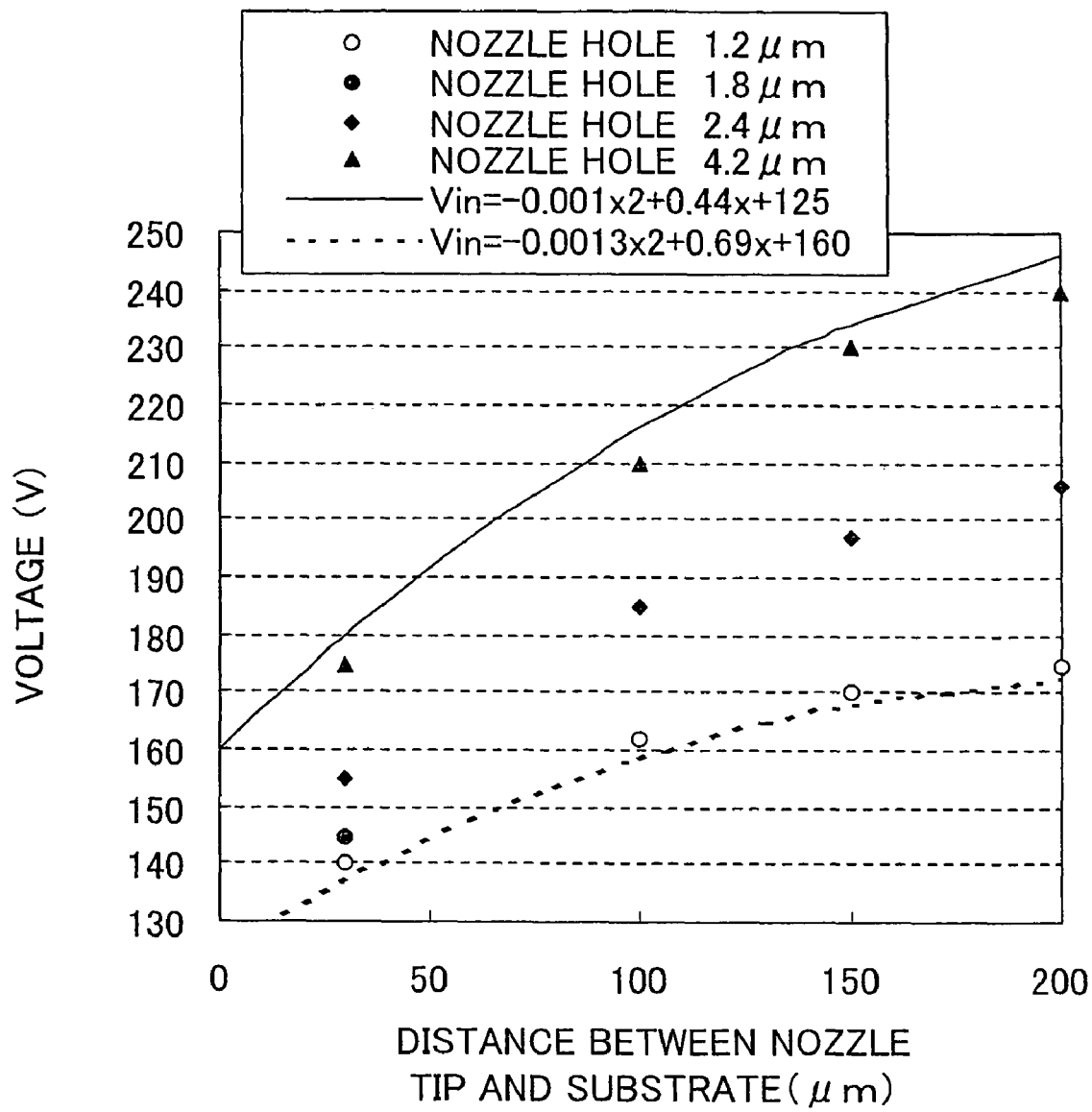
FIG. 30 is a graph showing a relationship between (i) a discharge-start voltage and (ii) a distance between the tip of nozzle and a substrate, for an electrostatic suction type fluid discharge device of FIG. 25(*a*). The figure shows respective cases for plural nozzles having different diameters.

The following describes another embodiment of the present embodiment with reference to figures. FIG. 30 is a graph showing a relationship between (i) a discharge-start voltage (minimum discharge-inducing voltage) and (ii) a distance between the tip of nozzle and a substrate (distance between the tip of nozzle 1 and the substrate 13) for an electrostatic suction type fluid discharge device according to the present embodiment which has the structure shown in FIG. 25. The electrostatic suction type fluid discharge device has a nozzle with a diameter=φ1 μm to φ5 μm. The present embodiment describes only different part from Third Embodiment 1 will be described below, and the same part is omitted.

FIG. 30 is a graph showing a relationship between (i) a discharge-start voltage and (ii) a distance between the tip of nozzle and a substrate, for each case of nozzle diameters of φ1.2 μm, φ1.8 μm, φ2.4 μm and φ4.2 μm, when the discharge material is realized by silver nano paste.

As shown in FIG. 30, the discharge-start voltage depends on the distance between the nozzle and the substrate, and therefore increases as the distance increases. However, when the nozzle diameter is set within a range of φ1 μm to φ5 μm, and the drawing is performed by a nozzle and a substrate having 200 μm or shorter distance therebetween, the voltage applied to the electrode 2 is set in a range of 130V to 250V, a low and narrow range.

To be more specific, according to the foregoing Formula (24): $VDC \leq V_0[1-\exp(-t/RC)]$, the range of discharge-start voltage is not less than 130v and not more than 250V for a nozzle with a diameter=φ1 μm to φ5 μm. Therefore, the drive voltage $V_0$ and the application time t need to be determined according to the following Formula (26) with respect to all voltage waveforms. With this condition, stable discharge of micro droplet is ensured.

$$130V < V_0[1-\exp(-t/RC)] < 250V \tag{26}$$

As described, for the nozzle 1 with a diameter=φ1 μm to φ5 μm, the drive voltage $V_0$ and the application time t are determined according to the foregoing Formula (25) in the electrostatic suction type fluid discharge device of the present embodiment. With this arrangement, the excessive amount of discharge or discharge failure is prevented, and stable discharge of micro droplet is ensured.

Note that, since the voltage required to drive the nozzle 1 is a potential difference between the signal applied to the electrode 2 inside the nozzle 1 and the signal applied to the counter electrode 14, the form of signals applied to the respective electrodes may have arbitrary forms. Further, a plus voltage or a minus voltage may be arbitrary used as the drive voltage.

Here, according to the graph of FIG. 30, the transitions of the maximum value (VH) and the minimum value (VL) of discharge-start voltage (minimum discharge-causing voltage) for the nozzle 1 with a diameter=φ1 μm to φ5 μm are respectively denoted by the following general Formulas (27) and (28) where X is a variable denoting the distance between nozzle and diameter.

$$VH = -0.001X^2 + 0.44X + 125 \tag{27}$$

$$VL = -0.0013X^2 + 0.69X + 160 \tag{28}$$

With the values of VH and VL, the foregoing Formula (26) may be expressed as follows.

$$VL < V_0[1-\exp(-t/RC)] < VH \tag{26}$$

(Third Embodiment 3)

Figure 31:
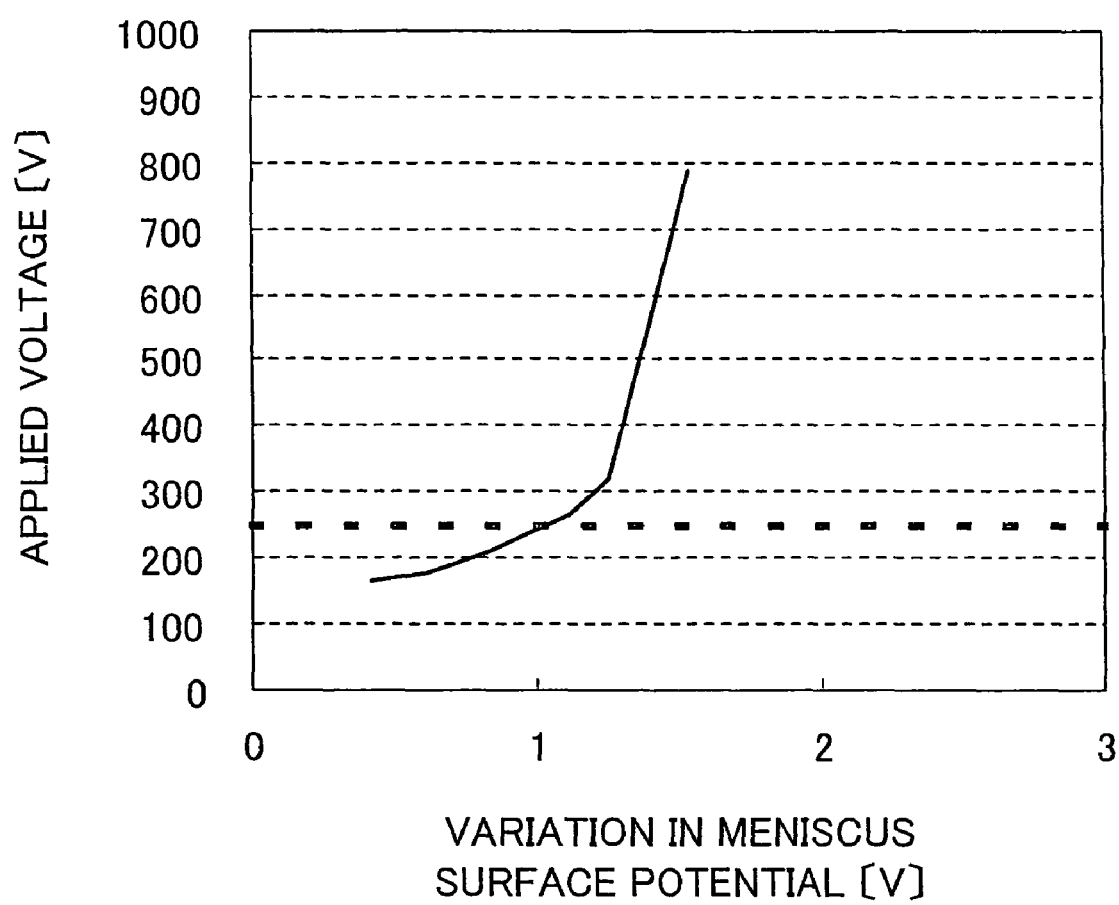
FIG. 31 is a graph showing a relationship between (i) an application voltage to a drive electrode (drive voltage) and (ii) variation in meniscus surface potential, for an electrostatic suction type fluid discharge device of FIG. 25(*a*).
Figure 32:
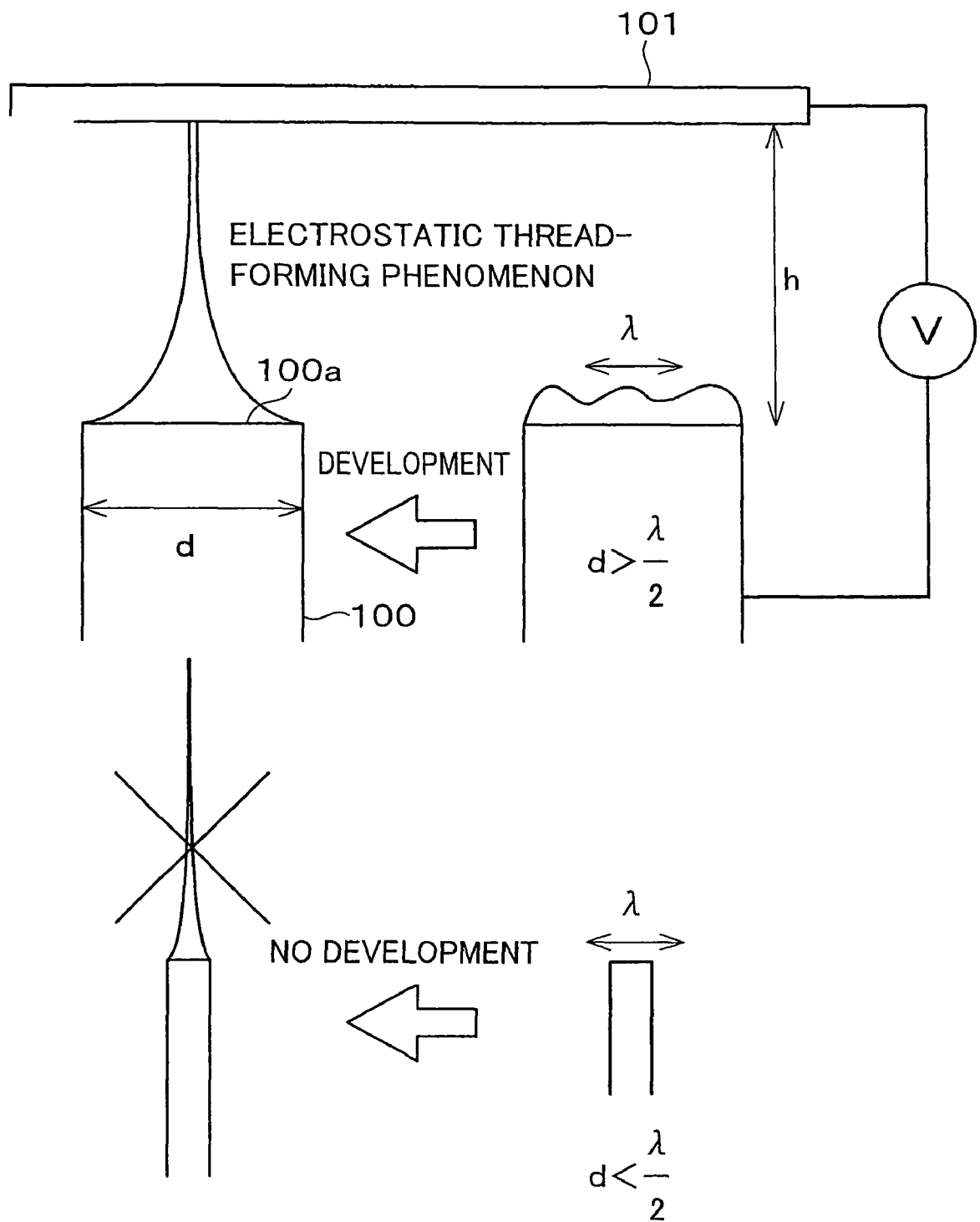
FIG. 32 illustrates the principle of the development of a discharged fluid on account of electrostatic thread-like phenomenon, in the electrostatic suction type fluid discharge device.

The following describes still another embodiment of the present embodiment with reference to figures. FIG. 31 is a graph showing a relationship between (i) an application voltage (drive voltage) to the electrode 2 and (ii) variation in meniscus surface potential, in the electrostatic suction type fluid discharge device according to the present invention, which has the structure shown in FIG. 25. The electrostatic suction type fluid discharge device has a nozzle with a diameter=$\phi$1 μm to $\phi$5 μm. The present embodiment describes only different part from Third Embodiment 1 or 2 will be described below, and the same part is omitted. For an electrostatic suction type fluid discharge device which forms a micro pattern on the substrate 13, it is important to set the position of discharge material 3 with high accuracy, and to adjust the distance between the nozzle and substrate (gap between the nozzle tip and the substrate) with high accuracy. These factors are particularly important when forming a micro pattern on the substrate 13 made with irregular patterns.

Further, the present embodiment examines variation in meniscus surface potential with respect to a change in distance between the nozzle and the substrate when applying a pulse drive voltage to the electrode 2 of the nozzle 1. The result is shown in FIG. 31. In this case, the discharge material 3 is realized by silver nano paste, and the nozzle diameter is set in a range of $\phi$1 μm to $\phi$5 μm. In FIG. 31, the distance between the nozzle and substrate is set to 30 μm, and is increased by 10% to examine variation degree of meniscus surface potential.

As shown in FIG. 31, the variation in meniscus surface potential greatly varies depending on the value of application voltage to the electrode 2. As the application voltage increases, the degree of variation drastically increases. More specifically, when the variation curve of meniscus surface potential is moved up to a greater value, a large amount of the discharge material 3 is suddenly discharged from the nozzle 1. On the other hand, when the variation curve of meniscus surface potential is moved down to a smaller value, discharge of the discharge material 3 from the nozzle 1 suddenly stops.

More specifically, when a high voltage is applied to the electrode 2, sudden increase in discharge amount or sudden stoppage of discharge is more likely to happen. Therefore, according to FIG. 31, the variation degree of meniscus surface potential is preferably suppressed to 1V or lower to ensure stable discharge. This is attained by setting the application voltage to the electrode 2 to be equal to or lower than 250V.

As described, in the present electrostatic suction type fluid discharge device using a the nozzle 1 with a diameter falling within a range between $\phi$1 μm and $\phi$5 μm, the voltage value is set to $V_0$, and the application time is set to t, which are specified as $130V<V_0[1-\exp(-t/RC)]<250V$, and the application voltage $V_0$ is set to 250V or less. With this arrangement, variation in meniscus surface potential due to variation in nozzle-substrate distance can be suppressed, allowing stable discharge of a micro liquid which is required to form a micro pattern on the substrate 13.

Note that, because the voltage required to drive the nozzle 1 is a potential difference between the signal supplied to the electrode 2 inside the nozzle 1 and the signal supplied to the counter electrode 14, the signals supplied to the electrodes may have any arbitrary forms. Further, a positive or negative voltage may arbitrarily be used as a drive voltage.

As described, an electrostatic suction type fluid discharge device according to the present invention applies a drive voltage between a nozzle and a discharge target by drive voltage supply means so as to apply an electric charge to a fluid supplied into the nozzle, and thereby discharges the fluid from a hole of the nozzle to the discharge target, the hole of the nozzle falling within a range between $\phi$1 μm and $\phi$5 μm in diameter, the electrostatic suction type fluid discharge device outputting the drive voltage under a condition: a voltage value=$V_0$, and an application time=t, which are specified as $VDC<V_0[1-\exp(-t/RC)]$ where R expresses electric resistance of the fluid, C expresses electric capacitance between the fluid in a tip of the nozzle and the discharge target, and VDC expresses a minimum voltage at which the fluid is caused to be discharged in response to application of the drive voltage.

As described, an electrostatic suction type fluid discharge device according to the present invention applies a drive voltage between a nozzle and a discharge target so as to apply an electric charge to a fluid supplied into the nozzle, and thereby discharges the fluid from a hole of the nozzle to the discharge target, wherein: the hole of the nozzle falls within a range between $\phi$1 μm and $\phi$5 μm in diameter, the method outputting the drive voltage under a condition: a voltage value=$V_0$, and an application time=t, which are specified as: $130V<V_0[1-\exp(-t/RC)]$ where R expresses electric resistance of the fluid, and C expresses electric capacitance between the fluid in a tip of the nozzle and the discharge target.

Further, an electrostatic suction type fluid discharge method according to the present invention applies a drive voltage between a nozzle and a discharge target so as to apply an electric charge to a fluid supplied into the nozzle, and thereby discharges the fluid from a hole of the nozzle to the discharge target, wherein: the hole of the nozzle falls within a range between $\phi$1 μm and $\phi$5 μm in diameter, the method outputting the drive voltage under a condition: a voltage value=$V_0$, and an application time=t, which are specified as: $130V<V_0[1-\exp(-t/RC)]$ where R expresses electric resistance of the fluid, and C expresses electric capacitance between the fluid in a tip of the nozzle and the discharge target.

In the conventional fluid discharge devices, the miniaturization of the nozzle requires more intense electric field to cause the fluid to be discharged, and therefore the miniaturization of nozzle contradicts with decrease in drive voltage. In contrast, the present invention has achieved both the miniaturization of nozzle and the decrease in drive voltage with the use of nozzle whose diameter is specified within the foregoing range. This structure was made based on such a new finding that a micro nozzle of $\phi$0.01 μm to $\phi$25 μm in diameter causes a local electric field, which allows the fluid to be discharged by a lower drive voltage.

Further, the present invention has a structure with a specified nozzle diameter, ranging from $\phi$1 μm and $\phi$5 μm. With this structure, the present invention ensures the effect of decrease in drive voltage by the use of a micro diameter nozzle.

Further, since the voltage for driving nozzle is outputted under a condition: a voltage value=$V_0$, and an application time=t, which are specified as: $130V<V_0[1-\exp(-t/RC)]$, the meniscus surface potential of the tip of nozzle is securely set to the value to induce discharge or greater. This increases reliability in drawing micro dot patterns.

Another electrostatic suction type fluid discharge device according to the present invention applies a drive voltage between a nozzle and a discharge target by drive voltage supply means so as to apply an electric charge to a fluid supplied into the nozzle, and thereby discharges the fluid from a hole of the nozzle to the discharge target, the hole of the nozzle falling within a range between φ1 μm and φ5 μm in diameter, the electrostatic suction type fluid discharge device outputting the drive voltage under a condition: a voltage value=$V_0$, and an application time=t, which are specified as: 130V<$V_0$[1−exp(−t/RC)]<250V where R expresses electric resistance of the fluid, and C expresses electric capacitance between the fluid in a tip of the nozzle and the discharge target.

As with the aforementioned electrostatic suction type fluid discharge device, this device also achieves both the miniaturization of nozzle and the decrease in drive voltage. Further, this structure in which the nozzle diameter is specified in a range from φ1 μm to φ5 μm securely ensures the effect of decrease in drive voltage by the use of a micro diameter nozzle.

Further, since the voltage for driving nozzle is outputted under a condition: a voltage value=$V_0$, and an application time=t, which are specified as: 130V<$V_0$[1−exp(−t/RC)] <250, the meniscus surface potential of the tip of nozzle is securely set to the value at which discharge starts or to a greater value. This increases reliability in drawing micro dot patterns, and ensures a low narrow-range drive voltage.

Still another electrostatic suction type fluid discharge device according to the present invention applies a drive voltage between a nozzle and a discharge target by drive voltage supply means so as to apply an electric charge to a fluid supplied into the nozzle, and thereby discharges the fluid from a hole of the nozzle to the discharge target, the hole of the nozzle falling within a range between φ1 μm and φ5 μm in diameter, the electrostatic suction type fluid discharge device outputting the drive voltage under a condition: a voltage value=$V_0$, and an application time=t, which are specified as:

$$130V<V_0[1-\exp(-t/RC)]<250V$$

$$V_0<250V$$

where R expresses electric resistance of the fluid, and C expresses electric capacitance between the fluid in a tip of the nozzle and the discharge target.

As with the aforementioned electrostatic suction type fluid discharge devices, this device also achieves both the miniaturization of nozzle and the decrease in drive voltage. Further, this structure in which the nozzle diameter is specified in a range from φ1 μm to φ5 μm securely ensures the effect of decrease in drive voltage by the use of a micro diameter nozzle.

Further, since the voltage for driving nozzle is outputted under a condition: a voltage value=$V_0$, and an application time=t, which are specified as: 130V<$V_0$[1−exp(−t/RC)] <250, the meniscus surface potential of the tip of nozzle is securely set to the value to induce discharge or greater. This increases reliability in drawing micro dot patterns, and ensures a low narrow-range drive voltage.

Further, with this arrangement in which the application voltage $V_0$ is set to 250V or less, the degree of variation of meniscus surface potential decreases. As a result, the variation in meniscus surface potential due to variation in nozzle-substrate distance is suppressed, allowing stable discharge of a micro droplet which is required to form a micro pattern on a componental member serves as a discharge target.

Yet another electrostatic suction type fluid discharge device according to the present invention applies a drive voltage between a nozzle and a discharge target by drive voltage supply means so as to apply an electric charge to a fluid supplied into the nozzle, and thereby discharges the fluid from a hole of the nozzle to the discharge target, the hole of the nozzle falling within a range between φ1 μm and φ5 μm in diameter, the electrostatic suction type fluid discharge device is arranged to satisfy:

$$VH=-0.001X^2+0.44X+125$$

$$VL=-0.0013X^2+0.69X+160$$

where X expresses a distance between the nozzle and the discharge target, and VH and VL express maximum and minimum values of discharge start voltage at which discharge of the fluid from the nozzle is started, respectively.

As with the aforementioned electrostatic suction type fluid discharge devices, this device also achieves both the miniaturization of nozzle and the decrease in drive voltage. Further, this structure in which the nozzle diameter is specified in a range from φ1 μm to φ5 μm securely ensures the effect of decrease in drive voltage by the use of a micro diameter nozzle.

Further, since the voltage at which the fluid is discharged from the nozzle is set between the maximum value (VH) and the minimum value (VL), which are specified as VH=−0.001$X^2$+0.44X+125 and VL=−0.0013$X^2$+0.69X+160, it is possible to perform stable and reliable discharge of fluid from the nozzle in forming a micro pattern.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

Industrial Applicability

Since the present invention allows formation of a micro dot or a micro wire pattern on a substrate, it is typically applicable to patterning process in manufacturing of flat displays such as a liquid crystal display, a plasma display, an electroluminescence display etc., or to manufacturing of semiconductor device, formation of conductor pattern for a printed circuit board, or the like.

The invention claimed is:

1. An electrostatic suction type fluid discharge device which discharges by electrostatic suction a fluid, which is electrically charged by voltage application, from a fluid discharge hole of a nozzle of a discharge head onto a substrate opposite to the nozzle, wherein:

the electrostatic suction type fluid discharge device comprises line-drawing means for applying a voltage between the nozzle and the substrate while relatively moving the nozzle and the substrate so as to carry out line-drawing, the voltage being equal to or greater than a minimum voltage to induce discharge, that is a voltage required to start discharge of the fluid, the line-drawing means controlling a speed of the relative movement so that adjacent ones of discharge pattern are partly overlaid with each other, in accordance with a period of intermittent discharge which is performed when applying a direct current bias voltage equal to or greater than the minimum voltage to induce discharge and which is performed at a frequency depending on the direct current bias voltage and an electric conductivity of the fluid, and the fluid discharge hole of the nozzle having a diameter ranging from 0.01 μm to 15 μm, and the discharge head discharging the fluid from the nozzle not by a piezo element and/or a thermal element, but by electrostatic suction.

2. The electrostatic suction type fluid discharge device, as set forth in claim 1, wherein;
the line-drawing means controls the speed of the relative movement so that the adjacent ones of discharge pattern are overlaid with each other by 0.5 to 1.5 times of a vertical diameter of each pattern, the vertical diameter being a diameter orthogonal to a direction of the relative movement.

* * * * *